(12) United States Patent
Jintyou et al.

(10) Patent No.: US 10,580,662 B2
(45) Date of Patent: *Mar. 3, 2020

(54) SEMICONDUCTOR DEVICE, MANUFACTURING METHOD THEREOF, DISPLAY DEVICE, AND ELECTRONIC DEVICE

(71) Applicant: SEMICONDUCTOR ENERGY LABORATORY CO., LTD., Atsugi-shi, Kanagawa-ken (JP)

(72) Inventors: Masami Jintyou, Tochigi (JP); Junichi Koezuka, Tochigi (JP); Takashi Hamochi, Tochigi (JP); Yasuharu Hosaka, Tochigi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/270,624

(22) Filed: Feb. 8, 2019

(65) Prior Publication Data

US 2019/0189466 A1 Jun. 20, 2019

Related U.S. Application Data

(63) Continuation of application No. 15/431,002, filed on Feb. 13, 2017, now Pat. No. 10,204,798.

(30) Foreign Application Priority Data

Feb. 18, 2016 (JP) .................. 2016-028586
Sep. 30, 2016 (JP) .................. 2016-193217

(51) Int. Cl.
*H01L 21/00* (2006.01)
*H01L 21/385* (2006.01)
(Continued)

(52) U.S. Cl.
CPC .......... *H01L 21/385* (2013.01); *H01L 21/022* (2013.01); *H01L 21/0214* (2013.01);
(Continued)

(58) Field of Classification Search
CPC .. H01L 21/0214; H01L 21/0236; H01L 21/44
See application file for complete search history.

(56) References Cited

U.S. PATENT DOCUMENTS 7,601,984 B2  10/2009  Sano et al.
7,791,072 B2   9/2010  Kumomi et al.
(Continued)

FOREIGN PATENT DOCUMENTS

JP   2006-165528 A   6/2006
JP   2006-165529 A   6/2006
(Continued)

OTHER PUBLICATIONS

International Search Report (Application No. PCT/IB2017/050692) dated May 30, 2017.
(Continued)

*Primary Examiner* — Samuel A Gebremariam
(74) *Attorney, Agent, or Firm* — Fish & Richardson P.C.

(57) ABSTRACT

The field-effect mobility and reliability of a transistor including an oxide semiconductor film are improved. Provided is a semiconductor device including an oxide semiconductor film. The semiconductor device includes a first insulating film, an oxide semiconductor film over the first insulating film, a second insulating film and a third insulating film over the oxide semiconductor film, and a gate electrode over the second insulating film. The second insulating film comprises a silicon oxynitride film. When excess oxygen is added to the second insulating film by oxygen plasma treatment, oxygen can be efficiently supplied to the oxide semiconductor film.

22 Claims, 52 Drawing Sheets

(51) Int. Cl.
*H01L 21/02* (2006.01)
*H01L 21/44* (2006.01)
*H01L 21/443* (2006.01)
*H01L 21/4757* (2006.01)
*H01L 29/04* (2006.01)
*H01L 29/49* (2006.01)
*H01L 29/66* (2006.01)
*H01L 29/786* (2006.01)
*H01L 29/51* (2006.01)

(52) U.S. Cl.
CPC ...... *H01L 21/0217* (2013.01); *H01L 21/0234* (2013.01); *H01L 21/02274* (2013.01); *H01L 21/02323* (2013.01); *H01L 21/02326* (2013.01); *H01L 21/44* (2013.01); *H01L 21/443* (2013.01); *H01L 21/4757* (2013.01); *H01L 29/045* (2013.01); *H01L 29/4908* (2013.01); *H01L 29/66969* (2013.01); *H01L 29/7869* (2013.01); *H01L 29/78648* (2013.01); *H01L 29/518* (2013.01)

(56) References Cited

U.S. PATENT DOCUMENTS

| | | | |
|---|---|---|---|
| 8,237,166 B2 | 8/2012 | Kumomi et al. | |
| 8,642,412 B2 | 2/2014 | Yamazaki et al. | |
| 8,916,424 B2 | 12/2014 | Isobe et al. | |
| 9,130,049 B2 | 9/2015 | Sano et al. | |
| 9,171,957 B2 | 10/2015 | Yamazaki | |
| 9,263,589 B2 | 2/2016 | Endo et al. | |
| 10,204,798 B2 * | 2/2019 | Jintyou | H01L 21/0214 |
| 2009/0179199 A1 | 7/2009 | Sano et al. | |
| 2012/0276694 A1 | 11/2012 | Koezuka et al. | |
| 2012/0280225 A1 | 11/2012 | Sakata | |
| 2013/0203214 A1 | 8/2013 | Isobe et al. | |
| 2014/0138683 A1 | 5/2014 | Yamazaki et al. | |
| 2015/0079731 A1 | 3/2015 | Yamazaki et al. | |
| 2015/0140731 A1 | 5/2015 | Isobe et al. | |
| 2015/0263174 A1 | 9/2015 | Yamazaki et al. | |
| 2015/0325707 A1 | 11/2015 | Sano et al. | |
| 2015/0380529 A1 | 12/2015 | Isobe et al. | |
| 2016/0013298 A1 | 1/2016 | Yamazaki | |

FOREIGN PATENT DOCUMENTS

| | | |
|---|---|---|
| JP | 2012-253327 A | 12/2012 |
| JP | 2013-179286 A | 9/2013 |
| JP | 2015-188080 A | 10/2015 |
| KR | 2015-0107622 A | 9/2015 |

OTHER PUBLICATIONS

Written Opinion (Application No. PCT/IB2017/050692) dated May 30, 2017.

* cited by examiner

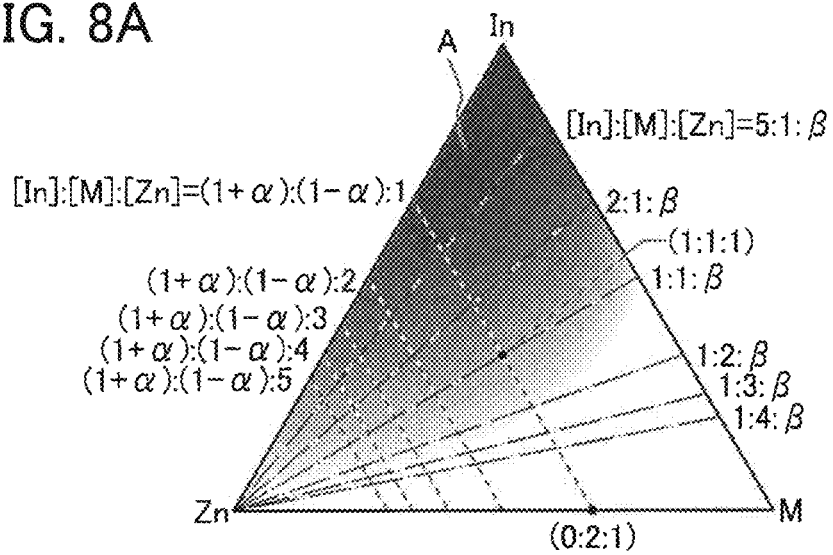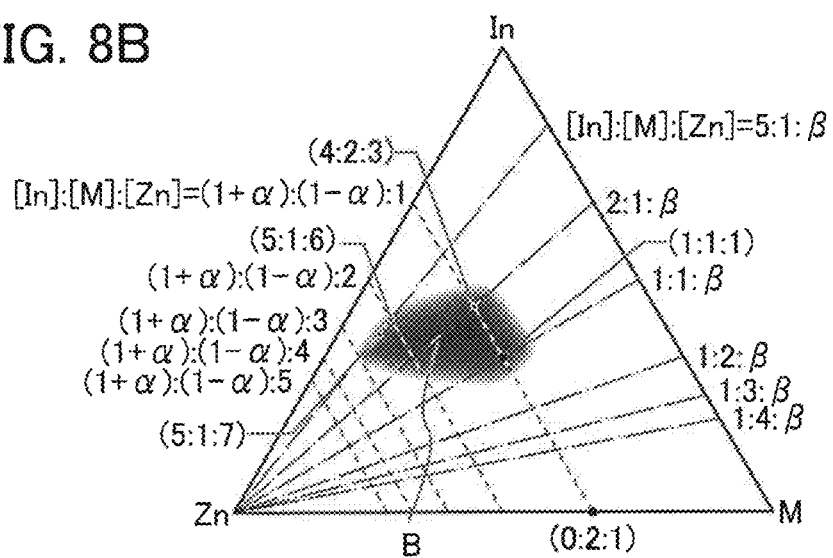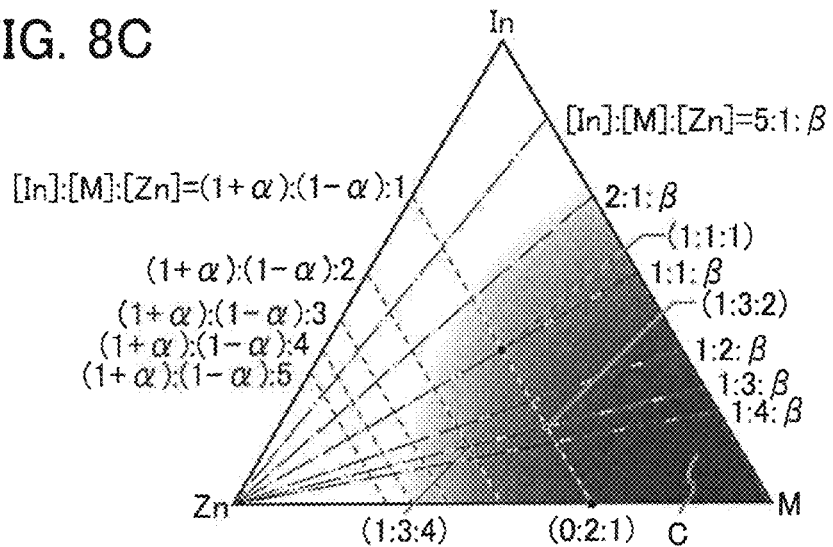

SEMICONDUCTOR DEVICE, MANUFACTURING METHOD THEREOF, DISPLAY DEVICE, AND ELECTRONIC DEVICE

CROSS-REFERENCE TO RELATED APPLICATIONS

This application is a continuation of U.S. application Ser. No. 15/431,002, filed Feb. 13, 2017, now allowed, which claims the benefit of foreign priority applications filed in Japan as Serial No. 2016-028586 on Feb. 18, 2016, and Serial No. 2016-193217 on Sep. 30, 2016, all of which are incorporated by reference.

TECHNICAL FIELD

One embodiment of the present invention relates to a semiconductor device including an oxide semiconductor film, a method for manufacturing the semiconductor device, a display device including the semiconductor device, and an electronic device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. In particular, one embodiment of the present invention relates to a semiconductor device, a display device, a light-emitting device, a power storage device, or a memory device, or a driving method or manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

A technique by which a transistor is formed using a semiconductor thin film formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to the transistor. As another material for the same, an oxide semiconductor has been attracting attention.

For example, a transistor whose active layer includes an amorphous oxide containing indium (In), gallium (Ga), and zinc (Zn) and having an electron carrier concentration lower than $10^{18}/cm^3$ is disclosed (see Patent Document 1).

Although a transistor including an oxide semiconductor can be operated at higher speed than a transistor including amorphous silicon and can be manufactured more easily than a transistor including polycrystalline silicon, the transistor including an oxide semiconductor is known to have a problem of low reliability because of high possibility of a change in electrical characteristics. For example, the threshold voltage of the transistor might be changed after a bias-temperature stress test (BT test). Note that in this specification, threshold voltage refers to a gate voltage which is needed to turn on a transistor. A gate voltage refers to a potential difference between a source potential and a gate potential when the source potential is regarded as a reference potential.

REFERENCE

Patent Document

[Patent Document 1] Japanese Published Patent Application No. 2006-165528

DISCLOSURE OF INVENTION

In a transistor that uses an oxide semiconductor film in its channel region, oxygen vacancies which might be formed in the oxide semiconductor film adversely affect the transistor characteristics. When oxygen vacancies are formed in the oxide semiconductor film, for example, the oxygen vacancies are bonded to hydrogen to serve as carrier supply sources. The carrier supply sources generated in the oxide semiconductor film cause a change in the electrical characteristics, typified by a shift in the threshold voltage, of the transistor including the oxide semiconductor film.

Too many oxygen vacancies in the oxide semiconductor film shift the threshold voltage of the transistor in the negative direction, causing normally-on characteristics, for example. Thus, it is preferable that the oxide semiconductor film, especially a channel region, include few oxygen vacancies or include a small amount of oxygen vacancies such that normally-on characteristics are not caused.

Carrier trap centers in a gate insulating film cause a shift in the threshold voltage of the transistor. Although the number of carrier trap centers is desirably small, it might be increased when treatment such as plasma treatment is performed after the formation of the gate insulating film.

In view of the foregoing problems, an object of one embodiment of the present invention is to prevent a change in the electrical characteristics of a transistor including an oxide semiconductor film and to improve the reliability of the transistor. Another object of one embodiment of the present invention is to provide a novel semiconductor device. Another object of one embodiment of the present invention is to provide a novel display device.

Note that the description of the above objects does not preclude the existence of other objects. In one embodiment of the present invention, there is no need to achieve all of these objects. Objects other than the above objects will be apparent from and can be derived from the description of the specification and the like.

One embodiment of the present invention is a semiconductor device provided with a transistor including an oxide semiconductor film. The transistor includes, over a substrate, the oxide semiconductor film, a gate insulating layer thereover, and a gate electrode thereover. The gate insulating layer includes a silicon oxynitride film. When the gate insulating layer over the substrate is analyzed by thermal desorption spectroscopy, the highest peak of the amount of a released gas with a mass-to-charge ratio M/z of 32, which corresponds to an oxygen molecule, appears at a substrate temperature higher than or equal to 150° C. and lower than or equal to 350° C.

In the above embodiment, measurement temperature of the thermal desorption spectroscopy is preferably higher than or equal to 80° C. and lower than or equal to 500° C.

In any of the above embodiments, the oxide semiconductor film preferably contains In, M, and Zn, where M is Al, Ga, Y, or Sn. In any of the above embodiments, the oxide semiconductor film preferably includes a crystal part having c-axis alignment.

Another embodiment of the present invention is a display device including the semiconductor device according to any of the above embodiments and a display element. Another embodiment of the present invention is a display module including the display device and a touch sensor. Another embodiment of the present invention is an electronic device including the semiconductor device according to any of the above embodiments, the above-described display device, or the display module; and an operation key or a battery.

Another embodiment of the present invention is a manufacturing method of a semiconductor device provided with a transistor including an oxide semiconductor film. The oxide semiconductor film is formed over a substrate, a gate insulating layer including at least a silicon oxynitride film is formed thereover, and oxygen plasma treatment is performed on the gate insulating layer. After a gate electrode is formed over the gate insulating layer, heat treatment is performed at a temperature higher than or equal to 150° C. and lower than or equal to 450° C. to diffuse oxygen in the gate insulating layer to the oxide semiconductor film and to decrease conductivity of the oxide semiconductor film.

In the above embodiment, the oxygen plasma treatment is preferably performed at a substrate temperature lower than or equal to 350° C. In any of the above embodiments, the silicon oxynitride film is preferably formed by a plasma CVD method at a substrate temperature lower than or equal to 350° C.

Another embodiment of the present invention is a manufacturing method of a semiconductor device provided with a transistor including an oxide semiconductor film. The oxide semiconductor film is formed over a substrate, and a gate insulating layer including at least a silicon oxynitride film is formed thereover. An oxide semiconductor is deposited over the gate insulating layer in an atmosphere containing oxygen by a sputtering method, so that a gate electrode is formed while oxygen is added to the gate insulating layer. After that, heat treatment is performed at a temperature higher than or equal to 150° C. and lower than or equal to 450° C. to diffuse oxygen in the gate insulating layer to the oxide semiconductor film and to decrease conductivity of the oxide semiconductor film.

One embodiment of the present invention can prevent a change in the electrical characteristics of a transistor including an oxide semiconductor film and improve the reliability of the transistor. One embodiment of the present invention can provide a novel semiconductor device. One embodiment of the present invention can provide a novel display device.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

FIGS. 8A to 8C each illustrate an atomic ratio range of an oxide semiconductor of one embodiment of the present invention.

BEST MODE FOR CARRYING OUT THE INVENTION

Figure 1A:
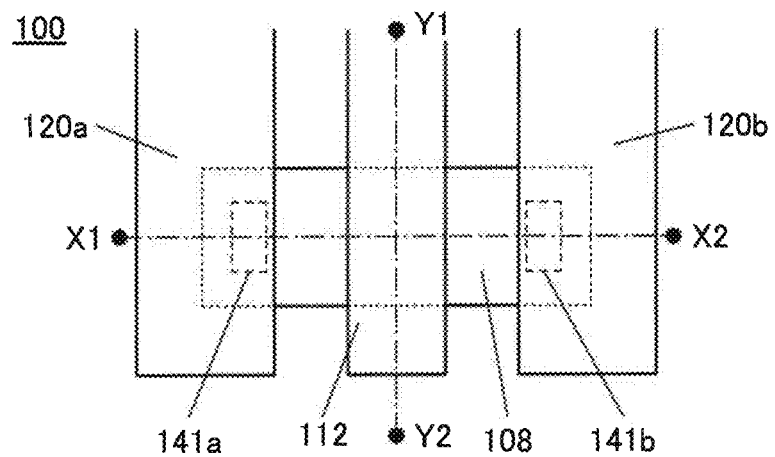
FIGS. 1A to 1C are top view and cross-sectional views illustrating a semiconductor device.

Hereinafter, embodiments will be described with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first," "second," and "third" are used in order to avoid confusion among components, and the terms do not limit the components numerically.

Note that in this specification, terms for describing arrangement, such as "over", "above," "under," and "below," are used for convenience in describing a positional relation between components with reference to drawings. Furthermore, the positional relation between components is changed as appropriate in accordance with a direction in which the components are described. Thus, the positional relation is not limited to that described with a term used in this specification and can be explained with another term as appropriate depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function." There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" means that the angle formed between two straight lines is greater than or equal to −10° and less than or equal to 10°, and accordingly also covers the case where the angle is greater than or equal to −5° and less than or equal to 5°. The term "perpendicular" means that the angle formed between two straight lines is greater than or equal to 80° and less than or equal to 100°, and accordingly also covers the case where the angle is greater than or equal to 85° and less than or equal to 95°.

In this specification and the like, the terms "film" and "layer" can be interchanged with each other. For example, the term "conductive layer" can be changed into the term "conductive film" in some cases. Furthermore, the term "insulating film" can be changed into the term "insulating layer" in some cases.

Unless otherwise specified, the off-state current in this specification and the like refers to a drain current of a transistor in the off state (also referred to as non-conduction state and cutoff state). Unless otherwise specified, the off state of an n-channel transistor means that a voltage ($V_{gs}$) between its gate and source is lower than the threshold voltage ($V_{th}$), and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I." Furthermore, "the off-state current of a transistor" means "the off-state current in an off state at predetermined $V_{gs}$," "the off-state current in an off state at $V_{gs}$ in a predetermined range" or "the off-state current in an off state at $V_{gs}$ with which sufficiently reduced off-state current is obtained," for example.

As an example, the assumption is made of an n-channel transistor where the threshold voltage $V_{th}$ is 0.5 V and the drain current is $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., $A/_{\mu m}$).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is $V_{gs}$ at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at $V_{ds}$ at which the required reliability of a semiconductor device or the like including the transistor is ensured or $V_{ds}$ at which the semiconductor device or the like including the transistor is used. The description "an off-state current of a transistor is lower than or equal to I" may refer to a situation where there is $V_{gs}$ at which the off-state current of a transistor is lower than or equal to I at $V_{ds}$ of 0.1 V, 0.8 V, 1 V, 1.2 V, 1.8 V, 2.5 V, 3 V, 3.3 V, 10 V, 12 V, 16 V, or 20 V, $V_{ds}$ at which the required reliability of a semiconductor device or the like including the transistor is ensured, or $V_{ds}$ at which the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

In this specification and the like, the threshold voltage of a transistor refers to a gate voltage ($V_g$) at which a channel is formed in the transistor. Specifically, in a graph where the lateral axis represents the gate voltage ($V_g$) and the longitudinal axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$–$\sqrt{I_d}$ characteristics). Alternatively, the threshold voltage of a transistor may refer to a gate voltage ($V_g$) at which the value of $I_d[A]\times L/W$ [μm] is $1\times10^{-9}$ [A] where L is channel length and W is channel width.

In this specification and the like, a "semiconductor" can have characteristics of an "insulator" when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" can have characteristics of a "conductor" when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

In this specification and the like, an impurity in a semiconductor refers to an element that is not a main component of the semiconductor film. For example, an element with a concentration of lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of the impurity which changes the characteristics of the semiconductor include Group 1 elements, Group 2 elements, Group 14 elements, Group 15 elements, and transition metals other than the main components; specific examples are hydrogen (also included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor includes silicon, examples of the impurity which changes the characteristics of the semiconductor include oxygen, Group 1 elements except hydrogen, Group 2 elements, Group 13 elements, and Group 15 elements.

Embodiment 1

In this embodiment, a semiconductor device of one embodiment of the present invention that includes a gate insulating film having an excess oxygen region will be described. In addition, a method for manufacturing a semiconductor device of one embodiment of the present invention will be described.

<1-1. Structure Example 1 of Semiconductor Device>

Figure 1B:
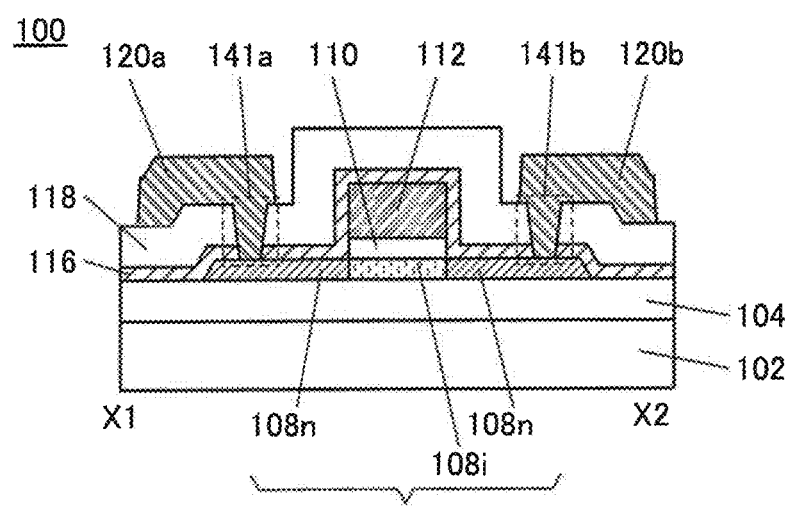
Figure 1C:
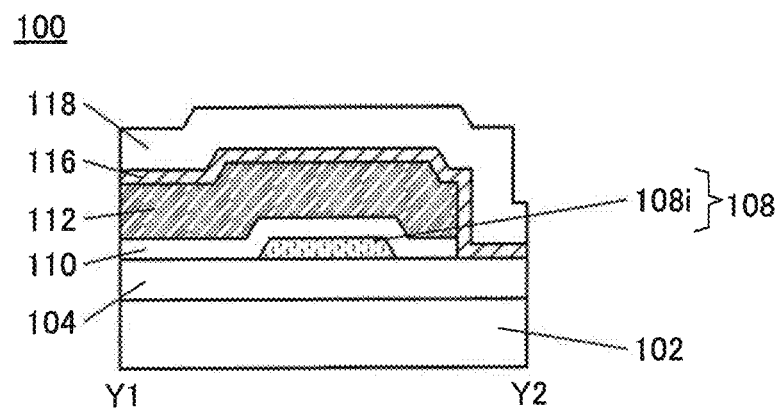

FIG. 1A is a top view of a transistor 100 of a semiconductor device of one embodiment of the present invention. FIG. 1B is a cross-sectional view taken along a dashed dotted line X1-X2 in FIG. 1A, and FIG. 1C is a cross-sectional view taken along a dashed dotted line Y1-Y2 in FIG. 1A. Note that some components of the transistor 100 (e.g., an insulating film serving as a gate insulating film) are not illustrated in FIG. 1A to avoid complexity. Furthermore, the direction of the dashed dotted line X1-X2 may be referred to as a channel length direction, and the direction of the dashed dotted line Y1-Y2 may be referred to as a channel width direction. As in FIG. 1A, some components are not illustrated in some cases in top views of transistors described below.

The transistor 100 illustrated in FIGS. 1A to 1C is what is called a top-gate transistor.

The transistor 100 includes an insulating film 104 over a substrate 102, an oxide semiconductor film 108 over the insulating film 104, an insulating film 110 over the oxide semiconductor film 108, a conductive film 112 over the insulating film 110, and an insulating film 116 over the insulating film 104, the oxide semiconductor film 108, and the conductive film 112.

The oxide semiconductor film 108 preferably contains In, M (M is Al, Ga, Y, or Sn), and Zn.

The oxide semiconductor film 108 includes a first region 108i that overlaps with the conductive film 112 and is in contact with the insulating film 104 and the insulating film 110. The oxide semiconductor film 108 also includes a second region 108n in contact with the insulating film 116. The second region 108n has a higher carrier density than the first region 108i. This means that the oxide semiconductor film 108 of one embodiment of the present invention includes two kinds of regions having different carrier densities.

Note that the carrier density of the first region 108i is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still further preferably higher than or equal to $1\times10^{11}$ cm$^{-3}$ and lower than or equal to $1\times10^{15}$ cm$^{-3}$.

Although an example where the oxide semiconductor film 108 is a single layer is mainly described with reference to FIGS. 1A to 1C and in modes for carrying out embodiments of the present invention, the oxide semiconductor film 108 may have a stacked-layer structure of films with different carrier densities. For example, the oxide semiconductor film 108 may have a two-layer structure including a first oxide semiconductor film and a second oxide semiconductor film over the first oxide semiconductor film. By making the first oxide semiconductor film have a higher carrier density than the second oxide semiconductor film, the oxide semiconductor film including regions with different carrier densities can be formed.

The amount of oxygen vacancies or the impurity concentration in the first oxide semiconductor film is slightly higher than that in the second oxide semiconductor film.

To increase the carrier density of the first oxide semiconductor film, an element that forms oxygen vacancies may be added into the first oxide semiconductor film so that hydrogen or the like is bonded to the oxygen vacancies. Typical examples of the element that forms oxygen vacancies include hydrogen, boron, carbon, nitrogen, fluorine, phosphorus, sulfur, chlorine, and a rare gas element. Typical examples of the rare gas element include helium, neon, argon, krypton, and xenon. Note that among the above-mentioned elements, nitrogen is particularly preferable as the element that forms oxygen vacancies in the oxide semiconductor film.

By using an argon gas and a dinitrogen monoxide gas as deposition gases in forming the first oxide semiconductor film, for example, a nitrogen element can be contained in the first oxide semiconductor film. In this case, the first oxide semiconductor film includes a region having a higher nitrogen concentration than the second oxide semiconductor film.

Accordingly, the first oxide semiconductor film has a higher carrier density and is of slightly n-type. An oxide semiconductor film having an increased carrier density is described as "slightly-n oxide semiconductor film," in some cases.

In the case where the voltage applied to the gate of the transistor ($V_g$) is higher than 0 V and lower than or equal to 30 V, for example, the carrier density of the first oxide semiconductor film is preferably higher than $1\times10^{16}$ cm$^{-3}$ and lower than $1\times10^{18}$ cm$^{-3}$, and further preferably higher than $1\times10^{16}$ cm$^{-3}$ and lower than or equal to $1\times10^{17}$ cm$^{-3}$.

In the case where the carrier density of the first oxide semiconductor film is increased, the crystallinity of the first oxide semiconductor film might be lower than that of the second oxide semiconductor film. In this case, the oxide semiconductor film 108 has a stacked-layer structure of a low-crystallinity oxide semiconductor film and a high-crystallinity oxide semiconductor film. The crystallinity of an oxide semiconductor film has a correlation to the film density of the oxide semiconductor film, and the oxide semiconductor film having higher crystallinity has a higher film density. Thus, the oxide semiconductor film 108 can be regarded to have a stacked-layer structure of an oxide semiconductor film having a low film density and an oxide semiconductor film having a high film density.

Note that the crystallinity of the oxide semiconductor film 108 can be determined by analysis by X-ray diffraction (XRD) or with a transmission electron microscope (TEM), for example. The film density of the oxide semiconductor film 108 can be measured with an X-ray reflectometer (XRR), for example.

The second region 108n is in contact with the insulating film 116. The insulating film 116 contains nitrogen or hydrogen. Thus, nitrogen or hydrogen in the insulating film 116 is added to the second region 108n. The carrier density of the second region 108n is increased by the addition of nitrogen or hydrogen from the insulating film 116.

The transistor 100 may further include an insulating film 118 over the insulating film 116, a conductive film 120a electrically connected to the second region 108n through an opening 141a provided in the insulating films 116 and 118, and a conductive film 120b electrically connected to the second region 108n through an opening 141b provided in the insulating films 116 and 118.

In this specification and the like, the insulating film 104 may be referred to as a first insulating film, the insulating film 110 may be referred to as a second insulating film, the insulating film 116 may be referred to as a third insulating film, and the insulating film 118 may be referred to as a fourth insulating film. The conductive film 112 functions as a gate electrode, the conductive film 120a functions as a source electrode, and the conductive film 120b functions as a drain electrode.

The insulating film 110 functions as a gate insulating film. Furthermore, the insulating film 110 includes an excess oxygen region comprising a silicon oxynitride film. Since the insulating film 110 has the excess oxygen region, excess oxygen can be supplied to the first region 108i of the oxide semiconductor film 108. In the present invention, oxygen is added to the insulating film 110 by oxygen plasma treatment performed at a substrate temperature lower than or equal to 300° C., preferably lower than or equal to 250° C., after the formation of the insulating film 110. Accordingly, a considerably larger amount of excess oxygen can be supplied from the insulating film 110 to the oxide semiconductor film, as compared with the conventional case. Note that in one embodiment of the present invention, oxygen plasma treatment means plasma treatment using oxygen. For example, a gas used in plasma treatment may contain a gas other than oxygen that does not block an effect of adding oxygen to a film. The gas used in plasma treatment may contain, for example, oxygen at a flow rate percentage of 90% and argon at a flow rate percentage of 10%.

The insulating film 110 in one embodiment of the present invention has a single-layer or stacked-layer structure including a silicon oxynitride film. When the insulating film 110 is analyzed by thermal desorption spectroscopy (TDS), the highest peak of the amount of a released gas with a mass-to-charge ratio M/z of 32, which corresponds to an oxygen molecule, appears at a substrate temperature higher than or equal to 150° C. and lower than or equal to 300° C., ideally higher than or equal to 150° C. and lower than or equal to 250° C., within a measurement temperature range. Hereinafter, emission characteristics of oxygen molecules analyzed by TDS are regarded as those of a gas with a mass-to-charge ratio M/z of 32. A typical temperature range analyzed by TDS is from 80° C. to 500° C., and the analysis results at temperatures higher than 500° C. are not regarded as the emission characteristics of oxygen molecules. Oxygen vacancies formed in the first region 108$i$ are filled with excess oxygen in the insulating film 110, whereby a highly reliable semiconductor device can be provided. Note that in the description regarding TDS in this specification, substrate temperature means substrate surface temperature.

As a conventional method for adding oxygen to a silicon oxynitride film, plasma treatment using an $N_2O$ or $NO_2$ gas can be given. However, the present inventors have found that the number of electron trap centers is increased when plasma treatment using an $N_2O$ or $NO_2$ gas is performed on the silicon oxynitride film. One of the factors is an increase in nitrogen oxide ($NO_x$) in the silicon oxynitride film included in the insulating film 110. To prevent a positive shift of the threshold voltage of the transistor 100 when a bias-temperature stress test (BT test) is conducted, particularly when positive bias stress is applied to the gate electrode, plasma treatment using an $N_2O$ or $NO_2$ gas that causes an increase in nitrogen oxide ($NO_x$) should not be performed. Thus, oxygen plasma treatment performed after the formation of the insulating film 110, which is one embodiment of the present invention, is effective.

The oxide semiconductor film 108 preferably has a region in which the atomic proportion of In is larger than the atomic proportion of M. When the oxide semiconductor film 108 has a region in which the atomic proportion of In is larger than the atomic proportion of M, the transistor 100 can have high field-effect mobility. Specifically, the field-effect mobility of the transistor 100 can exceed 10 cm$^2$/Vs, preferably exceed 30 cm$^2$/Vs.

The use of the transistor with high field-effect mobility in a gate driver that generates a gate signal (specifically, a demultiplexer connected to an output terminal of a shift register included in the gate driver), for example, allows a semiconductor device or a display device to have a narrow frame.

When oxygen vacancies are formed in the oxide semiconductor film 108, the oxygen vacancies are bonded to hydrogen to serve as carrier supply sources. The carrier supply sources generated in the oxide semiconductor film 108 cause a change in the electrical characteristics, typified by a shift in the threshold voltage, of the transistor 100 including the oxide semiconductor film 108. Therefore, it is preferable that the amount of oxygen vacancies in the oxide semiconductor film 108, particularly in the first region 108$_i$, be as small as possible.

Oxygen vacancies formed in the first region 108$i$ can be filled with excess oxygen supplied from the insulating film 110. Thus, the first region 108$i$ of the oxide semiconductor film 108 has a low impurity concentration and a low density of defect states. Note that a film having a low impurity concentration and a low density of defect states (or a small amount of oxygen vacancies) is referred to as a "highly purified intrinsic film" or a "substantially highly purified intrinsic film." A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on).

A highly purified intrinsic or substantially highly purified intrinsic oxide semiconductor film has a low density of defect states and accordingly has a low density of trap states in some cases. Furthermore, a highly purified intrinsic or substantially highly purified intrinsic oxide semiconductor film has an extremely low off-state current; even when an element has a channel width of 1×10$^6$ μm and a channel length L of 10 μm, the off-state current can be less than or equal to the measurement limit of a semiconductor parameter analyzer, that is, less than or equal to 1×10$^{-13}$ A, at a voltage between a source electrode and a drain electrode (drain voltage) of from 0.1 V to 10 V.

Figure 2A:
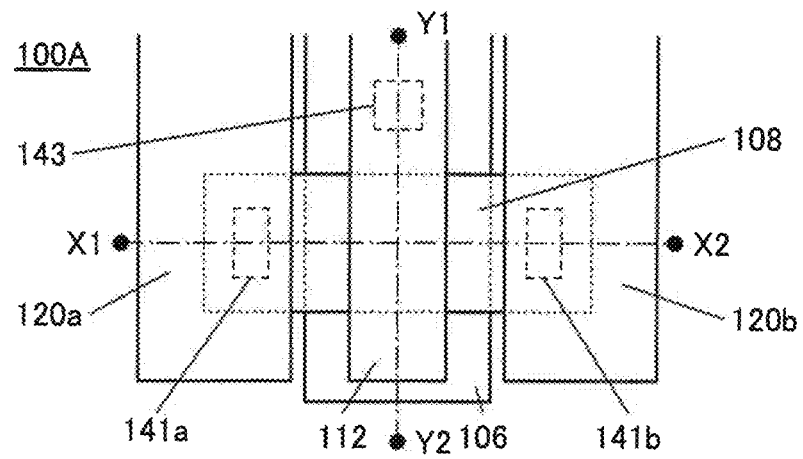
FIGS. 2A to 2C are top view and cross-sectional views illustrating a semiconductor device.
Figure 2B:
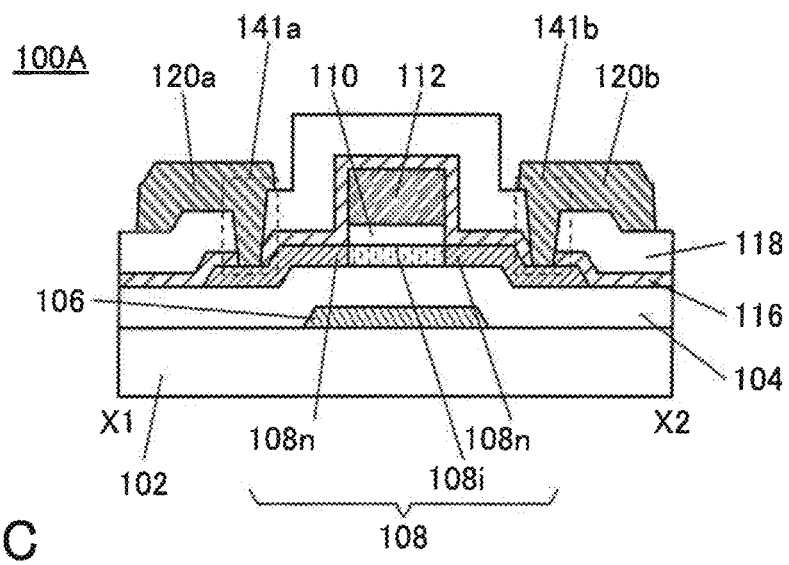
Figure 2C:
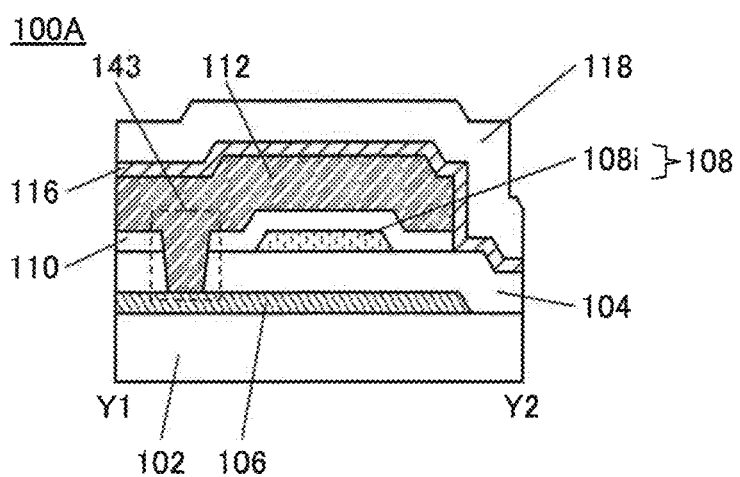

A transistor 100A illustrated in FIGS. 2A to 2C is different from the transistor 100 illustrated in FIGS. 1A to 1C in that a conductive film 106 is provided over the substrate 102. In the transistor illustrated in FIGS. 2A to 2C, the conductive film 112 and the conductive film 106 can be used as gate electrodes.

Figure 36A:
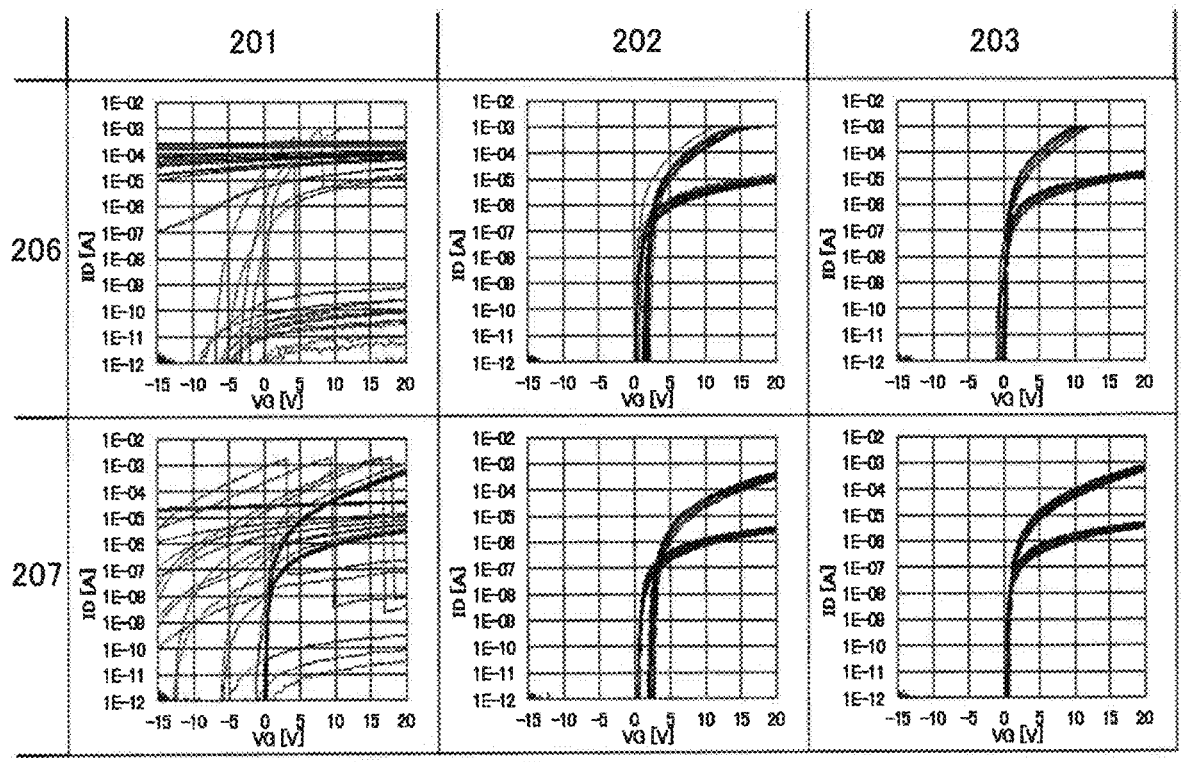
FIGS. 36A and 36B show $I_d$–$V_g$ characteristics of transistors and shifts in threshold voltage.

FIG. 36A shows the $I_d$-$V_g$ characteristics of a transistor 201, a transistor 202, and a transistor 203 each having the structure illustrated in FIGS. 2A to 2C and using the conductive films 112 and 106 as gate electrodes at the same potential. The transistors 201 to 203 were obtained by changing the conditions after the formation of the insulating film 110. The $I_d$-$V_g$ characteristics were measured under the following conditions: the substrate temperature was at room temperature, $I_d$ was 0.1 V and 10 V, and $V_g$ was changed from −15 V to +20 V. FIG. 36A shows the $I_d$-$V_g$ characteristics of the transistors obtained under conditions 206 and conditions 207. In the conditions 206, the channel length L was 2 μm and the channel width W was 50 μm. In the conditions 207, the channel length L was 6 μm and the channel width W was 50 μm. The $I_d$-$V_g$ characteristics were measured using the conductive films 112 and 106 as gate electrodes. The characteristics at $I_d$ of 0.1 V and 10 V are overwritten, and the measurement results of a plurality of transistors on a specific surface of a substrate are overwritten.

The insulating films 110 in the transistor 201, the transistor 202, and the transistor 203 are formed using silicon oxynitride under the same conditions. In the transistor 201, no $N_2O$ plasma treatment or oxygen plasma treatment was performed after the formation of the insulating film 110, and the conductive film 112 was formed. In the transistor 202, $N_2O$ plasma treatment was performed after the formation of the insulating film 110, and the conductive film 112 was formed. In the transistor 203, oxygen plasma treatment was performed after the formation of the insulating film 110, and the conductive film 112 was formed. After the formation of the conductive film 112, the insulating film 110 in each of the transistor 201, the transistor 202, and the transistor 203 was subjected to heat treatment at a temperature not higher than 250° C.

In the $I_d$–$V_g$ characteristics of the transistor 201, the threshold voltage largely shifts in the negative direction. In contrast, in the $I_d$–$V_g$ characteristics of the transistor 202 and the transistor 203, the threshold voltage is around 0 V. This suggests that $N_2O$ plasma treatment or oxygen plasma treatment performed after the formation of the insulating film 110 is effective in increasing excess oxygen in the insulating film 110.

Figure 36B:
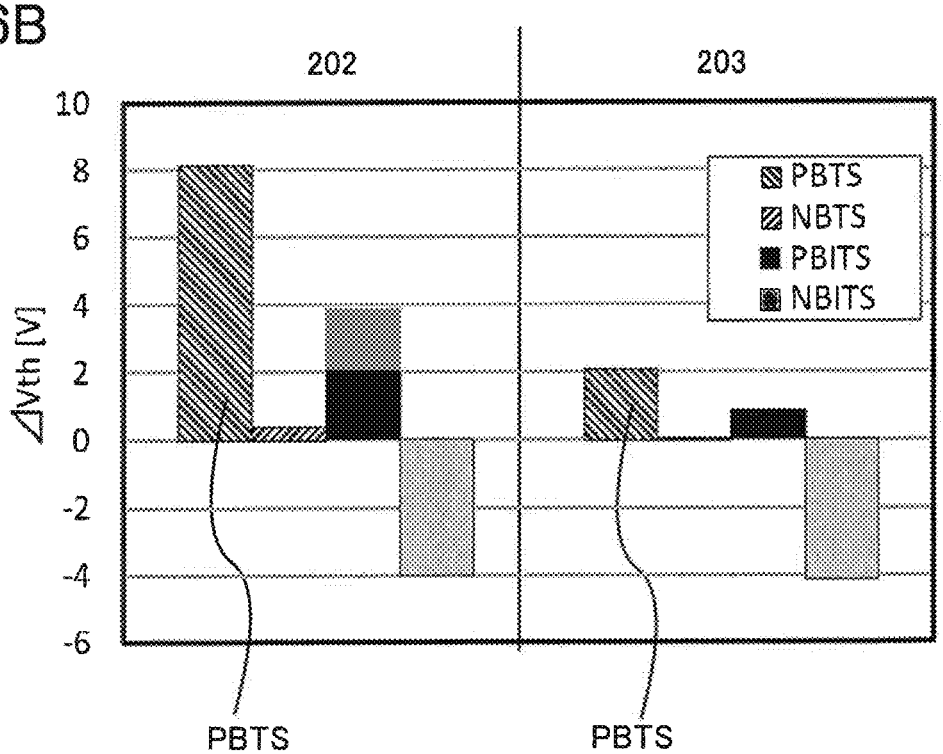

FIG. 36B shows the results of the BT tests conducted on the transistor 202 and the transistor 203. The longitudinal axis represents the amount of shift in threshold voltage ($\Delta V_{th}$) in the $I_d$–$V_g$ characteristics, where the unit is V. The channel length L and the channel width W of each of the transistors subjected to the BT tests were 3 μm and 50 μm, respectively. The BT tests were conducted in an environment irradiated with white LED light with an illuminance of 10000 1× or in a dark environment, for 60 minutes at a gate bias of +30 V or −30 V. That is, four types of BT tests were conducted: a positive gate bias temperature stress (PBTS) test, a negative gate bias temperature stress (NBTS) test, a positive gate bias illumination temperature stress (PBITS) test, and a negative gate bias illumination temperature stress (NBITS) test. The substrate temperature during the BT tests and during the measurement of the $I_d$–$V_g$ characteristics was set at 60° C.

The results of the BT tests show that a shift in the threshold voltage of the transistor 202 due to the positive gate bias temperature stress (PBTS) test was approximately +8 V, and a shift in the threshold voltage of the transistor 203 due to the positive gate bias temperature stress (PBTS) test was approximately +2 V. This indicates that the transistor 202 contains more nitrogen oxide ($NO_x$) serving as electron trap centers than the transistor 203, in the silicon oxynitride film included in the insulating film 110.

As described above, in the semiconductor device of one embodiment of the present invention, a gate insulating film is formed over an oxide semiconductor layer. Note that the gate insulating film can supply excess oxygen to an oxide semiconductor film while an increase in nitrogen oxide ($NO_x$) in a silicon oxynitride film included in the gate insulating film is prevented. Thus, a sufficient amount of oxygen is supplied to the oxide semiconductor layer, whereby oxygen vacancies in the oxide semiconductor layer can be reduced and the reliability of a transistor can be improved. Accordingly, a highly reliable semiconductor device can be provided.

<1-2. Components of Semiconductor Device>

Next, components of the semiconductor device of this embodiment will be described in detail.

[Substrate]

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used, or any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure of an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the oxide semiconductor film 108 can be reduced.

For example, the insulating film 104 can be formed to have a single-layer structure or stacked-layer structure of silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure of a silicon nitride film and a silicon oxynitride film. With the insulating film 104 having such a stacked-layer structure including a silicon nitride film as a lower layer and a silicon oxynitride film as an upper layer, oxygen can be efficiently introduced into the oxide semiconductor film 108.

[Conductive Film]

The conductive film 112 functioning as a gate electrode and the conductive films 120a and 120b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 112, 120a, and 120b can be formed using an oxide conductor or an oxide semiconductor, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, the oxide conductor is obtained in the following manner. Oxygen vacancies are formed in an oxide semiconductor, and then hydrogen is added to the oxygen vacancies, so that a donor level is formed in the vicinity of the conduction band. This increases the conductivity of the oxide semiconductor; accordingly, the oxide semiconductor becomes a conductor. The oxide semiconductor having become a conductor can be referred to as an oxide conductor. Oxide semiconductors generally transmit visible light because of their large energy gap. Since an oxide conductor is an oxide semiconductor having a donor level in the vicinity of the conduction band, the influence of absorption due to the donor level is small in an oxide conductor, and an oxide conductor has a visible light transmitting property comparable to that of an oxide semiconductor.

In particular, the above-described oxide conductor is favorably used as the conductive film 112 because excess oxygen can be added to the insulating film 110.

A Cu—X alloy film (X is Mn, Ni, Cr, Fe, Co, Mo, Ta, or Ti) may be used for the conductive films 112, 120a, and 120b. The use of a Cu—X alloy film results in lower manufacturing costs because the film can be processed by wet etching.

Among the above-mentioned metal elements, any one or more elements selected from titanium, tungsten, tantalum, and molybdenum are preferably included in the conductive films 112, 120a, and 120b. In particular, a tantalum nitride film is preferably used for the conductive films 112, 120a, and 120b. A tantalum nitride film has conductivity and a high barrier property against copper or hydrogen. Because a tantalum nitride film releases little hydrogen from itself, it can be favorably used as the conductive film in contact with the oxide semiconductor film 108 or the conductive film in the vicinity of the oxide semiconductor film 108.

The conductive films 112, 120a, and 120b can be formed by electroless plating. As a material that can be deposited by electroless plating, for example, one or more elements selected from Cu, Ni, Al, Au, Sn, Co, Ag, and Pd can be used. It is further favorable to use Cu or Ag because the electric resistance of the conductive film can be reduced.

[Second Insulating Film]

The insulating film 110 functioning as the gate insulating film of the transistor 100, which is one embodiment of the present invention, has a single-layer structure or a stacked-layer structure including a silicon oxynitride film formed by a plasma-enhanced chemical vapor deposition method. The insulating film 110 is subjected to oxygen plasma treatment.

When the insulating film 110 in one embodiment of the present invention is analyzed by TDS, the highest peak of the amount of a released gas with a mass-to-charge ratio M/z of 32, which corresponds to an oxygen molecule, appears at a substrate temperature higher than or equal to 150° C. and lower than or equal to 300° C., within a measurement temperature range. Hereinafter, the characteristics of the insulating film 110 in one embodiment of the present invention, that is, a silicon oxynitride film subjected to oxygen plasma treatment, will be described with reference to FIG. 37, FIGS. 38A to 38C, FIGS. 39A to 39D, FIGS. 40A to 40I, FIG. 41, FIGS. 42A and 42B, FIGS. 43A and 43B, and FIG. 44.

Excess oxygen atoms in the silicon oxynitride film are released by thermal excitation. Note that a temperature at which the atoms are released depends on the bonding state of atoms or the like in the film. Many oxygen atoms in the silicon oxynitride film are released over a wide temperature range. Thus, when excess oxygen atoms are added to the silicon oxynitride film at low temperatures and then oxygen atoms are supplied to the oxide semiconductor film at high temperatures, a large amount of oxygen atoms can be supplied to the oxide semiconductor film.

In the case of using a plasma-enhanced chemical vapor deposition method (PECVD method), a silicon oxynitride film formed at high substrate temperatures has a high density, high electrical insulation withstand voltage characteristics, and high chemical resistance. According to these advantages, in the case where the silicon oxynitride film is used in a semiconductor element, substrate temperature is desirably high during the formation of the silicon oxynitride film. At the same time, in the case of using a silicon oxynitride film as a gate insulating film of a transistor that uses an oxide semiconductor in a channel, it is important to supply excess oxygen atoms in the silicon oxynitride film to an oxide semiconductor film more effectively for increasing reliability.

To increase the amount of excess oxygen atoms, in this embodiment, oxygen plasma treatment is performed on a silicon oxynitride film after the formation of the silicon oxynitride film. The oxygen plasma treatment is performed at a substrate temperature lower than or equal to 350° C., preferably lower than or equal to 250° C. To increase the amount of excess oxygen atoms in the silicon oxynitride film, the substrate temperature during the formation of the film is lowered.

Figure 37:
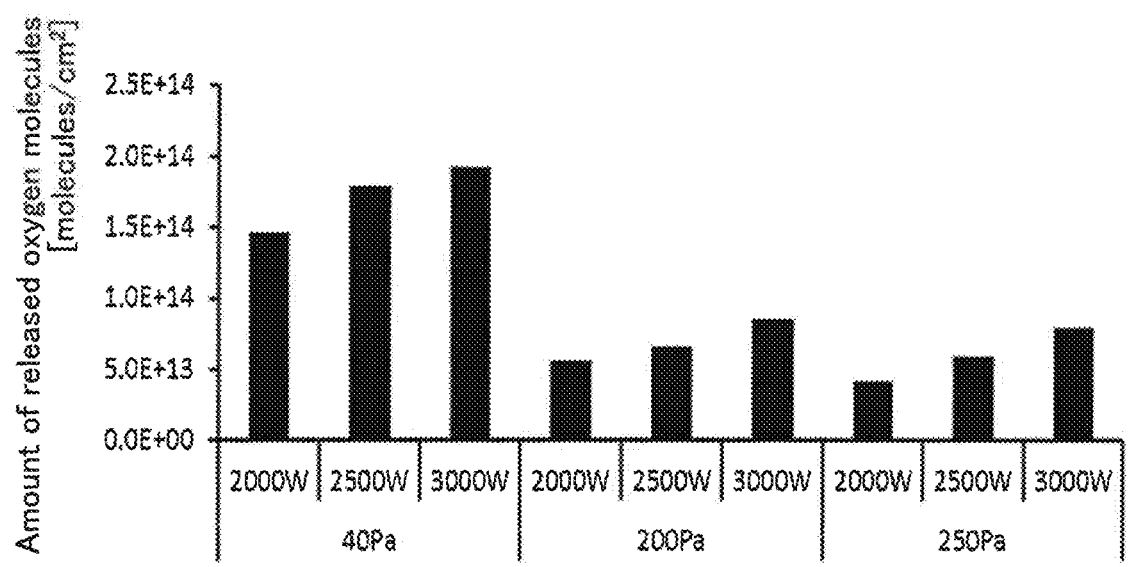
FIG. 37 shows TDS analysis results.

Note that more oxygen can be supplied to the oxide semiconductor film by changing the conditions of the oxygen plasma treatment performed on the silicon oxynitride film; an example of such a case is described below. FIG. 37 shows the measurement results of the amount of a released gas with a mass-to-charge ratio M/z of 32, which corresponds to an oxygen molecule, when samples described below were analyzed by TDS. For each sample, a 100-nm-thick silicon oxynitride film was formed over a non-alkali glass substrate, and then oxygen plasma treatment was performed on the silicon oxynitride film. In TDS analysis, the amount of released oxygen molecules was determined using data within the substrate temperature range from 80° C. to 450° C. A gas used for the oxygen plasma treatment was only oxygen. The silicon oxynitride film was formed using an $SiH_4$ gas and an $N_2O$ gas by a plasma CVD method at a substrate temperature of 350° C. The substrate temperature during the oxygen plasma treatment was 350° C.

FIG. 37 indicates that, within a range from 40 Pa to 250 Pa, the smaller the pressure during the oxygen plasma treatment is, or the higher the discharge power is, the more excess oxygen atoms are released as oxygen molecules from the silicon oxynitride film.

Figure 38A:
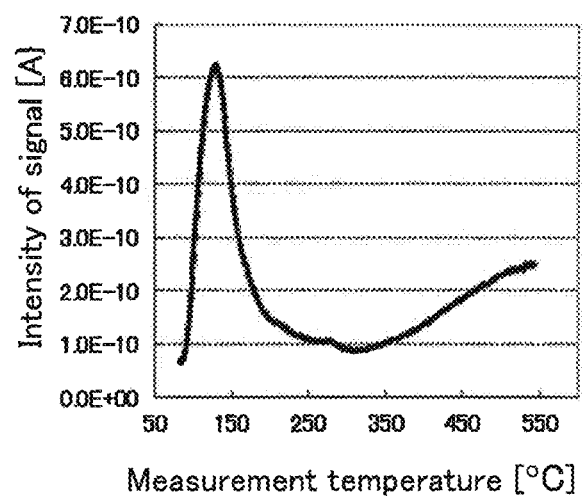
FIGS. 38A to 38C show TDS analysis results.
Figure 38B:
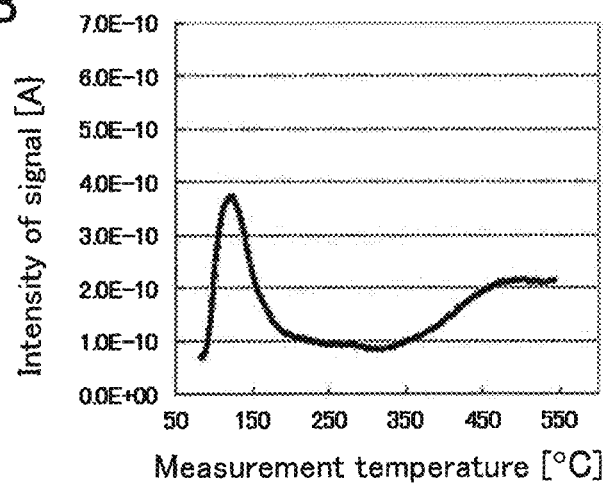
Figure 38C:
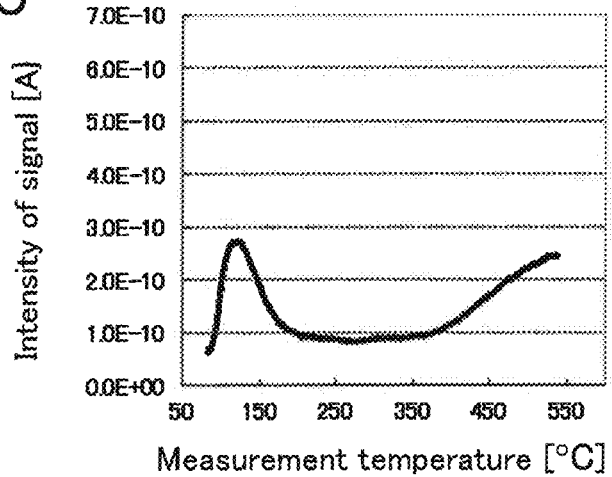

FIGS. 38A to 38C show the measurement results of the amount of a released gas with a mass-to-charge ratio M/z of 18, which corresponds to a water molecule, when samples described below were analyzed by TDS. FIG. 38A shows the results of a sample 221, FIG. 38B shows the results of a sample 222, and FIG. 38C shows the results of a sample 223. For each sample, a 100-nm-thick IGZO film was formed over a non-alkali glass substrate, and then a 100-nm-thick silicon oxynitride film was formed. The silicon oxynitride film was formed using an $SiH_4$ gas and an $N_2O$ gas by a plasma CVD method at a substrate temperature of 350° C. After that, oxygen plasma treatment was performed on the silicon oxynitride film at a discharge power of 500 W in the sample 222 and a discharge power of 3000 W in the sample 223. The longitudinal axis represents the intensity of a signal showing the released amount.

The IGZO film in each sample for TDS analysis was formed by sputtering using an oxide as a target. An atomic ratio of indium to gallium and zinc in the target was 4:2:4.1. During the formation of the IGZO film, the substrate temperature was 130° C., the flow rate ratio of the gas was $Ar:O_2=9:1$, and the pressure was 0.6 Pa.

The results in FIGS. 38A to 38C show that the sample 221 releases the largest amount of water molecules at around 120° C., followed by the sample 222. The sample 223 releases a small amount of water molecules at around 120° C. One of the factors is probably that the oxygen plasma treatment performed on the silicon oxynitride film reduced water adsorbed on a surface.

Figure 39A:
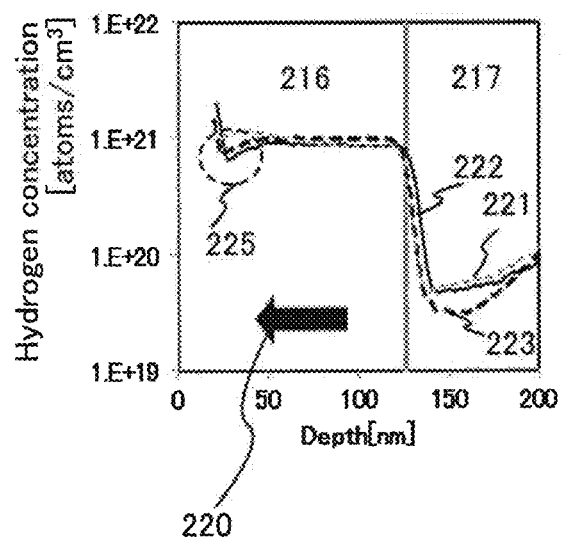
FIGS. 39A to 39D show SIMS analysis results.
Figure 39B:
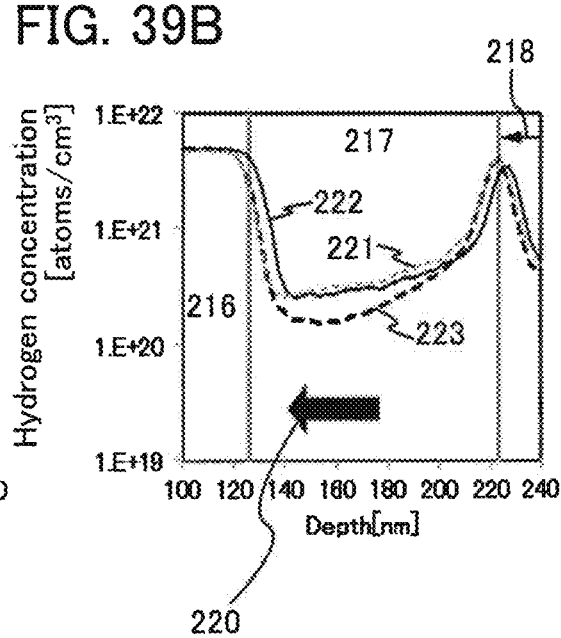

FIGS. 39A and 39B each show the measurement results of the hydrogen concentration in the sample 221, the sample 222, and the sample 223 obtained by secondary ion mass spectrometry (SIMS). In SIMS, profiles were measured from the substrate side toward a surface of the silicon oxynitride film. An arrow 220 indicates the direction of the profile measurements. FIGS. 39A to 39D show a profile 216 in the silicon oxynitride film, a profile 217 in the IGZO film, and a profile 218 in the substrate.

FIG. 39A shows the SIMS results of the hydrogen concentration in the silicon oxynitride films, which were obtained by varying the discharge power of oxygen plasma treatment. FIG. 39B shows the SIMS results of the hydrogen concentration in the IGZO films, which was obtained in a similar manner. The sample 221 was fabricated without oxygen plasma treatment, the sample 222 was fabricated with oxygen plasma treatment performed at a discharge power of 500 W, and the sample 223 was fabricated with oxygen plasma treatment performed at a discharge power of 3000 W.

The lateral axis in each graph in FIGS. 39A to 39D represents the depth direction which is perpendicular to the film surface. Note that 0 nm on the lateral axis indicates the position used for the SIMS measurement for convenience, and a region 225 corresponds to the results obtained at a position around the surface of the silicon oxynitride film. In FIG. 39A, the hydrogen concentration in the region 225 is lower in the sample 222 and the sample 223 obtained with oxygen plasma treatment than in the sample 221 obtained without oxygen plasma treatment. The above results suggest that the oxygen plasma treatment performed on the silicon oxynitride film probably reduced water adsorbed on the surface and thus, the released amounts of water molecules at around 120° C. are different from each other in FIGS. 38A to 38C.

In FIG. 39B, the hydrogen concentration is reduced in the IGZO film subjected to the oxygen plasma treatment. The larger the discharge power is, the more the hydrogen concentration of the IGZO film is reduced. Oxygen plasma treatment performed on the silicon oxynitride film is effective in reducing the hydrogen concentration not only on the surface of the silicon oxynitride film, but also in the IGZO film, that is, the oxide semiconductor film.

Figure 39C:
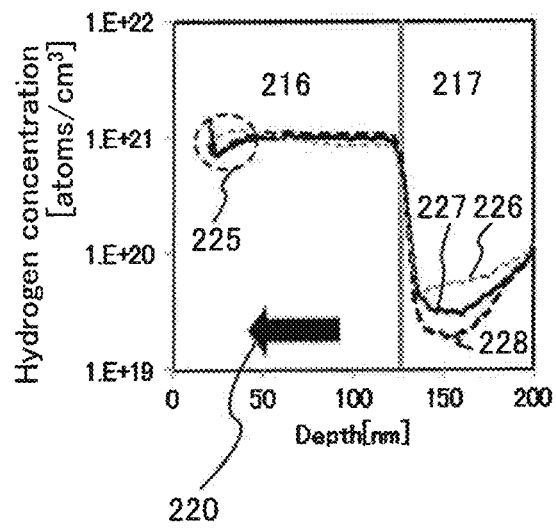
Figure 39D:
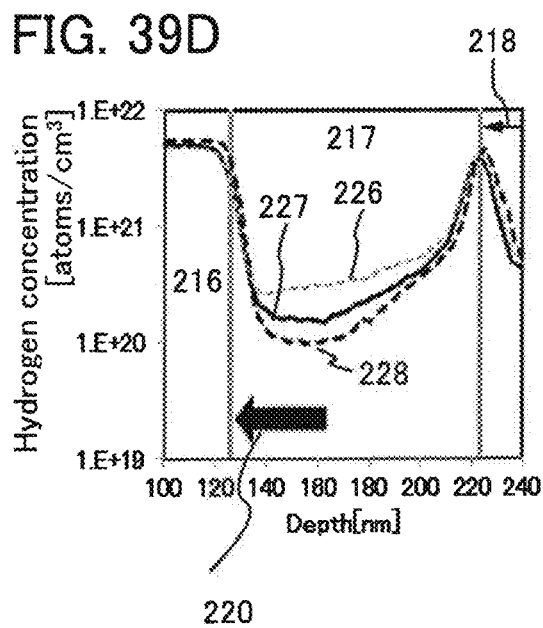

FIGS. 39C and 39D each show the measurement results of the hydrogen concentration in a sample 226, a sample 227, and a sample 228 obtained by SIMS. The sample 226 is a sample in which oxygen plasma treatment was not performed on a silicon oxynitride film, that is, a sample fabricated under the same conditions as the sample 221. The sample 227 is a sample fabricated through the fabrication process of the sample 226, except that oxygen plasma treatment was performed in a chamber at a gas pressure of 200 Pa. The sample 228 is a sample fabricated through the fabrication process of the sample 226, except that oxygen plasma treatment was performed in a chamber at a gas pressure of 40 Pa. FIG. 39C shows the quantified measurement results of the hydrogen concentration in the silicon oxynitride film, and FIG. 39D shows the quantified measurement results of the hydrogen concentration in the IGZO film. Within a range of the gas pressure in a chamber during the oxygen plasma treatment, which is from 40 Pa to 200 Pa, the hydrogen concentration in the oxide semiconductor film can be reduced as the pressure becomes lower.

FIGS. 40A to 40I show the measurement results of the amount of a released gas with a mass-to-charge ratio M/z of 32, which corresponds to an oxygen molecule, when samples described below were analyzed by TDS. For each sample, a 100-nm-thick IGZO film was formed over a non-alkali glass substrate, and then a 100-nm-thick silicon oxynitride film was formed. The silicon oxynitride film was formed using an $SiH_4$ gas and an $N_2O$ gas by a plasma CVD method at a substrate temperature of 350° C. Furthermore, oxygen plasma treatment was performed in a chamber at a gas pressure of 200 Pa with a discharge power of 3000 W.

Figure 40A:
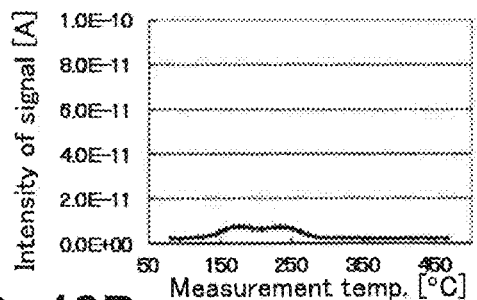
FIGS. 40A to 40I show TDS analysis results.
Figure 40B:
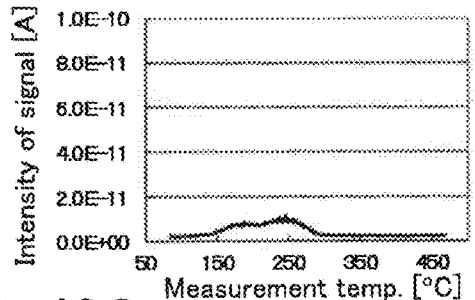
Figure 40C:
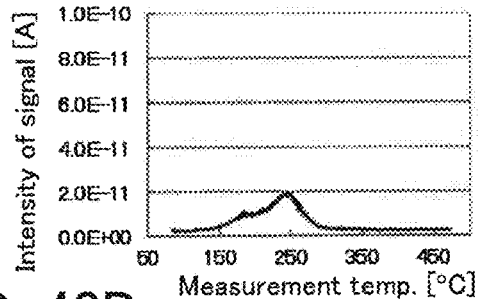
Figure 40D:
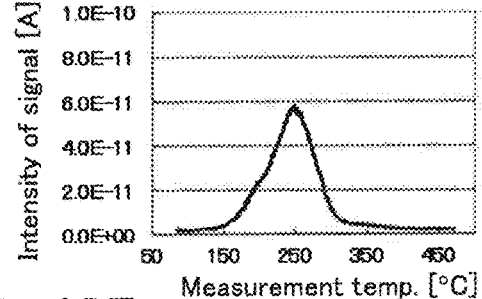
Figure 40E:
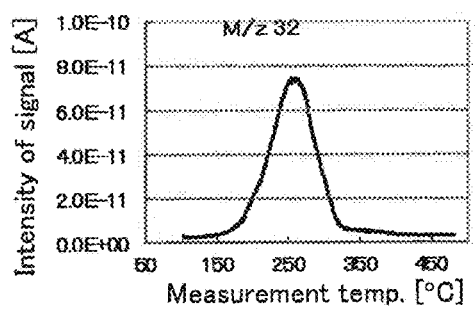
Figure 40F:
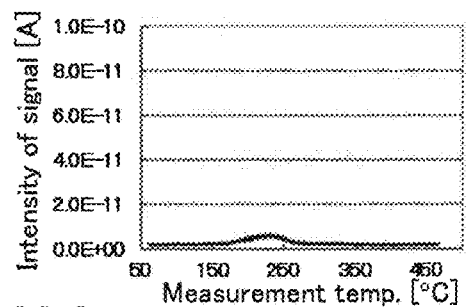
Figure 40G:
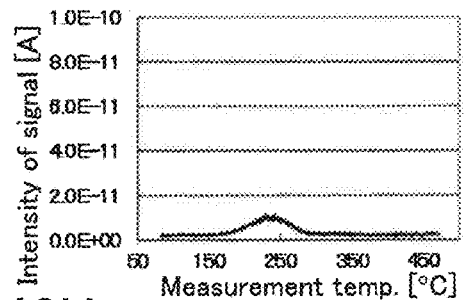
Figure 40H:
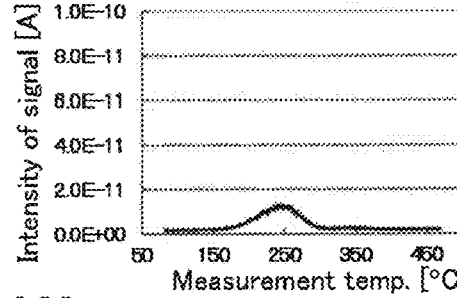
Figure 40I:
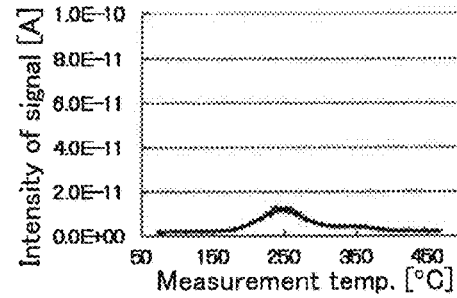

The samples for the TDS analysis were subjected to oxygen plasma treatment for different periods of time. FIG. 40A shows the results of the case for 30 seconds, FIG. 40B shows the results of the case for 60 seconds, FIG. 40C shows the results of the case for 100 seconds, FIG. 40D shows the results of the case for 300 seconds, and FIG. 40E shows the results of the case for 600 seconds. These are the results obtained by performing oxygen plasma treatment at a substrate temperature of 220° C. FIG. 40F shows the results of the case for 30 seconds, FIG. 40G shows the results of the case for 60 seconds, FIG. 40H shows the results of the case for 100 seconds, and FIG. 40I shows the results of the case for 300 seconds. These are the results obtained by performing oxygen plasma treatment at a substrate temperature of 350° C.

FIGS. 40A to 40I show that the longer the time of the oxygen plasma treatment performed on the silicon oxynitride film is, the larger the released amount of oxygen is. FIGS. 40A to 40I also show that the lower the substrate temperature during the oxygen plasma treatment is, the larger the released amount of oxygen is.

Figure 41:
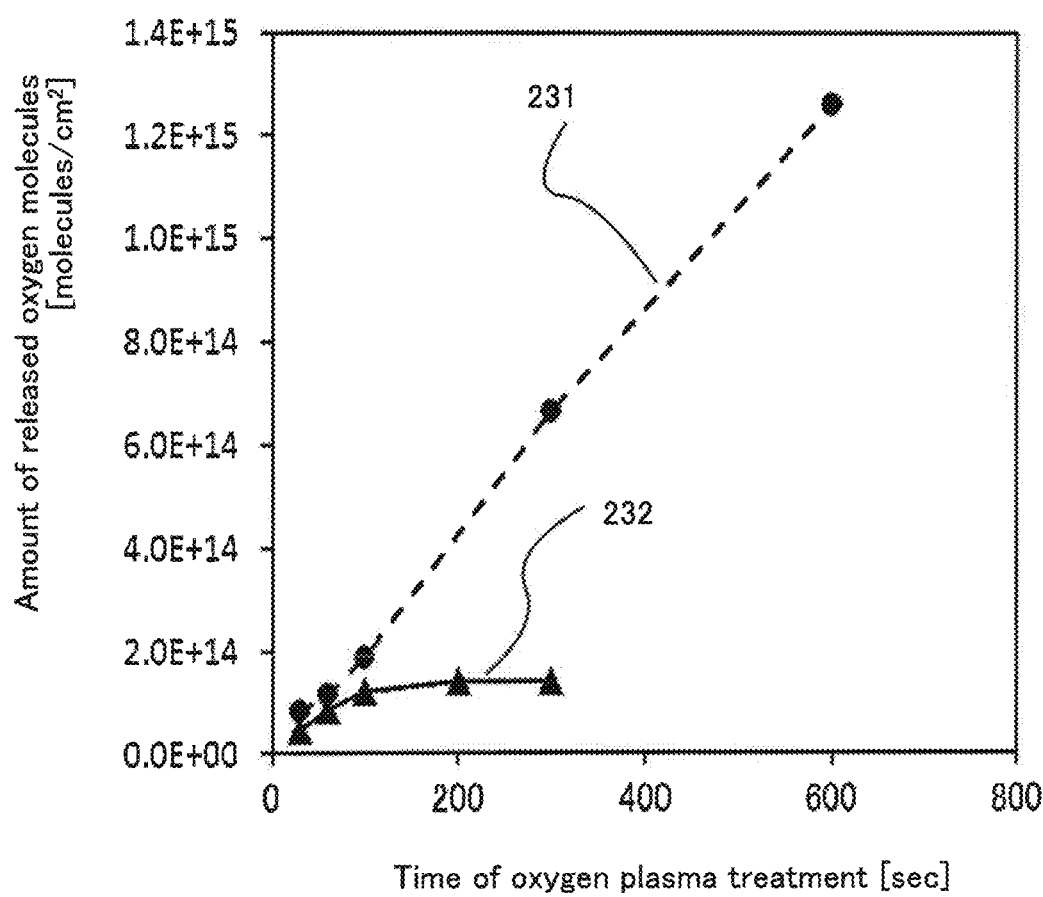
FIG. 41 shows TDS analysis results.

FIG. 41 shows the released amounts of oxygen shown in FIGS. 40A to 40I, where the lateral axis represents time of oxygen plasma treatment and the longitudinal axis represents the released amount of oxygen. A dashed line 231 indicates values obtained from the results in FIGS. 40A to 40E, which were obtained by performing oxygen plasma treatment at a substrate temperature of 220° C. A solid line 232 indicates values obtained from the results in FIGS. 40F to 40I, which were obtained by performing oxygen plasma treatment at a substrate temperature of 350° C. In the case of performing oxygen plasma treatment at a substrate temperature of 350° C., the released amount of oxygen is saturated at less than $2\times10^{14}$ molecules/cm² as oxygen plasma treatment time is prolonged. Meanwhile, in the case of performing oxygen plasma treatment at a substrate temperature of 220° C., the released amount of oxygen is not saturated at least at $1.2\times10^{15}$ molecules/cm² as oxygen plasma treatment time is prolonged. Accordingly, to increase the released amount of oxygen, it is more desirable to perform oxygen plasma treatment at a substrate temperature of 220° C. than at a substrate temperature of 350° C.

Figure 42A:
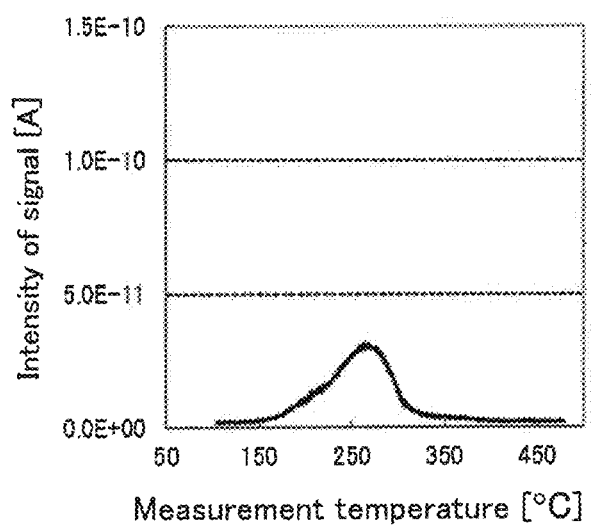
FIGS. 42A and 42B show TDS analysis results.
Figure 42B:
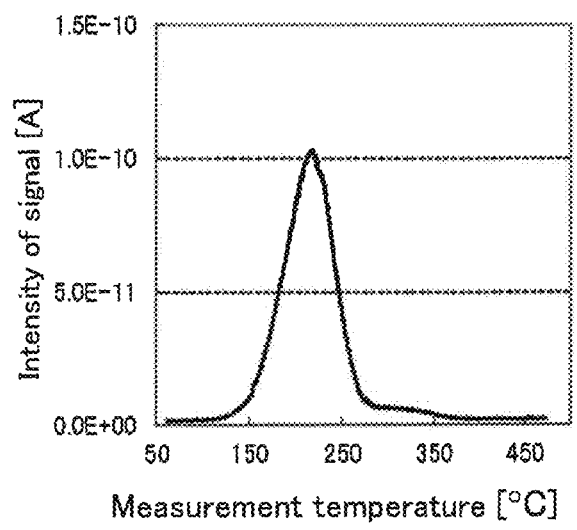

FIGS. 42A and 42B show the amount of a released gas with a mass-to-charge ratio M/z of 32, which corresponds to an oxygen molecule, when samples were analyzed by TDS. For each of the samples, a 100-nm-thick silicon oxynitride film was formed over a non-alkali glass substrate, and then oxygen plasma treatment was performed on the silicon oxynitride film. The silicon oxynitride film was formed using an $SiH_4$ gas and an $N_2O$ gas by a plasma CVD method. FIG. 42A shows the results of the case where the silicon oxynitride film was formed at 350° C. The total amount of oxygen released within a measurement temperature range from 80° C. to 450° C. is $5.17 \times 10^{14}$ molecules/cm$^2$. FIG. 42B shows the results of the case where the silicon oxynitride film was formed at 220° C. The total amount of oxygen released within a measurement temperature range from 80° C. to 450° C. is $1.47 \times 10^{15}$ molecules/cm$^2$.

One of the reasons that makes the results in FIG. 42A and the results in FIG. 42B different from each other is as follows. The silicon oxynitride film formed at low temperatures (i.e., 220° C.) has a low film density and contains many vacancies. Excess oxygen might be added to the vacancies; thus, the silicon oxynitride film has potential of absorbing or supplying a larger amount of excess oxygen.

As described above, in order to supply excess oxygen from a silicon oxynitride film to an oxide semiconductor film, it is effective to perform oxygen plasma treatment on the silicon oxynitride film at low substrate temperatures (a temperature lower than or equal to 350° C., e.g., 220° C.), increase discharge power, reduce the pressure in a chamber during discharging, increase the time for the oxygen plasma treatment, or decrease the formation temperature of the silicon oxynitride film. It is also effective to increase the thickness of the silicon oxynitride film as long as the silicon oxynitride film is formed so as to be an excess oxygen supply source.

Figure 43A:
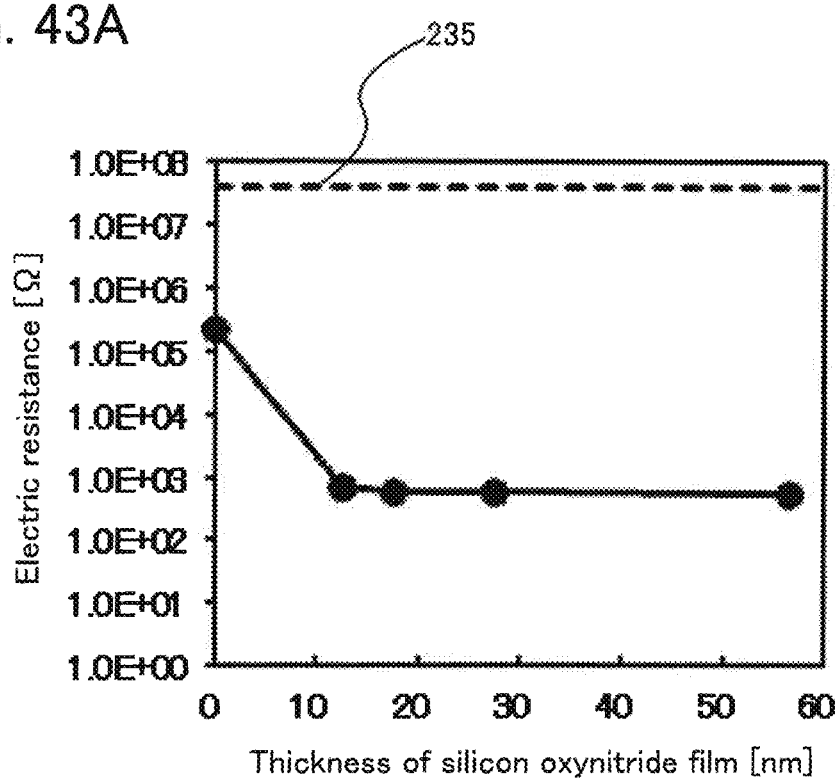
FIGS. 43A and 43B show electric resistances of IGZO films.
Figure 43B:
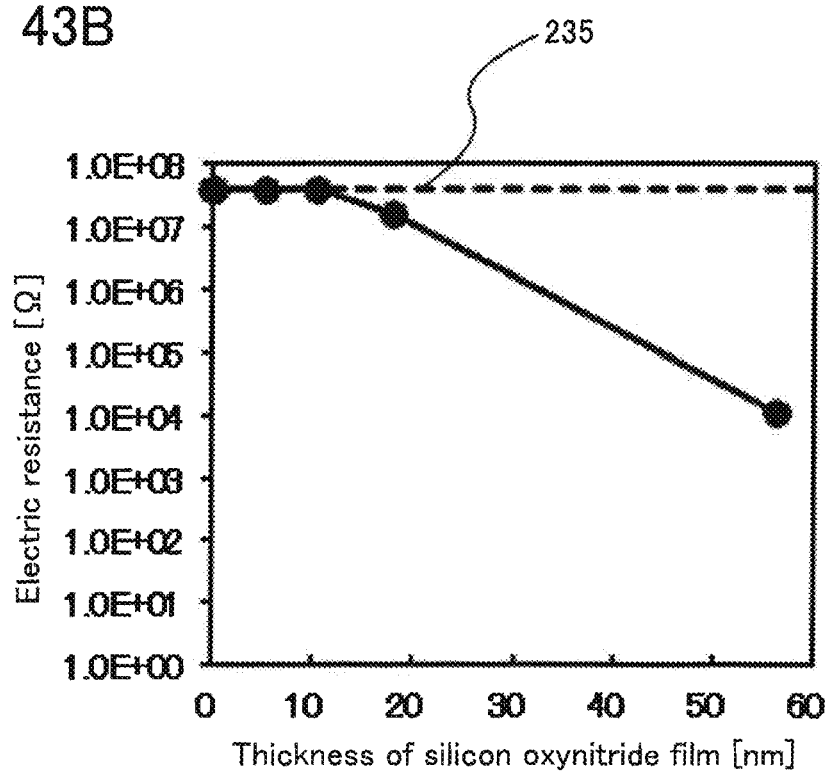

However, when a silicon oxynitride film is formed over an oxide semiconductor film by a plasma CVD method, the electric resistance of the oxide semiconductor film might be decreased depending on the formation conditions. FIGS. 43A and 43B show the electric resistance of IGZO films in samples. For each of the samples, a 50-nm-thick IGZO film was formed over a quartz glass substrate, and a silicon oxynitride film was formed thereover. In each sample, the substrate was a square with a side of 1 cm, 2-mm-square regions of the silicon oxynitride film were removed at four corners, and 2-mm-square electrodes electrically connected to the IGZO film were formed. These electrodes were used as terminals and the electric resistance (unit: Ω) between adjacent electrodes was measured.

The silicon oxynitride films were formed using an $SiH_4$ gas and an $N_2O$ gas by a plasma CVD method. The thicknesses of the silicon oxynitride films were varied between 0 nm (i.e., the film was not formed) and 60 nm. In each of the samples whose results were shown in FIG. 43A, the silicon oxynitride film was formed at a substrate temperature of 350° C. In each of the samples whose results were shown in FIG. 43B, the silicon oxynitride film was formed at a substrate temperature of 220° C. A dashed line 235 in each of FIGS. 43A and 43B indicates the electric resistance of the IGZO film before the formation of the silicon oxynitride film.

When the silicon oxynitride film is formed by a plasma CVD method, hydrogen due to a hydrogen plasma atmosphere in a chamber might be diffused to the IGZO film and oxygen vacancies and hydrogen or the like might be bonded to each other, which results in a decrease in the electric resistance of the silicon oxynitride film. The decrease in the electric resistance of the silicon oxynitride film occurs more significantly at a substrate temperature of 350° C. shown in FIG. 43A than at a substrate temperature of 220° C. shown in FIG. 43B. This is probably because hydrogen diffusion into the IGZO film and bonding between oxygen vacancies and hydrogen or the like are improved as the substrate temperature becomes higher. From this point of view, substrate temperature is desirably low when a silicon oxynitride film is formed by a plasma CVD method.

Figure 44:
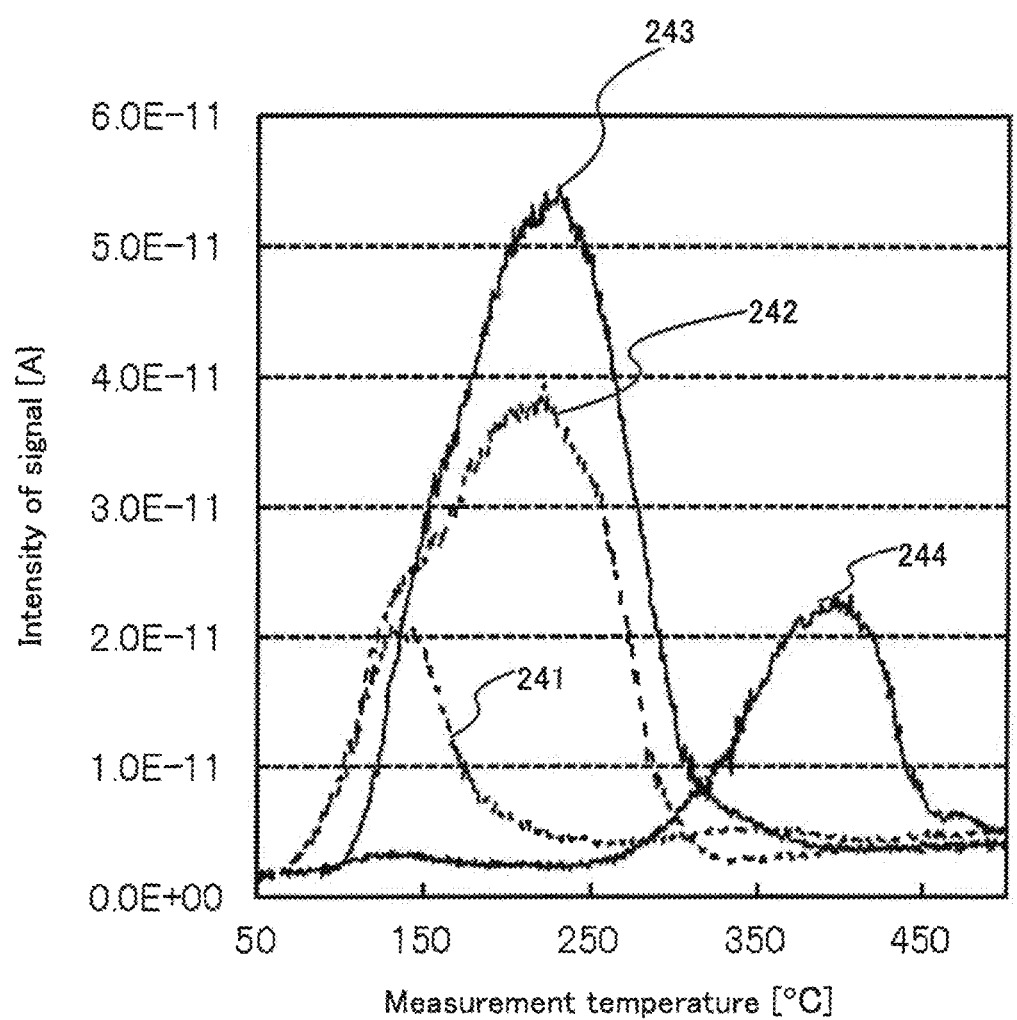
FIG. 44 shows TDS analysis results.

The present inventors fabricated display devices each including an oxide semiconductor film and a silicon oxynitride film subjected to oxygen plasma treatment, to demonstrate the effect of oxygen plasma treatment. The display devices were disassembled, and transistors obtained by removing pixel electrodes from the display devices were analyzed by TDS. FIG. 44 shows the results of the amount of a released gas with a mass-to-charge ratio M/z of 32, which corresponds to an oxygen molecule. An organic resin was removed from each measured sample. A sample 241 was fabricated without oxygen plasma treatment after the formation of a silicon oxynitride film. A sample 242 was obtained by performing oxygen plasma treatment for 120 seconds. A sample 243 was obtained by performing oxygen plasma treatment for 600 seconds. Although each of the display devices had a structure different from that of one embodiment of the present invention, the silicon oxynitride film was provided over an IGZO film, and the maximum process temperature after the formation of the silicon oxynitride film or the oxygen plasma treatment was 250° C.

Meanwhile, a commercially available display device, which was different from one embodiment of the present invention, having an oxide semiconductor film and a gate insulating film including a silicon oxynitride film was disassembled to prepare a sample 244 from which a pixel electrode was removed. FIG. 44 shows the results of the amount of a released gas with a mass-to-charge ratio M/z of 32, which corresponds to an oxygen molecule, obtained by analyzing the sample 244 by TDS.

As for the sample 241 in which the silicon oxynitride film was not subjected to oxygen plasma treatment, the highest peak appears at a temperature lower than or equal to 150° C., within the measurement temperature range of TDS. As for each of the sample 242 and the sample 243 in which the silicon oxynitride film was subjected to oxygen plasma treatment, the highest peak appears at a temperature between 150° C. and 350° C., within the measurement temperature range. In contrast, as for the sample obtained from the commercially available display device, which was different from one embodiment of the present invention, the highest peak appears at a temperature between 350° C. and 450° C., within the measurement temperature range. Accordingly, the sample obtained from the commercially available display device can be distinguished from the samples in each of which the silicon oxynitride film was subjected to oxygen plasma treatment by the sample temperature at which the highest peak appears.

The silicon oxynitride film subjected to oxygen plasma treatment contains excess oxygen sufficiently. Thus, even when the silicon oxynitride film subjected to oxygen plasma treatment, which is a feature of the present invention, is analyzed by TDS after oxygen is supplied from the silicon oxynitride film to an oxide semiconductor film by heat treatment performed in any step after the oxygen plasma treatment and a semiconductor device or a display device is completed, the highest peak of the amount of a released gas with a mass-to-charge ratio M/z of 32, which corresponds to an oxygen molecule, appears at a temperature between 150° C. and 350° C., within the measurement temperature range. The conductivity of an oxide semiconductor film of a transistor included in the completed semiconductor device or display device is decreased when heat treatment in the above temperature range is performed.

In a manufacturing process of the transistor, heat treatment performed at a temperature higher than or equal to 150° C., preferably higher than or equal to 200° C., further preferably higher than or equal to 250° C., after oxygen plasma treatment is performed on the silicon oxynitride film can supply oxygen to the oxide semiconductor film. The heat treatment is preferably performed at a temperature lower than or equal to 450° C. because when heat treatment is performed at a temperature higher than 450° C., depending on the atmosphere, oxygen in the oxide semiconductor film is bonded to hydrogen and is released as water. Furthermore, in the case where a film containing a metal material is formed, the film absorbs oxygen in the oxide semiconductor film; thus, also in such a case, the upper temperature limit of the heat treatment is set as appropriate.

The insulating film 110 may have, instead of the single-layer structure of the silicon oxynitride film, a stacked-layer structure of two layers or three or more layers of insulating layers formed by a plasma-enhanced chemical vapor deposition method, a sputtering method, or the like. The insulating layers include one or more of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The insulating film 110 that is in contact with the oxide semiconductor film 108 functioning as a channel region of the transistor 100 is preferably an oxide insulating film and preferably includes a region containing oxygen in excess of the stoichiometric composition (oxygen-excess region). In other words, the insulating film 110 is an insulating film capable of releasing oxygen. In order to provide the oxygen-excess region in the insulating film 110, the insulating film 110 is formed in an oxygen atmosphere, or the deposited insulating film 110 is subjected to heat treatment in an oxygen atmosphere, for example.

In the case of using a stacked-layer structure containing hafnium oxide for the insulating film 110, the following effects are attained. Hafnium oxide has higher dielectric constant than silicon oxide and silicon oxynitride. Therefore, by using hafnium oxide, the thickness of the insulating film 110 can be made large as compared with the case of using silicon oxide; thus, leakage current due to tunnel current can be low. That is, it is possible to provide a transistor with a low off-state current. Moreover, hafnium oxide having a crystal structure has a higher dielectric constant than hafnium oxide having an amorphous structure. Therefore, it is preferable to use hafnium oxide having a crystal structure, in order to obtain a transistor with a low off-state current. Examples of the crystal structure include a monoclinic crystal structure and a cubic crystal structure. Note that one embodiment of the present invention is not limited to the above examples.

It is preferable that the insulating film 110 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating film 110, a silicon oxide film or a silicon oxynitride film whose spin density of a signal due to the E' center is lower than or equal to $3 \times 10^{17}$ spins/cm$^3$ and preferably lower than or equal to $5 \times 10^{16}$ spins/cm$^3$ may be used.

In addition to the above-described signal, a signal due to nitrogen dioxide (NO$_2$) might be observed in the insulating film 110. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide (NO$_2$) is higher than or equal to $1 \times 10^{17}$ spins/cm$^3$ and lower than $1 \times 10^{18}$ spins/cm$^3$ as the insulating film 110, for example.

Note that a nitrogen oxide (NO$_x$) such as nitrogen dioxide (NO$_2$) forms a state in the insulating film 110. The state is positioned in the energy gap of the oxide semiconductor film 108. Thus, when nitrogen oxide (NO$_x$) is diffused to the interface between the insulating film 110 and the oxide semiconductor film 108, an electron might be trapped by the state on the insulating film 110 side. As a result, the trapped electron remains in the vicinity of the interface between the insulating film 110 and the oxide semiconductor film 108, leading to a positive shift of the threshold voltage of the transistor. Accordingly, the use of a film with a low nitrogen oxide content as the insulating film 110 can reduce a shift of the threshold voltage of the transistor.

As an insulating film that releases a small amount of nitrogen oxide (NO$_x$), for example, a silicon oxynitride film can be used. The silicon oxynitride film releases more ammonia than nitrogen oxide (NO$_x$) in TDS analysis; the typical released amount of ammonia is greater than or equal to $1 \times 10^{18}$ molecules/cm$^3$ and less than or equal to $5 \times 10^{19}$ molecules/cm$^3$. Note that the released amount of ammonia is the total amount of ammonia released by heat treatment in a range of 50° C. to 650° C. or 50° C. to 550° C. in TDS analysis.

Since nitrogen oxide (NO$_x$) reacts with ammonia and oxygen in heat treatment, the use of an insulating film that releases a large amount of ammonia reduces nitrogen oxide (NO$_x$).

Note that in the case where the insulating film 110 is analyzed by SIMS, the nitrogen concentration in the film is preferably lower than or equal to $6 \times 10^{20}$ atoms/cm$^3$.

[Oxide Semiconductor Film]

The oxide semiconductor film 108 can be formed using the materials described above.

In the case where the oxide semiconductor film 108 includes In—M—Zn oxide, it is preferable that the atomic ratio of metal elements of a sputtering target used for forming the In—M—Zn oxide satisfy In>M. The atomic ratio of metal elements in such a sputtering target is, for example, In:M:Zn=2:1:3, In:M:Zn=3:1:2, or In:M:Zn=4:2:4.1.

In the case where the oxide semiconductor film 108 is formed of In—M—Zn oxide, it is preferable to use a target including polycrystalline In—M—Zn oxide as the sputtering target. The use of the target including polycrystalline In—M—Zn oxide facilitates formation of the oxide semiconductor film 108 having crystallinity. Note that the atomic ratio of metal elements in the formed oxide semiconductor film 108 varies from the above atomic ratios of metal elements of the sputtering targets in a range of ±40%. For example, when a sputtering target with an atomic ratio of In to Ga and Zn of 4:2:4.1 is used, the atomic ratio of In to Ga and Zn in the formed oxide semiconductor film 108 may be 4:2:3 or in the vicinity of 4:2:3.

The energy gap of the oxide semiconductor film 108 is 2 eV or more, preferably 2.5 eV or more. With the use of an oxide semiconductor having such a wide energy gap, the off-state current of the transistor 100 can be reduced.

The thickness of the oxide semiconductor film 108 is greater than or equal to 3 nm and less than or equal to 200 nm, preferably greater than or equal to 3 nm and less than or equal to 100 nm, further preferably greater than or equal to 3 nm and less than or equal to 50 nm.

Furthermore, the oxide semiconductor film 108 may have a non-single-crystal structure. Examples of the non-single-crystal structure include a c-axis-aligned crystalline oxide semiconductor (CAAC-OS) which will be described later, a polycrystalline structure, a microcrystalline structure, and an amorphous structure.

[Third Insulating Film]

The insulating film 116 contains nitrogen or hydrogen. A nitride insulating film can be used as the insulating film 116, for example. Specifically, a film containing silicon nitride, silicon nitride oxide, silicon oxynitride, or the like can be used as the nitride insulating film. The hydrogen concentration in the insulating film 116 is preferably higher than or equal to $1\times10^{22}$ atoms/cm$^3$. The insulating film 116 is in contact with the second region 108n of the oxide semiconductor film 108. Thus, the concentration of an impurity (nitrogen or hydrogen) in the second region 108n in contact with the insulating film 116 is increased, leading to an increase in the carrier density of the second region 108n.

[Fourth Insulating Film]

As the insulating film 118, an oxide insulating film can be used. Alternatively, a layered film of an oxide insulating film and a nitride insulating film can be used as the insulating film 118. The insulating film 118 can be formed using, for example, silicon oxide, silicon oxynitride, silicon nitride oxide, aluminum oxide, hafnium oxide, gallium oxide, or Ga—Zn oxide.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

<1-3. Structure Example 2 of Transistor>

Next, a structure of a transistor different from that in FIGS. 1A to 1C will be described with reference to FIGS. 2A to 2C.

FIG. 2A is a top view of the transistor 100A. FIG. 2B is a cross-sectional view taken along a dashed-dotted line X1-X2 in FIG. 2A. FIG. 2C is a cross-sectional view taken along a dashed-dotted line Y1-Y2 in FIG. 2A.

The transistor 100A illustrated in FIGS. 2A to 2C includes the conductive film 106 over the substrate 102; the insulating film 104 over the conductive film 106; the oxide semiconductor film 108 over the insulating film 104; the insulating film 110 over the oxide semiconductor film 108; the conductive film 112 over the insulating film 110; and the insulating film 116 over the insulating film 104, the oxide semiconductor film 108, and the conductive film 112.

The transistor 100A includes the conductive film 106 and an opening 143 in addition to the components of the transistor 100 described above.

Note that the opening 143 is provided in the insulating films 104 and 110. The conductive film 106 is electrically connected to the conductive film 112 through the opening 143. Thus, the same potential is applied to the conductive film 106 and the conductive film 112. Note that different potentials may be applied to the conductive film 106 and the conductive film 112 without providing the opening 143. Alternatively, the conductive film 106 may be used as a light-blocking film without providing the opening 143. When the conductive film 106 is formed using a light-blocking material, for example, light irradiating the first region 108i from the bottom can be reduced.

In the case of the structure of the transistor 100A, the conductive film 106 functions as a first gate electrode (also referred to as a bottom-gate electrode), the conductive film 112 functions as a second gate electrode (also referred to as a top-gate electrode), the insulating film 104 functions as a first gate insulating film, and the insulating film 110 functions as a second gate insulating film.

The conductive film 106 can be formed using a material similar to the above-described materials of the conductive films 112, 120a, and 120b. It is particularly suitable to use a material containing copper as the conductive film 106 because the electric resistance can be reduced. It is favorable that, for example, each of the conductive films 106, 120a, and 120b has a stacked-layer structure in which a copper film is over a titanium nitride film, a tantalum nitride film, or a tungsten film. In that case, by using the transistor 100A as a pixel transistor and/or a driving transistor of a display device, parasitic capacitance generated between the conductive films 106 and 120a and between the conductive films 106 and 120b can be reduced. Thus, the conductive films 106, 120a, and 120b can be used not only as the first gate electrode, the source electrode, and the drain electrode of the transistor 100A, but also as power source supply wirings, signal supply wirings, connection wirings, or the like of the display device.

In this manner, unlike the transistor 100 described above, the transistor 100A in FIGS. 2A to 2C has a structure in which a conductive film functioning as a gate electrode is provided over and under the oxide semiconductor film 108. As in the transistor 100A, a semiconductor device of one embodiment of the present invention may have a plurality of gate electrodes.

As illustrated in FIGS. 2B and 2C, the oxide semiconductor film 108 faces the conductive film 106 functioning as a first gate electrode and the conductive film 112 functioning as a second gate electrode and is positioned between the two conductive films functioning as the gate electrodes.

Furthermore, the length of the conductive film 112 in the channel width direction is larger than the length of the oxide semiconductor film 108 in the channel width direction. In the channel width direction, the whole oxide semiconductor film 108 is covered with the conductive film 112 with the insulating film 110 placed therebetween. Since the conductive film 112 is connected to the conductive film 106 through the opening 143 provided in the insulating films 104 and 110, a side surface of the oxide semiconductor film 108 in the channel width direction faces the conductive film 112 with the insulating film 110 placed therebetween.

In other words, the conductive film 106 and the conductive film 112 are connected through the opening 143 provided in the insulating films 104 and 110, and each include a region positioned outside an edge portion of the oxide semiconductor film 108.

Such a structure enables the oxide semiconductor film 108 included in the transistor 100A to be electrically surrounded by electric fields of the conductive film 106 functioning as a first gate electrode and the conductive film 112 functioning as a second gate electrode. A device structure of a transistor, like that of the transistor 100A, in which electric fields of the first gate electrode and the second gate electrode electrically surround the oxide semiconductor film 108 in which a channel region is formed can be referred to as a surrounded channel (S-channel) structure.

Since the transistor 100A has the S-channel structure, an electric field for inducing a channel can be effectively applied to the oxide semiconductor film 108 by the conductive film 106 or the conductive film 112; thus, the current drive capability of the transistor 100A can be improved and high on-state current characteristics can be obtained. As a result of the high on-state current, it is possible to reduce the size of the transistor 100A. Furthermore, since the transistor 100A has a structure in which the oxide semiconductor film 108 is surrounded by the conductive film 106 and the conductive film 112, the mechanical strength of the transistor 100A can be increased.

When seen in the channel width direction of the transistor 100A, an opening different from the opening 143 may be formed on the side of the oxide semiconductor film 108 on which the opening 143 is not formed.

When a transistor has a pair of gate electrodes between which a semiconductor film is positioned as in the transistor 100A, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential $V_b$ is, for example, a potential for controlling a threshold voltage $V_{thA}$ of the transistor. The fixed potential $V_b$ may be the potential V1 or the potential V2. In that case, a potential generator circuit for generating the fixed potential $V_b$ is not necessary, which is preferable. The fixed potential $V_b$ may be different from the potential V1 or the potential V2. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. Meanwhile, a high fixed potential $V_b$ can lower the threshold voltage $V_{thA}$ in some cases. As a result, the drain current flowing when the gate-source voltage $V_{gs}$ is a high power supply potential and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, if a gate insulating film for the gate to which the signal B is input is thicker than a gate insulating film for the gate to which the signal A is input, the potential amplitude of the signal B (V3–V4) may be larger than the potential amplitude of the signal A (V1–V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not changed as frequently as the potential of the signal A in some cases.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

The other components of the transistor 100A are similar to those of the transistor 100 described above and have similar effects.

Figure 3A:
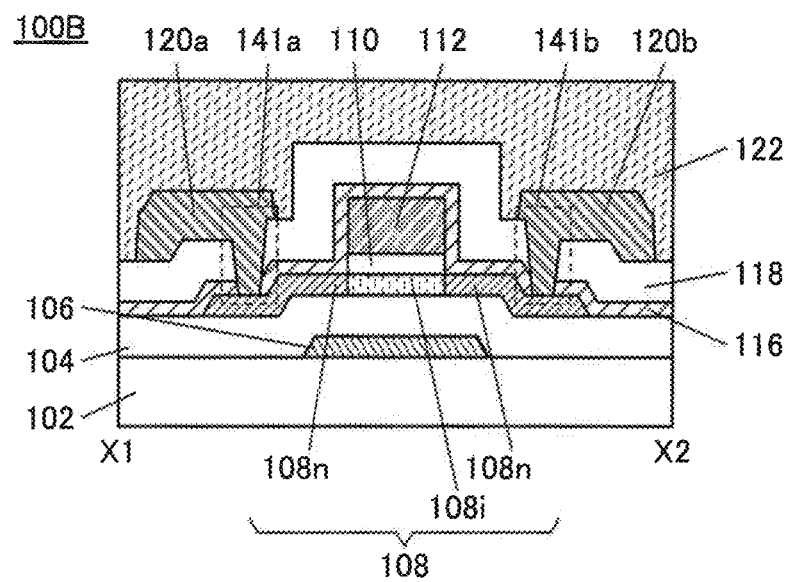
FIGS. 3A and 3B are cross-sectional views illustrating a semiconductor device.
Figure 3B:
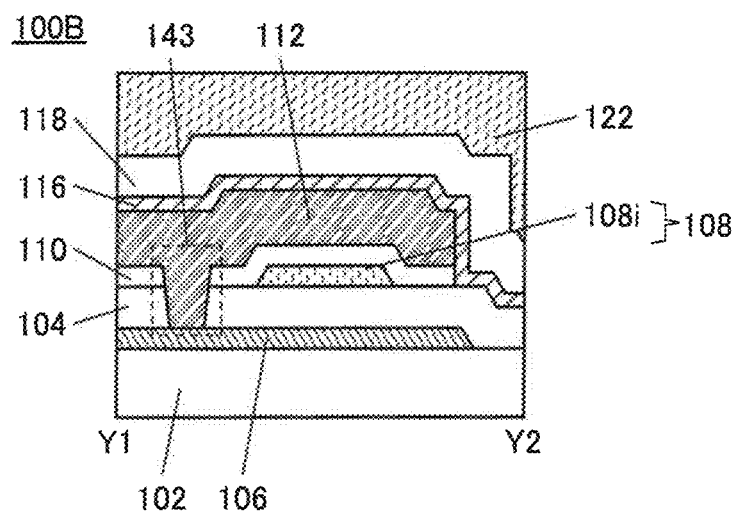

An insulating film may further be formed over the transistor 100A. An example of such a case is illustrated in FIGS. 3A and 3B. FIGS. 3A and 3B are cross-sectional views of a transistor 100B. The top view of the transistor 100B is not illustrated because it is similar to that of the transistor 100A in FIG. 2A.

The transistor 100B illustrated in FIGS. 3A and 3B includes an insulating film 122 over the conductive films 120a and 120b and the insulating film 118. The other components of the transistor 100B are similar to those of the transistor 100A and have similar effects.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

<1-4. Structure Example 3 of Transistor>

Next, a structure of a transistor different from that of the transistor 100A in FIGS. 2A to 3C will be described with reference to FIGS. 4A and 4B.

Figure 4A:
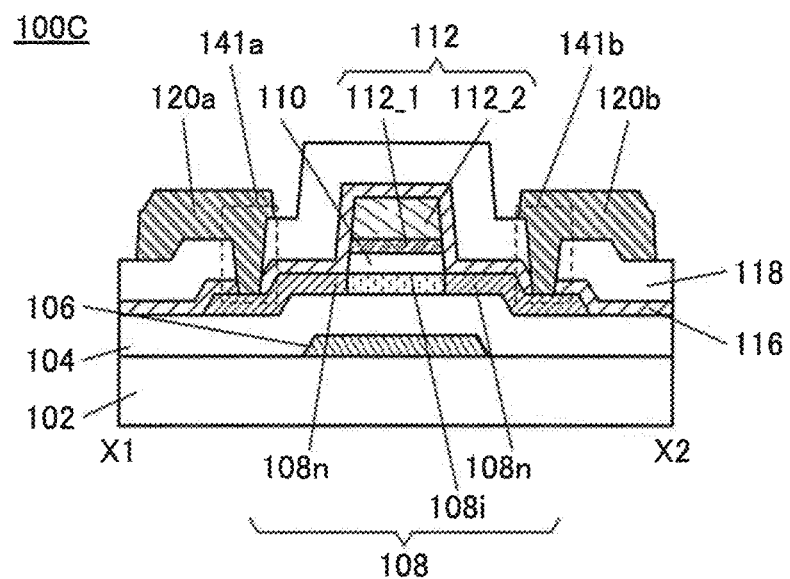
FIGS. 4A and 4B are cross-sectional views illustrating a semiconductor device.
Figure 4B:
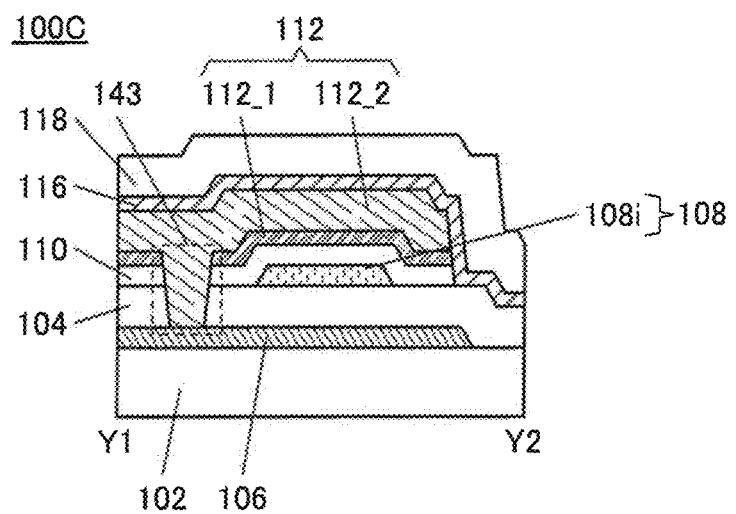

FIGS. 4A and 4B are cross-sectional views of a transistor 100C. The top view of the transistor 100C is not illustrated because it is similar to that of the transistor 100A in FIG. 2A.

The transistor 100C illustrated in FIGS. 4A and 4B is different from the transistor 100A in the stacked-layer structure of the conductive film 112, the shape of the conductive film 112, and the shape of the insulating film 110.

The conductive film 112 in the transistor 100C includes a conductive film 112_1 over the insulating film 110 and the conductive film 112_2 over the conductive film 112_1. For example, an oxide conductive film is used as the conductive film 112_1, so that excess oxygen can be added to the insulating film 110. The oxide conductive film can be formed by a sputtering method in an atmosphere containing an oxygen gas. As the oxide conductive film, an oxide including indium and tin, an oxide including tungsten and indium, an oxide including tungsten, indium, and zinc, an oxide including titanium and indium, an oxide including titanium, indium, and tin, an oxide including indium and zinc, an oxide including silicon, indium, and tin, an oxide including indium, gallium, and zinc, or the like can be used, for example.

As illustrated in FIG. 4B, the conductive film 1122 is connected to the conductive film 106 through the opening 143. By forming the opening 143 after a conductive film to be the conductive film 112_1 is formed, the shape illustrated in FIG. 4B can be obtained. In the case where an oxide conductive film is used as the conductive film 112_1, the structure in which the conductive film 112_2 is connected to the conductive film 106 can decrease the contact resistance between the conductive film 112 and the conductive film 106.

The conductive film 112 and the insulating film 110 in the transistor 100C have a tapered shape. More specifically, the lower edge portion of the conductive film 112 is positioned outside the upper edge portion of the conductive film 112. The lower edge portion of the insulating film 110 is positioned outside the upper edge portion of the insulating film 110. In addition, the lower edge portion of the conductive film 112 is formed in substantially the same position as that of the upper edge portion of the insulating film 110.

As compared with the transistor 100A in which the conductive film 112 and the insulating film 110 have a rectangular shape, the transistor 100C in which the conductive film 112 and the insulating film 110 have a tapered shape is favorable because of better coverage with the insulating film 116.

The other components of the transistor 100C are similar to those of the transistor 100A described above and have similar effects.

<1-5. Manufacturing Method of Semiconductor Device>

Next, an example of a method for manufacturing the transistor 100A illustrated in FIGS. 2A to 2C is described with reference to FIGS. 5A to 5D, FIGS. 6A to 6C, and FIGS. 7A to 7C. Note that FIGS. 5A to 5D, FIGS. 6A to 6C, and FIGS. 7A to 7C are cross-sectional views in the channel length (L) direction and the channel width (W) direction, illustrating the method for manufacturing the transistor 100A.

First, the conductive film 106 is formed over the substrate 102. Then, the insulating film 104 is formed over the substrate 102 and the conductive film 106, and an island-shaped oxide semiconductor film 108i_0 is formed over the insulating film 104 (see FIG. 5A).

The conductive film 106 can be formed using a material selected from the above-mentioned materials. In this embodiment, as the conductive film 106, a layered film of a 50-nm-thick tungsten film and a 400-nm-thick copper film is formed with a sputtering apparatus.

To process the conductive film to be the conductive film 106, a wet etching method and/or a dry etching method can be used. In this embodiment, in the processing of the conductive film into the conductive film 106, the copper film is etched by a wet etching method and then the tungsten film is etched by a dry etching method.

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with a plasma CVD apparatus.

After the insulating film 104 is formed, oxygen may be added to the insulating film 104. As oxygen added to the insulating film 104, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 104, and then, oxygen may be added to the insulating film 104 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating film 104 can be increased.

The island-shaped oxide semiconductor film 108i_0 can have a single-layer structure, for example. It is preferable that the oxide semiconductor film 108i_0 have a stacked-layer structure of a first oxide semiconductor film and a second oxide semiconductor film. In the case where the oxide semiconductor film 108i_0 has a stacked-layer structure, either or both of the substrate temperature and the percentage of oxygen flow rate in forming the first oxide semiconductor film are preferably lower than those in forming the second oxide semiconductor film.

Specifically, the conditions for forming the first oxide semiconductor film are set as follows: the substrate temperature is higher than or equal to room temperature and lower than 150° C., preferably higher than or equal to 100° C. and lower than or equal to 140° C., and the percentage of oxygen flow rate is higher than 0% and lower than 30%. Furthermore, the conditions for forming the second oxide semiconductor film are set as follows: the substrate temperature is higher than or equal to 150° C. and lower than or equal to 350° C., preferably higher than or equal to 160° C. and lower than or equal to 200° C., and the percentage of oxygen flow rate is higher than or equal to 30% and lower than or equal to 100%.

Under the above-described conditions, the oxide semiconductor films having different carrier densities can be stacked. Note that it is more favorable to successively form the first oxide semiconductor film and the second oxide semiconductor film in vacuum because impurities can be prevented from being caught at the interfaces.

When the oxide semiconductor film 108i_0 is formed while being heated, the crystallinity of the oxide semiconductor film 108 can be increased. However, in the case where a large-sized glass substrate (e.g., the 6th generation to the 10th generation) is used as the substrate 102 and the oxide semiconductor film 108 is formed at a substrate temperature higher than or equal to 200° C. and lower than or equal to 300° C., the substrate 102 might be changed in shape (distorted or warped). In the case where a large-sized glass substrate is used, the change in the shape of the glass substrate can be suppressed by forming the oxide semiconductor film 108 at a substrate temperature higher than or equal to 100° C. and lower than 200° C.

In addition, increasing the purity of a sputtering gas is necessary. For example, as an oxygen gas or an argon gas used as a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be minimized.

In the case where the oxide semiconductor film is deposited by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film, as much as possible. In particular, the partial pressure of gas molecules corresponding to $H_2O$ (gas molecules corresponding to M/z=18) in the chamber in the standby mode of the sputtering apparatus is preferably lower than or equal to $1\times10^{-4}$ Pa, further preferably lower than or equal to $5\times10^{-5}$ Pa.

In addition, the first oxide semiconductor film is formed by a sputtering method using an In—Ga—Zn oxide semiconductor target (In:Ga:Zn=4:2:4.1 in an atomic ratio). The substrate temperature during the formation of the first oxide semiconductor film is 130° C., and oxygen gas at a flow rate of 20 sccm and argon gas at a flow rate of 180 sccm are used as a deposition gas (percentage of oxygen flow rate: 10%).

The second oxide semiconductor film is formed by a sputtering method using an In—Ga—Zn oxide semiconductor target (In:Ga:Zn=4:2:4.1 in an atomic ratio). The substrate temperature during the formation of the second oxide semiconductor film is 170° C., and oxygen gas at a flow rate of 60 sccm and argon gas at a flow rate of 140 sccm are used as a deposition gas (percentage of oxygen flow rate: 30%).

Note that although the stacked structure of the oxide semiconductor films having different carrier densities was formed by changing the substrate temperature and the percentage of oxygen flow rate between the first oxide semiconductor film and the second oxide semiconductor film in the above-described example, the method for forming the structure is not limited to this example. For example, an impurity element may be added in formation of the first oxide semiconductor film to make the carrier density of the first oxide semiconductor film different from that of the second oxide semiconductor film. Examples of the impurity element include hydrogen, boron, carbon, nitrogen, fluorine, phosphorus, sulfur, chlorine, and a rare gas element.

Among the above-described elements, nitrogen is particularly preferable as the impurity element added to the first oxide semiconductor film. For example, nitrogen can be added to the first oxide semiconductor film by using argon gas and nitrogen gas as a deposition gas or using argon gas and dinitrogen monoxide as a deposition gas in forming the first oxide semiconductor film.

In the case where an impurity element is used to form the first oxide semiconductor film, it is favorable to independently provide a chamber for forming the first oxide semiconductor film in order to prevent the impurity element from entering a film into which the impurity element is preferably not added, e.g., the second oxide semiconductor film.

After the first oxide semiconductor film is formed, an impurity element may be added to the first oxide semiconductor film. As a method for adding an impurity element after formation of the first oxide semiconductor film, doping treatment or plasma treatment can be used, for example.

After the first oxide semiconductor film and the second oxide semiconductor film are formed, the first oxide semiconductor film and the second oxide semiconductor film may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Alternatively, the heat treatment may be performed in an inert gas atmosphere first, and then, in an oxygen atmosphere. It is preferable that the above inert gas atmosphere and the above oxygen atmosphere do not contain hydrogen, water, and the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the oxide semiconductor film while it is heated or by performing heat treatment after the formation of the oxide semiconductor film, the hydrogen concentration in the oxide semiconductor film, which is measured by SIMS, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

Figure 5A:
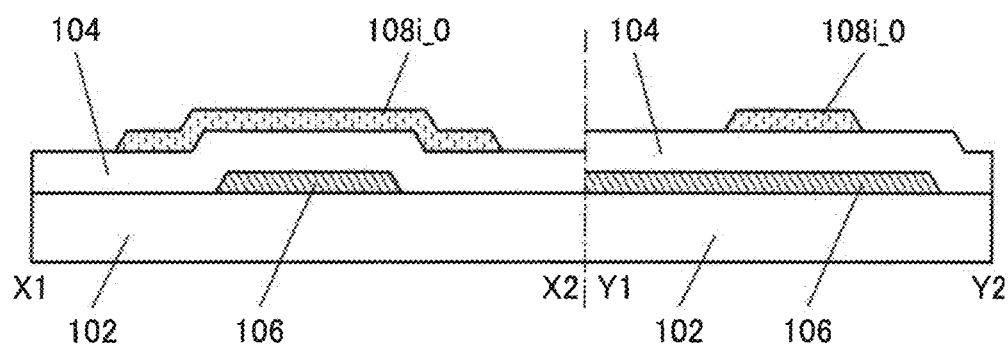
FIGS. 5A to 5D are cross-sectional views illustrating a method for manufacturing a semiconductor device.
Figure 5B:
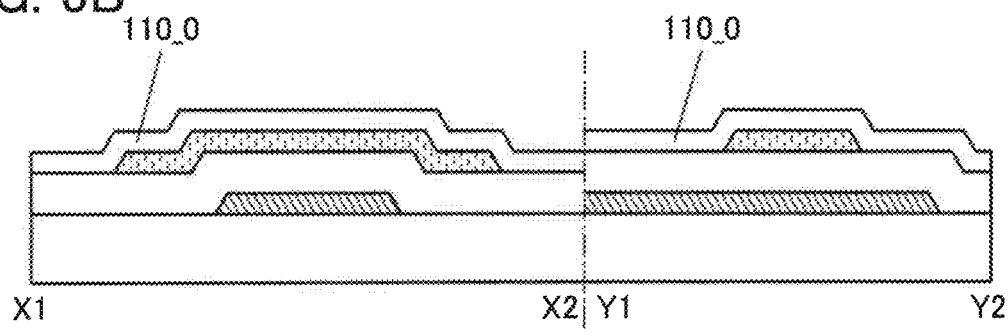

Next, an insulating film 110_0 is formed over the insulating film 104 and the oxide semiconductor film (see FIG. 5B).

As the insulating film 110_0, a silicon oxide film or a silicon oxynitride film can be formed with a plasma-enhanced chemical vapor deposition apparatus (a PECVD apparatus or simply referred to as a plasma CVD apparatus). In this case, a deposition gas containing silicon and an oxidizing gas are preferably used as a source gas. Typical examples of the deposition gas containing silicon include silane, disilane, trisilane, and silane fluoride. As examples of the oxidizing gas, oxygen, ozone, dinitrogen monoxide, and nitrogen dioxide can be given.

A silicon oxynitride film having few defects can be formed as the insulating film 110_0 with a plasma CVD apparatus under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa, or lower than or equal to 50 Pa.

As the insulating film 110_0, a dense silicon oxide film or a dense silicon oxynitride film can be formed under the following conditions: the substrate placed in a vacuum-evacuated treatment chamber of a plasma CVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating film 110_0 may be formed by a plasma CVD method using a microwave. A microwave refers to a wave in the frequency range of 300 MHz to 300 GHz. In a microwave, electron temperature and electron energy are low. Furthermore, in supplied power, the proportion of power used for acceleration of electrons is low, and therefore, much more power can be used for dissociation and ionization of molecules. Thus, plasma with a high density (high-density plasma) can be excited. This method causes little plasma damage to the deposition surface or a deposit, so that the insulating film 110_0 having few defects can be formed.

Alternatively, the insulating film 110_0 can also be formed by a CVD method using an organosilane gas. As the organosilane gas, the following silicon-containing compound can be used: tetraethyl orthosilicate (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like. By a CVD method using an organosilane gas, the insulating film 110_0 having high coverage can be formed.

In this embodiment, as the insulating film 110_0, a 100-nm-thick silicon oxynitride film is formed with a plasma CVD apparatus.

Figure 5C:
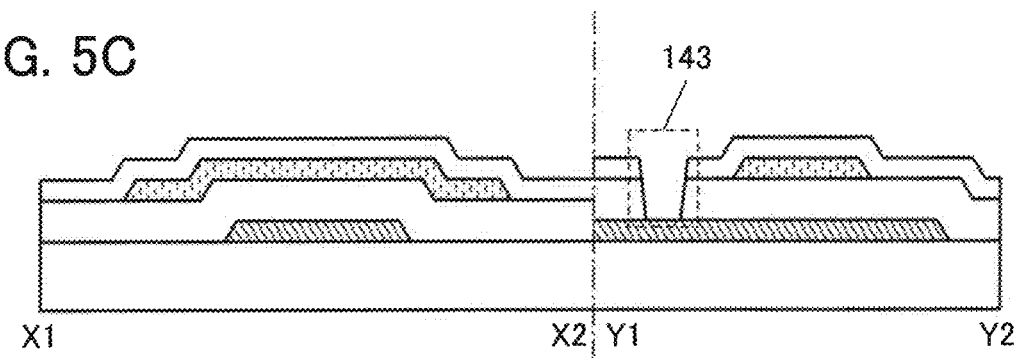

Subsequently, a mask is formed by lithography in a desired position over the insulating film 110_0, and then, the insulating film 110_0 and the insulating film 104 are partly etched, so that the opening 143 reaching the conductive film 106 is formed (see FIG. 5C).

To form the opening 143, a wet etching method and/or a dry etching method can be used. In this embodiment, the opening 143 is formed by a dry etching method.

Next, a conductive film 112_0 is formed over the conductive film 106 and the insulating film 110_0 so as to cover the opening 143. In the case where a metal oxide film is used as the conductive film 112_0, for example, oxygen might be added from the conductive film 112_0 to the insulating film 110_0 during the formation of the conductive film 112_0 (see FIG. 5D).

Figure 5D:
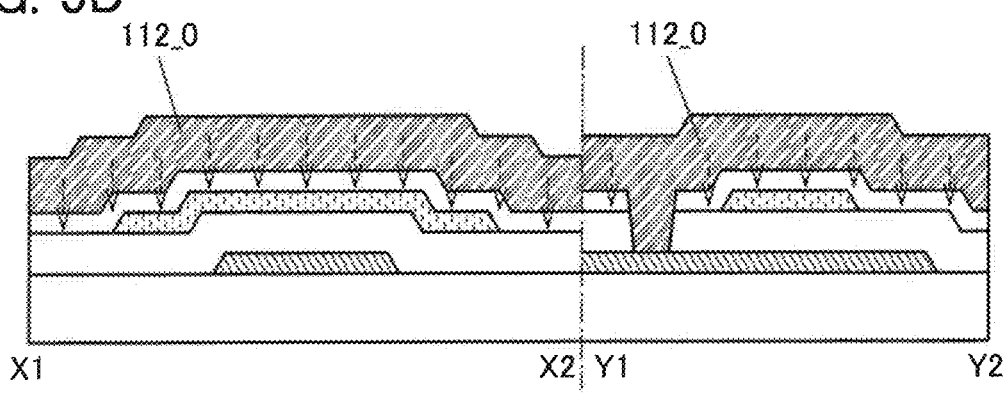

In FIG. 5D, oxygen added to the insulating film 110_0 is schematically shown by arrows. Furthermore, the conductive film 112_0 formed to cover the opening 143 is electrically connected to the conductive film 106.

In the case where a metal oxide film is used as the conductive film 1120, the conductive film 112_0 is preferably formed by a sputtering method in an atmosphere containing an oxygen gas. Formation of the conductive film 112_0 in an atmosphere containing an oxygen gas allows suitable addition of oxygen to the insulating film 110_0. Note that a method for forming the conductive film 112_0 is not limited to a sputtering method, and other methods such as an atomic layer deposition (ALD) method may be used.

In this embodiment, a 100-nm-thick IGZO film containing an In—Ga—Zn oxide (In:Ga:Zn=4:2:4.1 [atomic ratio]) is formed as the conductive film 112_0 by a sputtering method. Note that oxygen addition treatment may be performed on the insulating film 110_0 before or after the formation of the conductive film 112_0. The oxygen addition treatment can be performed in a manner similar to that of the oxygen addition that can be performed after the formation of the insulating film 104.

Figure 6A:
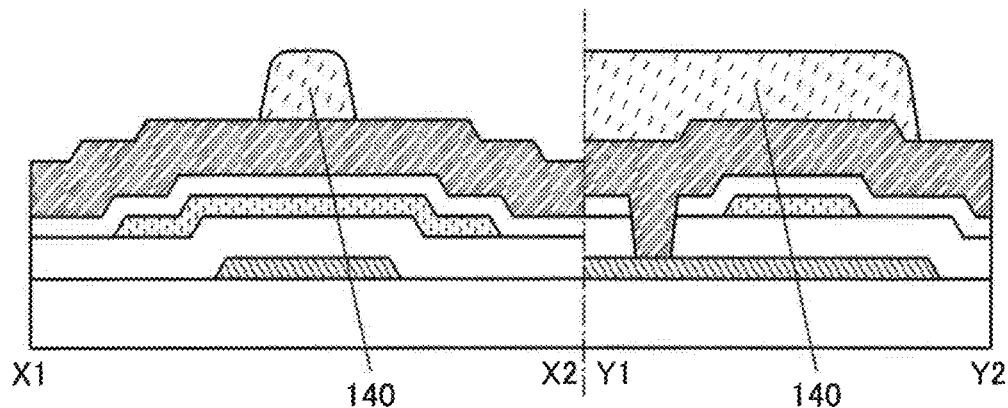
FIGS. 6A to 6C are cross-sectional views illustrating a method for manufacturing a semiconductor device.
Figure 6B:
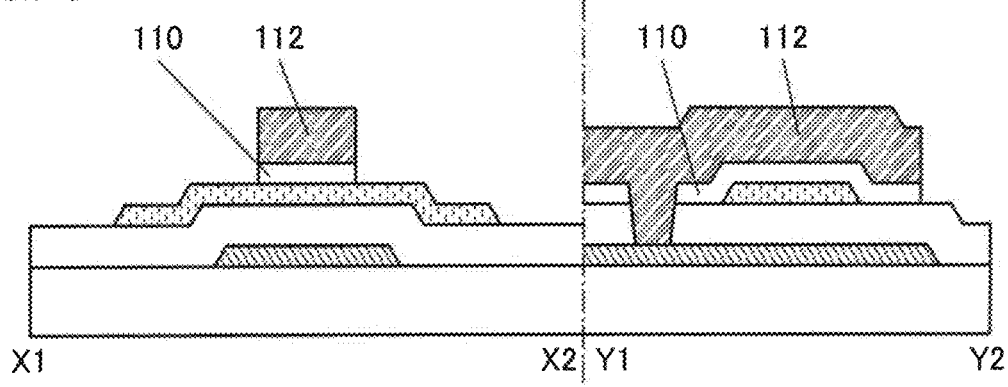
Figure 6C:
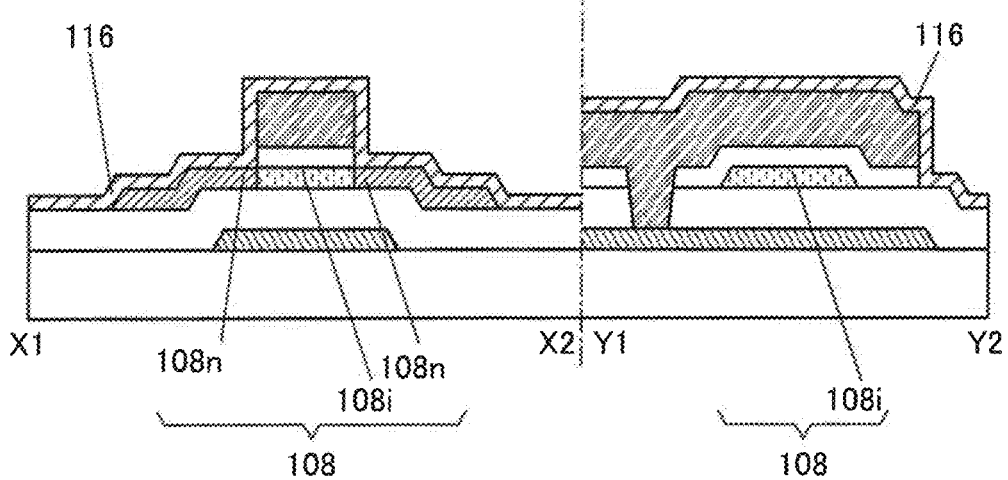

Subsequently, a mask 140 is formed by a lithography process in a desired position over the conductive film 112_0 (see FIG. 6A).

Next, etching is performed from above the mask 140 to process the conductive film 112_0 and the insulating film 110_0. After the processing of the conductive film 112_0 and the insulating film 110_0, the mask 140 is removed. As a result of the processing of the conductive film 112_0 and the insulating film 110_0, the island-shaped conductive film 112 and the island-shaped insulating film 110 are formed (see FIG. 6B).

In this embodiment, the conductive film 112_0 and the insulating film 110_0 are processed by a dry etching method.

In the processing into the conductive film 112 and the insulating film 110, the thickness of the oxide semiconductor film in a region not overlapping with the conductive film 112 is decreased in some cases. In other cases, in the processing into the conductive film 112 and the insulating film 110, the thickness of the insulating film 104 in a region not overlapping with the oxide semiconductor film is decreased. In the processing of the conductive film 112_0 and the insulating film 110_0, an etchant or an etching gas (e.g., chlorine) might be added to the oxide semiconductor film or the constituent element of the conductive film 112_0 or the insulating film 110_0 might be added to the oxide semiconductor film.

Next, the insulating film 116 is formed over the insulating film 104, the oxide semiconductor film, and the conductive film 112, whereby part of the oxide semiconductor film, which is in contact with the insulating film 116 becomes the second region 108n. Furthermore, part of the oxide semiconductor film, which is in contact with the insulating film 110 becomes the first region 108i. Accordingly, the oxide semiconductor film 108 including the first region 108i and the second region 108n is formed (see FIG. 6C).

The insulating film 116 can be formed using a material selected from the above-mentioned materials. In this embodiment, as the insulating film 116, a 100-nm-thick silicon nitride oxide film is formed with a plasma CVD apparatus. In the formation of the silicon nitride oxide film, plasma treatment and deposition treatment are performed at 220° C. The plasma treatment is performed before deposition under the following conditions: an argon gas at a flow rate of 100 sccm is introduced into a chamber, the pressure in the chamber is set to 40 Pa, and power of 1000 W is supplied to an RF power source (27.12 MHz). The deposition treatment is performed under the following conditions: a silane gas at a flow rate of 50 sccm, a nitrogen gas at a flow rate of 5000 sccm, and an ammonia gas at a flow rate of 100 sccm are introduced into the chamber; the pressure in the chamber is set to 100 Pa; and power of 1000 W is supplied to the RF power source (27.12 MHz).

When the insulating film 116 includes a silicon nitride oxide film, nitrogen or hydrogen in the silicon nitride oxide film can be supplied to the second region 108n in contact with the insulating film 116. Moreover, when the temperature in forming the insulating film 116 is the above-mentioned temperature, release of excess oxygen contained in the insulating film 110 to the outside can be suppressed.

Figure 7A:
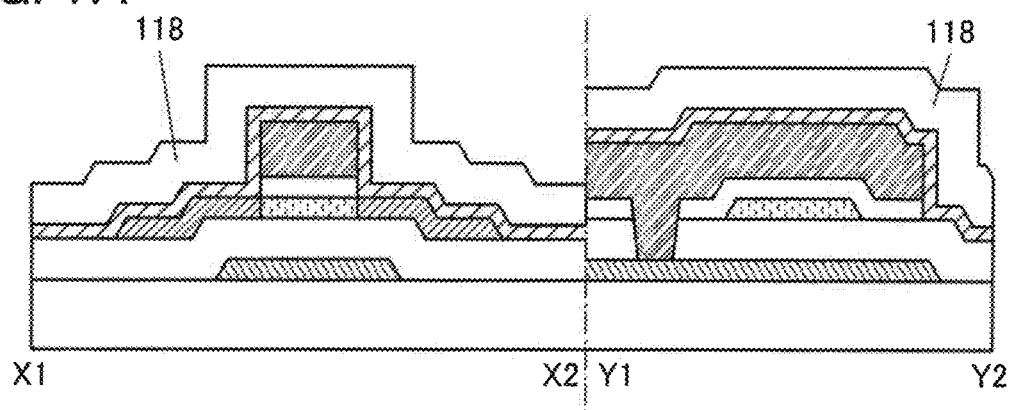
FIGS. 7A to 7C are cross-sectional views illustrating a method for manufacturing a semiconductor device.
Figure 7B:
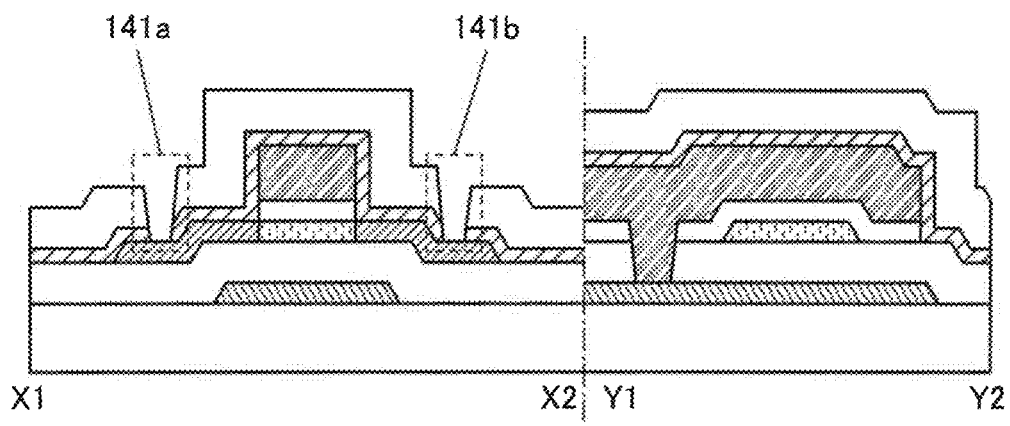

Next, the insulating film 118 is formed over the insulating film 116 (see FIG. 7A).

The insulating film 118 can be formed using a material selected from the above-mentioned materials. In this embodiment, as the insulating film 118, a 300-nm-thick silicon oxynitride film is formed with a plasma CVD apparatus.

Then, a mask is formed over desired positions of the insulating film 118 by lithography, and the insulating film 118 and the insulating film 116 are partly etched. Thus, the openings 141a and 141b reaching the second region 108n are formed (see FIG. 7B).

To etch the insulating films 118 and 116, a wet etching method and/or a dry etching method can be used. In this embodiment, the insulating films 118 and 116 are processed by a dry etching method.

Figure 7C:
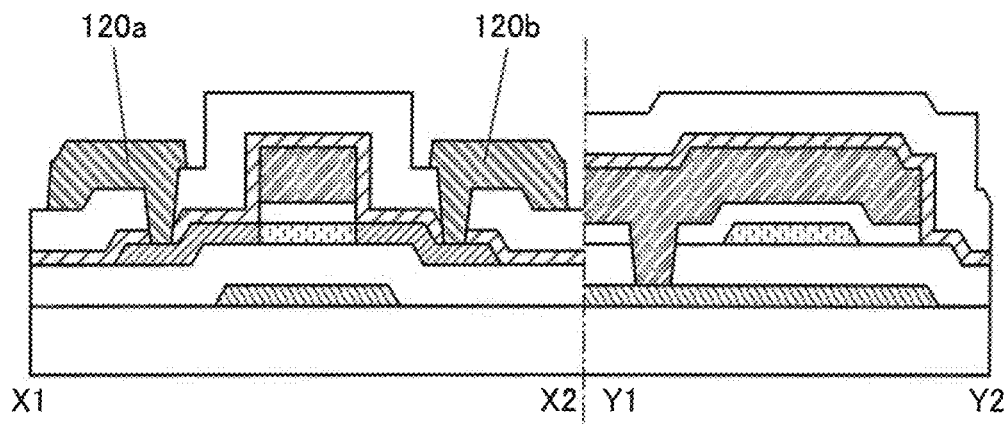

Next, a conductive film is formed over the second region 108n and the insulating film 118 to cover the openings 141a and 141b, and processed into desired shapes, so that the conductive films 120a and 120b are formed (see FIG. 7C).

The conductive films 120a and 120b can be formed using a material selected from the above-mentioned materials. In this embodiment, as the conductive films 120a and 120b, a layered film including a 50-nm-thick tungsten film and a 400-nm-thick copper film is formed with a sputtering apparatus.

To process the conductive film to be the conductive films 120a and 120b, a wet etching method and/or a dry etching method can be used. In this embodiment, in the processing of the conductive film into the conductive films 120a and 120b, the copper film is etched by a wet etching method and then the tungsten film is etched by a dry etching method.

Through the above process, the transistor 100A in FIGS. 2A to 2C can be fabricated.

Note that the films included in the transistor 100A (the insulating film, the metal oxide film, the oxide semiconductor film, the conductive film, and the like) can be formed by, other than the above methods, a sputtering method, a chemical vapor deposition (CVD) method, a vacuum evaporation method, a pulsed laser deposition (PLD) method, or an ALD method. Alternatively, a coating method or a printing method can be used. Although the sputtering method and a plasma-enhanced chemical vapor deposition (PECVD) method are typical examples of the film formation method, a thermal CVD method may be used. As an example of a thermal CVD method, a metal organic chemical vapor deposition (MOCVD) method can be given.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, a thermal CVD method has an advantage that no defect due to plasma damage is caused.

The films such as the conductive films, the insulating films, the oxide semiconductor films, and the metal oxide films that are described above can be formed by a thermal CVD method such as an MOCVD method. For example, in the case where an In—Ga—Zn—O film is formed, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium and diethylzinc ($Zn(C_2H_5)_2$) can be used instead of dimethylzinc.

In the case where a hafnium oxide film is formed with a deposition apparatus employing an ALD method, two kinds of gases are used, namely, ozone ($O_3$) as an oxidizer and a source gas that is obtained by vaporizing liquid containing a solvent and a hafnium precursor (hafnium alkoxide or hafnium amide such as tetrakis(dimethylamide)hafnium (TDMAH, $Hf[N(CH_3)_2]_4$) or tetrakis(ethylmethylamide) hafnium).

In the case where an aluminum oxide film is formed with a deposition apparatus employing an ALD method, two kinds of gases are used, namely, $H_2O$ as an oxidizer and a source gas that is obtained by vaporizing liquid containing a solvent and an aluminum precursor (e.g., trimethylaluminum (TMA, $Al(CH_3)_3$)). Examples of another material include tris(dimethylamide)aluminum, triisobutylaluminum, and aluminum tris(2,2,6,6-tetramethyl-3,5-heptanedionate).

In the case where a silicon oxide film is formed with a deposition apparatus employing an ALD method, hexachlorodisilane is adsorbed on a surface on which a film is to be formed, and radicals of an oxidizing gas ($O_2$ or dinitrogen monoxide) are supplied to react with the adsorbate.

In the case where a tungsten film is formed with a deposition apparatus employing an ALD method, a $WF_6$ gas and a $B_2H_6$ gas are sequentially introduced to form an initial tungsten film, and then, a $WF_6$ gas and an $H_2$ gas are used to form a tungsten film. Note that an $SiH_4$ gas may be used instead of a $B_2H_6$ gas.

In the case where an oxide semiconductor film such as an In—Ga—Zn—O film is formed with a deposition apparatus employing an ALD method, an $In(CH_3)_3$ gas and an $O_3$ gas are used to form an In—O layer, a $Ga(CH_3)_3$ gas and an $O_3$ gas are used to form a Ga—O layer, and then, a $Zn(CH_3)_2$ gas and an $O_3$ gas are used to form a Zn—O layer. Note that the order of these layers is not limited to this example. A mixed compound layer such as an In—Ga—O layer, an In—Zn—O layer, or a Ga—Zn—O layer may be formed by using these gases. Note that although an $H_2O$ gas that is obtained by bubbling water with an inert gas such as Ar may be used instead of an $O_3$ gas, it is preferable to use an $O_3$ gas, which does not contain H.

One embodiment of the present invention is not limited to the example described in this embodiment, in which the transistor includes an oxide semiconductor film. In one embodiment of the present invention, the transistor does not necessarily include an oxide semiconductor film. For example, a channel region, the vicinity of the channel region, a source region, or a drain region of the transistor may be formed using a material containing silicon (Si), germanium (Ge), silicon germanium (SiGe), gallium arsenide (GaAs), or the like.

Note that the structure and method described in this embodiment can be used in appropriate combination with the structure and method described in any of the other embodiments.

Embodiment 2

In this embodiment, a modification example of the transistor described in Embodiment 1 that can be used in one embodiment of the present invention will be described.

Figure 45:
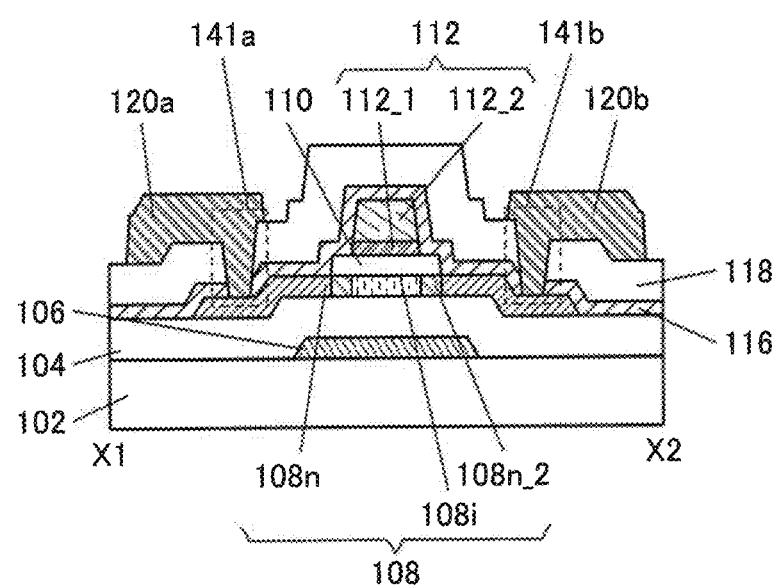
FIG. 45 is a cross-sectional view illustrating a semiconductor device.

In the transistor 100C illustrated in FIGS. 4A and 4B, a region 108n_2 may be provided between the first region 108i and the second region 108n as illustrated in FIG. 45 in such a manner that the conductive film 112 is formed shorter than the insulating film 110 in the channel length direction of the transistor and heat treatment is performed or an impurity element is added by doping treatment or plasma treatment. The conductivity of the region 108n_2 is higher than that of the first region 108i and lower than that of the second region 108n. The region 108n_2 can prevent the intensity of an electric field at an end portion of a drain of the transistor from being increased locally during the operation of a semiconductor device or a display device.

Note that the structure and method described in this embodiment can be used in appropriate combination with the structure and method described in any of the other embodiments.

Embodiment 3

In this embodiment, an oxide semiconductor that can be used in one embodiment of the present invention will be described.
<2-1. Composition of Oxide Semiconductor>
An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor is InMZnO containing indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M, in some cases.
<Structure>
An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in many cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, a lattice arrangement is distorted so that formation of a crystal grain boundary is inhibited. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced by indium, the layer can also be referred to as an (In,M,Zn) layer. When indium of the In layer is replaced by the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.
<Atomic Ratio>
Next, preferred ranges of the atomic ratio of indium, the element M, and zinc contained in an oxide semiconductor according to the present invention will be described with reference to FIGS. 8A to 8C. Note that the proportion of oxygen atoms is not illustrated in FIGS. 8A to 8C. The terms of the atomic ratio of indium, the element M, and zinc contained in the oxide semiconductor are denoted by [In], [M], and [Zn], respectively.

In FIGS. 8A to 8C, broken lines indicate a line where the atomic ratio [In]:[M]:[Zn] is $(1+\alpha):(1-\alpha):1$ ($-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ ($\beta \geq 0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, an oxide semiconductor with the atomic ratio of [In]:[M]:[Zn]=0:2:1 or a neighborhood thereof in FIGS. 8A to 8C tends to have a spinel crystal structure.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

A region A in FIG. 8A represents examples of the preferred ranges of the atomic ratio of indium, the element M, and zinc contained in an oxide semiconductor.

In addition, the oxide semiconductor containing indium in a higher proportion can have high carrier mobility (electron mobility). Thus, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 8C), insulation performance becomes better.

Accordingly, an oxide semiconductor of one embodiment of the present invention preferably has an atomic ratio represented by the region A in FIG. 8A. With the atomic ratio, a stacked-layer structure with high carrier mobility and a few grain boundaries is easily obtained.

An oxide semiconductor with an atomic ratio in the region A, particularly in a region B in FIG. 8B, is excellent because the oxide semiconductor easily becomes a CAAC-OS and has high carrier mobility.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

Note that the property of an oxide semiconductor is not uniquely determined by an atomic ratio. Even with the same atomic ratio, the property of an oxide semiconductor might be different depending on a formation condition. For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition. Thus, the illustrated regions each represent an atomic ratio with which an oxide semiconductor tends to have specific characteristics, and boundaries of the regions A to C are not clear.

[Transistor Including Oxide Semiconductor]

Next, the case where the above-described oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with a low carrier density is preferably used for a channel region of the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$ is used.

A highly purified intrinsic or substantially highly purified intrinsic oxide semiconductor film has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

<Impurities>

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2 \times 10^{18}$ atoms/$cm^3$, and preferably lower than or equal to $2 \times 10^{17}$ atoms/$cm^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1 \times 10^{18}$ atoms/$cm^3$, and preferably lower than or equal to $2 \times 10^{16}$ atoms/$cm^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; for example, the concentration of nitrogen in the oxide semiconductor, which is measured by SIMS, can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration of the oxide semiconductor measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with a sufficiently reduced impurity concentration is used for a channel formation region in a transistor, the transistor can have stable electrical characteristics.

<Band Diagram>

Next, the case where the oxide semiconductor has a two-layer structure or a three-layer structure is described. A band diagram of a stacked-layer structure of an oxide semiconductor S1, an oxide semiconductor S2, and an oxide semiconductor S3 and insulators that are in contact with the stacked-layer structure, a band diagram of a stacked-layer structure of the oxide semiconductors S2 and S3 and insulators that are in contact with the stacked-layer structure, and a band diagram of a stacked-layer structure of the oxide semiconductors S1 and S2 and insulators that are in contact with the stacked-layer structure are described with reference to FIGS. 9A to 9C.

Figure 9A:
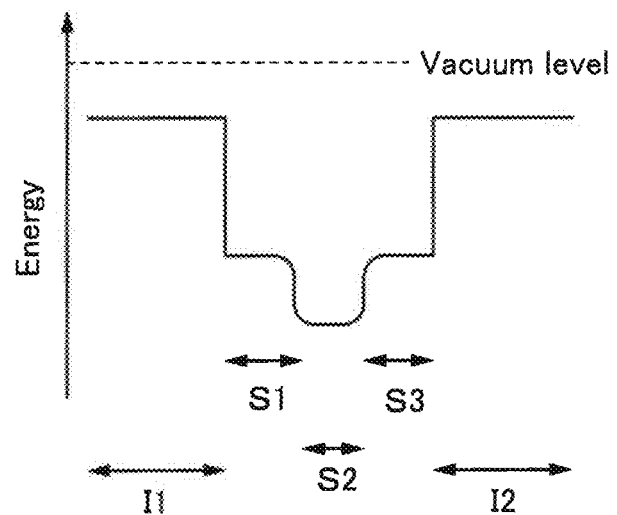
FIGS. 9A to 9C are band diagrams of stacked-layer structures of oxide semiconductors.
Figure 9B:
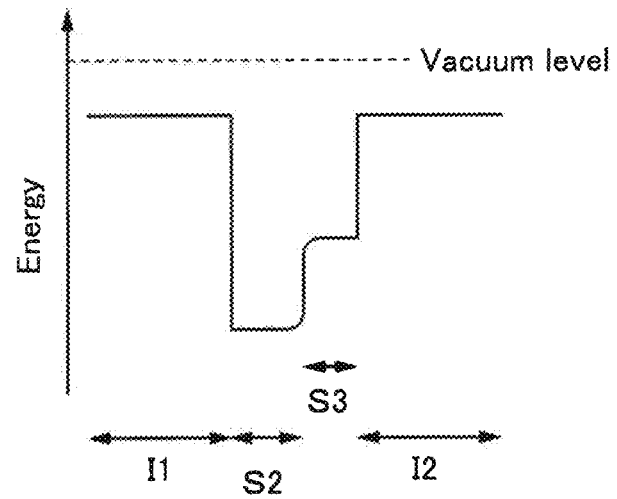
Figure 9C:
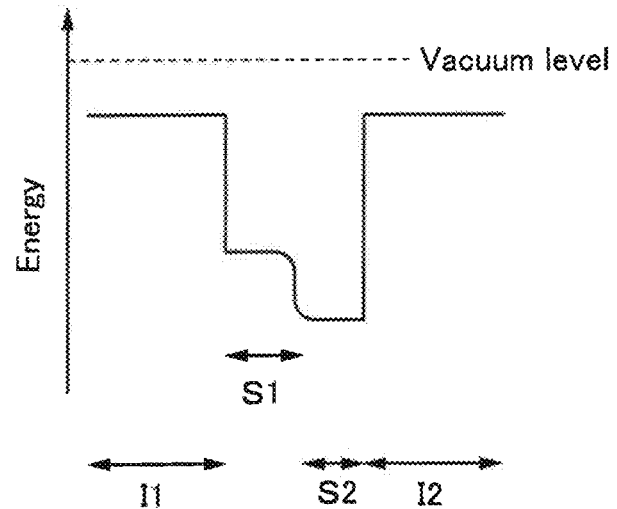

FIG. 9A is an example of a band diagram of a stacked-layer structure including an insulator I1, the oxide semiconductor S1, the oxide semiconductor S2, the oxide semiconductor S3, and an insulator I2 in a thickness direction. FIG. 9B is an example of a band diagram of a stacked-layer structure including the insulator I1, the oxide semiconductor S2, the oxide semiconductor S3, and the insulator I2 in a thickness direction. FIG. 9C is an example of a band diagram of a stacked-layer structure including the insulator I1, the oxide semiconductor S1, the oxide semiconductor S2, and the insulator I2 in a thickness direction. Note that for easy understanding, the band diagrams show the conduction band minimum (Ec) of each of the insulator I1, the oxide semiconductor S1, the oxide semiconductor S2, the oxide semiconductor S3, and the insulator I2.

The conduction band minimum of each of the oxide semiconductors S1 and S3 is closer to the vacuum level than that of the oxide semiconductor S2. Typically, a difference in the conduction band minimum between the oxide semiconductor S2 and each of the oxide semiconductors S1 and S3 is preferably greater than or equal to 0.15 eV or greater than or equal to 0.5 eV, and less than or equal to 2 eV or less than or equal to 1 eV. That is, it is preferable that the difference between the electron affinity of each of the oxide semiconductors S1 and S3 and the electron affinity of the oxide semiconductor S2 be greater than or equal to 0.15 eV or greater than or equal to 0.5 eV, and less than or equal to 2 eV or less than or equal to 1 eV.

As shown in FIGS. 9A to 9C, the conduction band minimum of each of the oxide semiconductors S1 to S3 is gradually varied. In other words, the conduction band minimum is continuously varied or continuously connected. In order to obtain such a band diagram, the density of defect states in a mixed layer formed at the interface between the oxide semiconductors S1 and S2 or the interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 8C may be used as the oxide semiconductors S1 and S3. Note that the region C illustrated in FIG. 8C represents atomic ratios [In]:[M]:[Zn] of 0:1:0, 1:3:2, and 1:3:4 and the vicinities thereof.

In the case where an oxide semiconductor with the atomic ratio represented by the region A is used as the oxide semiconductor S2, it is particularly preferable to use an oxide semiconductor with an atomic ratio where [M]/[In] is greater than or equal to 1, preferably greater than or equal to 2 as each of the oxide semiconductors S1 and S3. In addition, it is suitable to use an oxide semiconductor with sufficiently high insulation performance and an atomic ratio where [M]/([Zn]+[In]) is greater than or equal to 1 as the oxide semiconductor S3.

<2-2. Structure in Which Oxide Semiconductor is Used for Transistor>

Next, a structure in which the oxide semiconductor is used in a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with a low carrier density is preferably used for a channel region of the transistor. For example, an oxide semiconductor whose carrier density is lower than $8\times10^{11}$/cm$^3$, preferably lower than $1\times10^{11}$/cm$^3$, further preferably lower than $1\times10^{10}$/cm$^3$, and greater than or equal to $1\times10^{-9}$/cm$^3$ is used.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; for example, the concentration of nitrogen in the oxide semiconductor, which is measured by SIMS, can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration of the oxide semiconductor measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with a sufficiently reduced impurity concentration is used for a channel formation region in a transistor, the transistor can have stable electrical characteristics.

The energy gap of the oxide semiconductor film is preferably 2 eV or more, 2.5 eV or more, or 3 eV or more.

The thickness of the oxide semiconductor film is greater than or equal to 3 nm and less than or equal to 200 nm, preferably greater than or equal to 3 nm and less than or equal to 100 nm, further preferably greater than or equal to 3 nm and less than or equal to 60 nm.

When the oxide semiconductor film is an In—M—Zn oxide, as the atomic ratio of metal elements in a sputtering target used for formation of the In—M—Zn oxide, In:M:Zn=1:1:0.5, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable.

Note that the atomic ratios of metal elements in the formed oxide semiconductor films may each vary from the above atomic ratio of metal elements in the sputtering target within a range of approximately ±40%. For example, when a sputtering target with an atomic ratio of In:Ga:Zn=4:2:4.1 is used, the atomic ratio of In to Ga and Zn in the oxide semiconductor film may be approximately 4:2:3. In the case where a sputtering target whose atomic ratio of In to Ga and Zn is 5:1:7 is used, the atomic ratio of In to Ga and Zn in the formed oxide semiconductor film may be approximately 5:1:6.

<2-3. Structure of Oxide Semiconductor>

Described below is the composition of a cloud-aligned compose oxide semiconductor (CAC-OS) applicable to a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X2}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or $In_{x2}Zn_{y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{x2}Zn_{y2}O_{Z2}$ or $InO_{X1}$ as a main component are mixed. Note that in this specification, for example, when the atomic ratio of In to an element M in a first region is greater than the atomic ratio of In to the element M in a second region, the first region has a higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1}x0)Ga_{(1-x}0)O_3(ZnO)_{m0}$ ($-1 \le x0 \le 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{x2}Zn_{y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The percentage of oxygen gas flow rate in the total flow rate of the deposition gas at the time of deposition is preferably as low as possible, and for example, the percentage of oxygen gas flow rate is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{x2}Zn_{y2}O_{Z2}$ or $InO_{X1}$ are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{x2}Zn_{y2}O_{Z2}$ or $InO_{X1}$ as a main component are separated to form a mosaic pattern.

The conductivity of a region including $In_{x2}Zn_{y2}O_{Z2}$ or $InO_{X1}$ as a main component is higher than that of a region including $GaO_{X3}$ or the like as a main component. In other words, when carriers flow through regions including $In_{x2}Zn_{y2}O_{Z2}$ or $InO_{X1}$ as a main component, the conductivity of an oxide semiconductor is exhibited. Accordingly, when regions including $In_{x2}Zn_{y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{x2}Zn_{y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{x2}Zn_{y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments described in this specification as appropriate.

Embodiment 4

An oxide conductor is suitably used for the conductive film 112 included in the transistor 100 of one embodiment of the present invention because excess oxygen can be added to the insulating film 110 and the oxygen can be then diffused to the first region 108*i* of the oxide semiconductor film 108. In that case, it is possible to reduce defects in the insulating film 110 including a silicon oxynitride film. In this embodiment, defects in the insulating film 110 when an oxide conductor is used for the conductive film 112 will be described.

Defects in the silicon oxynitride film affect leakage current generated when an electric field is applied between films above and below the silicon oxynitride film. Thus, when a metal-oxide-silicon (MOS) sample having a metal film over a silicon oxynitride film and an MOS sample having a oxide conductor over a silicon oxynitride film are fabricated and leakage current in the silicon oxynitride films in the MOS samples is measured, data on defects in the silicon oxynitride films can be obtained.

For the assessment of defects in the insulating film 110 when an oxide conductor is used for the conductive film 112, two samples, a first MOS sample 317 and a second MOS sample 318, are prepared. In the first MOS sample 317, a 10-nm-thick silicon oxynitride film is formed over a silicon substrate to which impurities imparting p-type conductivity are added, and a metal film is formed over the silicon oxynitride film.

In the second MOS sample 318, a 10-nm-thick silicon oxynitride film is formed over a silicon substrate to which impurities imparting p-type conductivity are added, an oxide conductive film is formed over the silicon oxynitride film, and a metal film is formed over the oxide conductive film.

Each of the metal films is formed using 30-nm-thick titanium nitride, 135-nm-thick tungsten thereover, and 200-nm-thick aluminum thereover. The oxide conductive film is formed by a sputtering method using an In—Ga—Zn oxide target (In:Ga:Zn=4:2:4.1 [atomic ratio]) in an atmosphere containing an oxygen gas (100%).

In a high electric field region, Fowler-Nordheim (F-N) current is dominant in current that flows in the silicon oxynitride film. The F—N current is represented by $J_{FN}$ in Formula 1.

$$J_{FN}=(q^2E^2m/8\pi h\Phi_b m^*)^*$$
$$\exp\{-[4\sqrt{2m^*}(q\Phi_b)^{3/2}/3qhE]\}$$  [Formula 1]

A straight line can be obtained by plotting $\ln(J/E^2)$ and $1/E$, which are obtained from Formula 1. In the case where there is a deep defect state, the F—N plot partly deviates from the straight line. A region deviating from the straight line, called a ledge region, is caused by a process for trapping an electron of the F—N current into a deep defect state. Specifically, a trapped electron forms a fixed charge and causes a parallel shift of the I–V curve, so that a ledge region is formed. The trapped charge density can be estimated from the amount of the parallel shift.

Figure 10A:
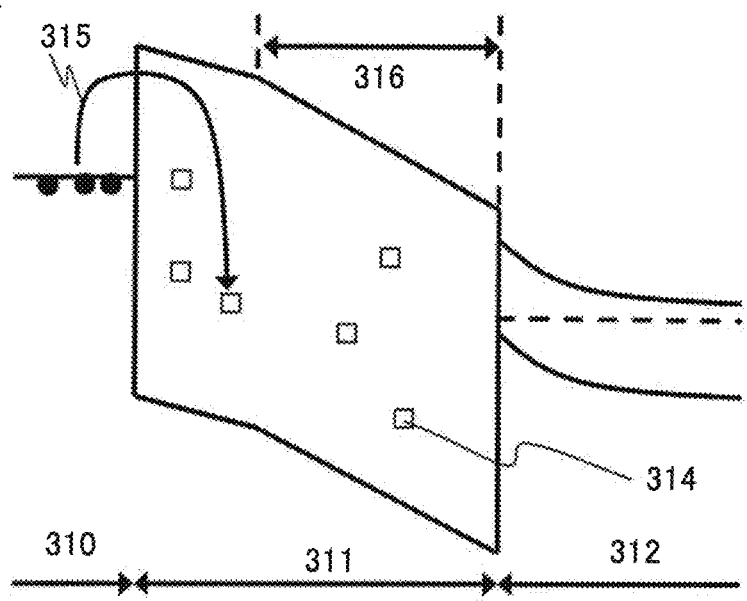
FIGS. 10A to 10C show evaluation results of silicon oxynitride films of one embodiment of the present invention.

FIG. 10A is an energy band diagram of a metal region 310, an oxide region 311, and a silicon region 312 in a MOS structure.

A film corresponding to the oxide region 311 is the silicon oxynitride film in each of the cases of the first MOS sample 317 and the second MOS sample 318. A film corresponding to the metal region 310 is the metal film in the case of the first MOS sample 317, and the oxide conductive film and the metal film thereover in the case of the second MOS sample 318.

When voltage is applied between the films above and below the silicon oxynitride film, injection 315 of an electron in the metal region 310 into a trap 314 in the oxide region 311 occurs as shown in FIG. 10A.

A trapped charge density ($Q_t(t)$) and a centroid position 316 of a trapped charge ($\bar{x}$) are able to be estimated from Formula 2 for the case where a positive charge is trapped by the trap state, Formula 3 for the case where a negative charge is trapped by the trap state, and the amount of shift in the I–V curve ($\Delta V_g$) before and after charge injection. In Formula2, $t_{ox}$ means the thickness of the oxide region 311.

$$\Delta V_g(+)=Q_t(t)/\varepsilon_0\varepsilon_{ox}(t_{ox}-\bar{x})$$  [Formula 2]

$$\Delta V_g(-)=Q_t(t)/\varepsilon_0\varepsilon_{ox}\bar{x}$$  [Formula 3]

Here, the centroid position 316 of the trapped charge in the oxide region 311 is represented by the distance from the interface with the silicon region 312. Note that the surface density of the total trapped charge in the oxide region 311 can be calculated from the charge injection time dependence of the trapped charge density.

Figure 10B:
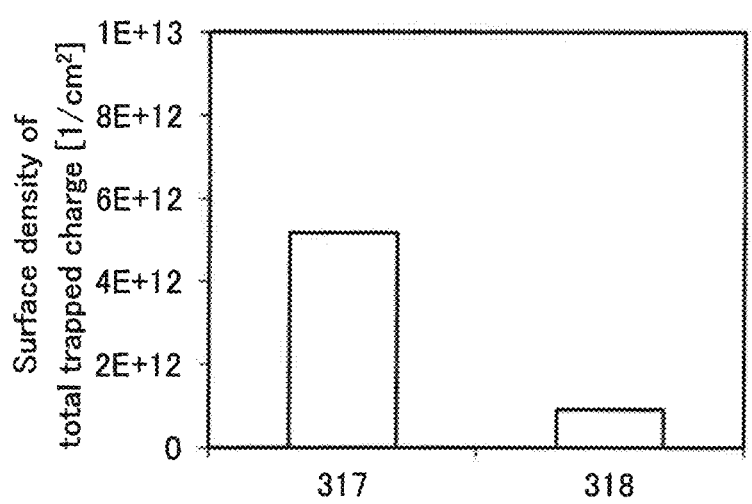
Figure 10C:
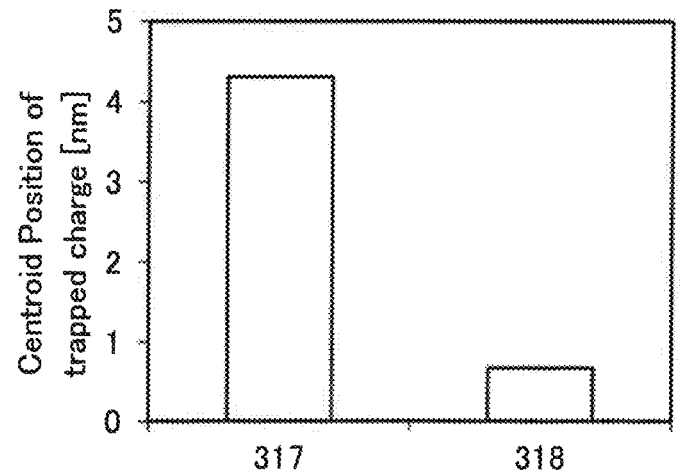

FIG. 10B shows the surface density of the total trapped charge in the oxide region obtained in the above manner, and FIG. 10C shows the centroid position of the trapped charge. The results indicate that the second MOS sample 318 has a lower surface density of the total trapped charge in the silicon oxynitride film than the first MOS sample 317. Moreover, the centroid position 316 of the trapped charge of the second MOS sample 318 becomes farther from an electrode than that of the first MOS sample 317.

Figure 11A:
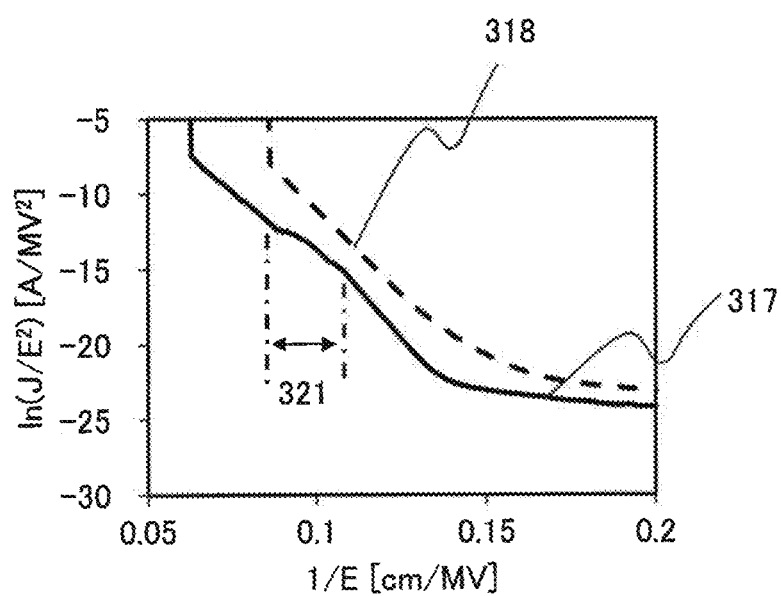
FIGS. 11A and 11B show evaluation results of silicon oxynitride films of one embodiment of the present invention.

In the F—N plot (see FIG. 11A), a ledge region 321 found in the measurement result of the first MOS sample 317 is not found in the measurement result of the second MOS sample 318. The longitudinal axis in FIG. 11A represents $\ln(J/E^2)$ [$A/MV^2$], which corresponds to the leakage current per unit area. FIGS. 10A to 10C and FIGS. 11A and 11B indicate that the trapped charge density (the density of electrons trapped by deep defect states) in the silicon oxynitride film in the second MOS sample 318 is decreased because the oxide conductive film is formed over the silicon oxynitride film.

Figure 11B:
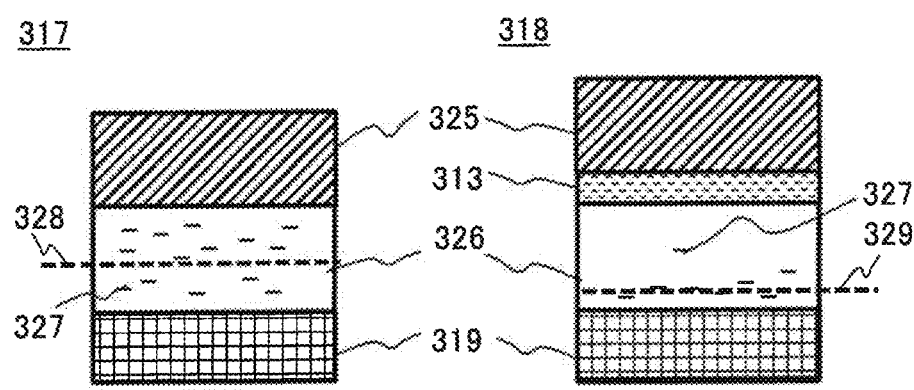

FIG. 11B schematically illustrates structures of the first MOS sample 317 and the second MOS sample 318. Each of the samples includes silicon 319, a silicon oxynitride film 326, and a metal film 325. The second MOS sample 318 further includes an oxide conductive film 313. In the first MOS sample 317 in which the metal film 325 is formed over the silicon oxynitride film 326, a centroid position 328 of a trapped charge 327 in the silicon oxynitride film 326 is almost in the middle of the silicon oxynitride film 326, indicating that defects might exist uniformly in the silicon oxynitride film 326 (see FIG. 11B). In contrast, in the case of using the oxide conductive film 313, a centroid position 329 of the trapped charge 327 is close to the interface between the silicon 319 and the silicon oxynitride film 326, and the trapped charge density is low. The above results suggest that the defect density in the silicon oxynitride film 326 in a region close to the oxide conductive film 313 is reduced owing to the formation of the oxide conductive film 313.

As described above, the use of an oxide conductor for the conductive film 112 in the transistor 100 of one embodiment of the present invention can reduce the defect density in the insulating film 110.

Embodiment 5

In this embodiment, the characteristics of the transistor 100 in the case where a silicon oxynitride film is formed for the insulating film 110 at a substrate temperature of 350° C. will be described.

The insulating film 110 functioning as the gate insulating film of the transistor 100 of one embodiment of the present invention desirably has few defects, causes less damage to the oxide semiconductor film 108, and supplies excess oxygen to the oxide semiconductor film 108, for example.

In Embodiment 1, a silicon oxynitride film formed by a plasma-enhanced chemical vapor deposition method is used for the insulating film 110 functioning as the gate insulating film of the transistor 100 of one embodiment of the present invention. As described in Embodiment 1, excess oxygen are added to vacancies in a silicon oxynitride film that is formed at low temperatures, and a large amount of excess oxygen can be absorbed or supplied to the oxide semiconductor film.

A silicon oxynitride film that is formed at high temperatures can have a high film density, that is, have few defects. Thus, to increase the reliability, it is effective for the insulating film 110 to have a stacked-layer structure of a silicon oxynitride film formed at a substrate temperature of 350° C. and a silicon oxynitride film formed at a substrate temperature of 220° C., over the first region 108i of the oxide semiconductor film 108.

Considering the productivity of the insulating film 110 having a stacked-layer structure, the stacked films are desirably formed at the same temperature.

Figure 12A:
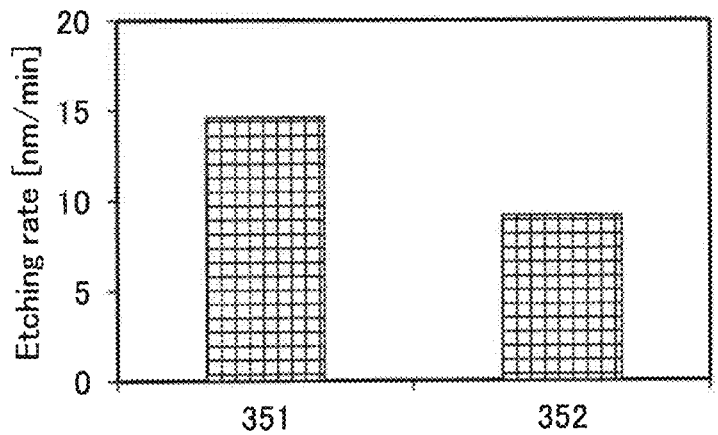
FIGS. 12A to 12C show measurement results of silicon oxynitride films of one embodiment of the present invention.

FIG. 12A shows the comparison result of wet etching rates of silicon oxynitride films. In each of a sample 351 and a sample 352, a silicon oxynitride film was formed over glass. A substrate temperature during the formation was 220° C. in the case of the sample 351, and a substrate temperature during the formation was 350° C. in the case of the sample 352.

In each of the sample 351 and the sample 352, the silicon oxynitride film was formed by a plasma CVD method using a gas containing $SiH_4$ at 20 sccm and $N_2O$ at 3000 sccm. The deposition pressure was 200 Pa and the deposition power was 100 W. In the wet etching, HF (0.5%) was used as a solution, and the temperature was set at room temperature.

As shown in FIG. 12A, the sample 352 has a lower etching rate. This indicates that a silicon oxynitride film formed at a substrate temperature of 350° C. can be denser than that formed at a substrate temperature of 220° C.

Figure 12B:
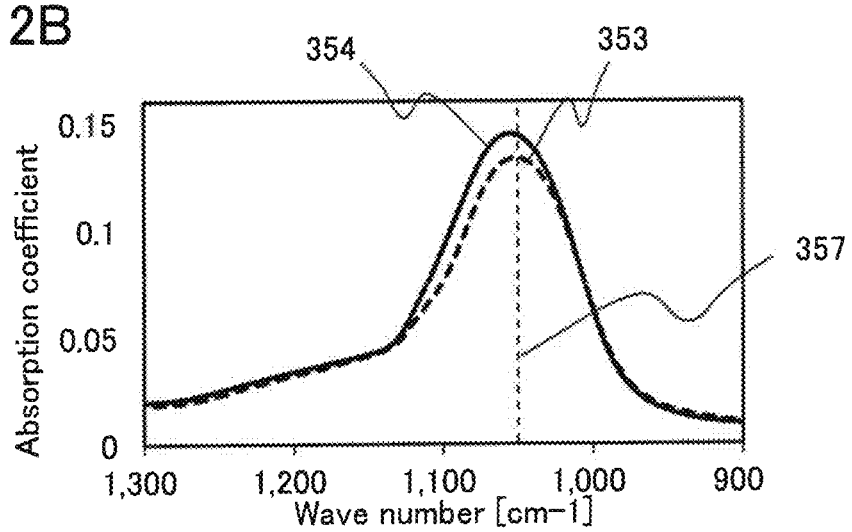

FIG. 12B shows the comparison result of silicon oxynitride films measured by FT-IR. In each of a sample 353 and a sample 354, a silicon oxynitride film was formed over a silicon wafer. A substrate temperature during the formation was 220° C. in the case of the sample 353, and a substrate temperature during the formation was 350° C. in the case of the sample 354. A dotted line 357 at a wave number of 1050 $cm^{-1}$, which is parallel to the longitudinal axis in FIG. 12B, indicates the wave number derived from a Si—O bond.

In each of the sample 353 and the sample 354, the silicon oxynitride film was formed by a plasma CVD method using a gas containing $SiH_4$ at 20 sccm and $N_2O$ at 3000 sccm. The deposition pressure was 200 Pa and the deposition power was 100 W.

As shown in FIG. 12B, the sample 354 has the density of Si—O bonds slightly higher than that of the sample 353. This also indicates that a silicon oxynitride film formed at a substrate temperature of 350° C. can be denser than that formed at a substrate temperature of 220° C.

Figure 12C:
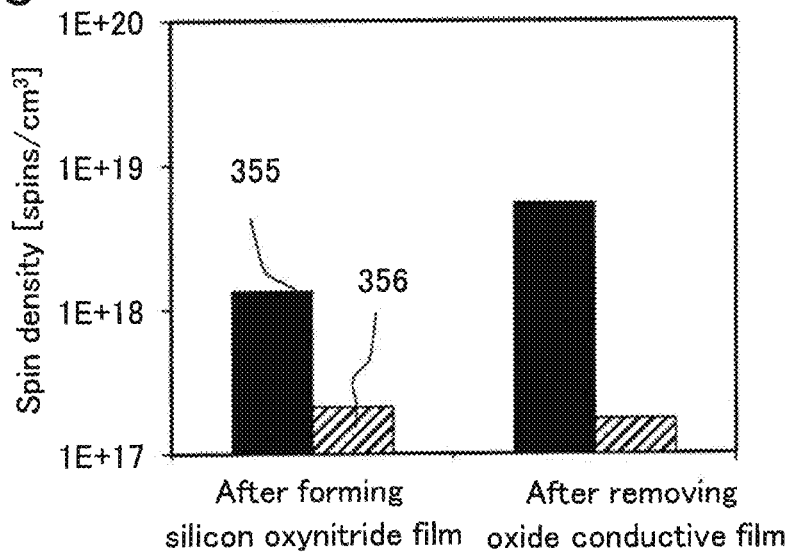

FIG. 12C shows the comparison result of the nitrogen oxide ($NO_x$) concentration in silicon oxynitride films measured by an ESR method. The longitudinal axis represents spin density. In each of a sample 355 and a sample 356, a 10-nm-thick oxide semiconductor film was formed over glass, a 20-nm-thick silicon oxynitride film was formed, and a 100-nm-thick oxide conductive film was formed thereover. Note that the oxide conductive film was removed before the ESR measurement.

The silicon oxynitride film was formed at a substrate temperature of 220° C. in the sample 355 and at a substrate temperature of 350° C. in the sample 356. In each of the sample 355 and the sample 356, the oxide semiconductor film was formed by a sputtering method using an In—Ga—Zn oxide target (In:Ga:Zn=4:2:4.1 [atomic ratio]) in an atmosphere containing an argon gas (90%) and an oxygen gas (10%) at a substrate temperature of 130° C. The silicon oxynitride films were each formed by a plasma CVD method using a gas containing $SiH_4$ at 20 sccm and $N_2O$ at 3000 sccm. The deposition pressure was 200 Pa and the deposition power was 100 W. The oxide conductive films were each formed by a sputtering method using an In—Ga—Zn oxide target (In:Ga:Zn=4:2:4.1 [atomic ratio]).

FIG. 12C shows the spin density [spins/$cm^3$] derived from nitrogen oxide ($NO_x$) after the formation of the silicon oxynitride film and after the removal of the oxide conductive film. As shown in FIG. 12C, a silicon oxynitride film can be formed to have a lower nitrogen oxide ($NO_x$) concentration when formed at a substrate temperature of 350° C. than when formed at a substrate temperature of 220° C.

The above results suggest that a silicon oxynitride film formed at a substrate temperature of 350° C., which has a high density, few defects, and a low nitrogen oxide ($NO_x$) concentration, is preferably used for the insulating film 110. However, when a silicon oxynitride film formed at a substrate temperature of 350° C. is used for the insulating film 110, the resistance of the oxide semiconductor film 108 might be decreased as shown in FIG. 43A.

Figure 13A:
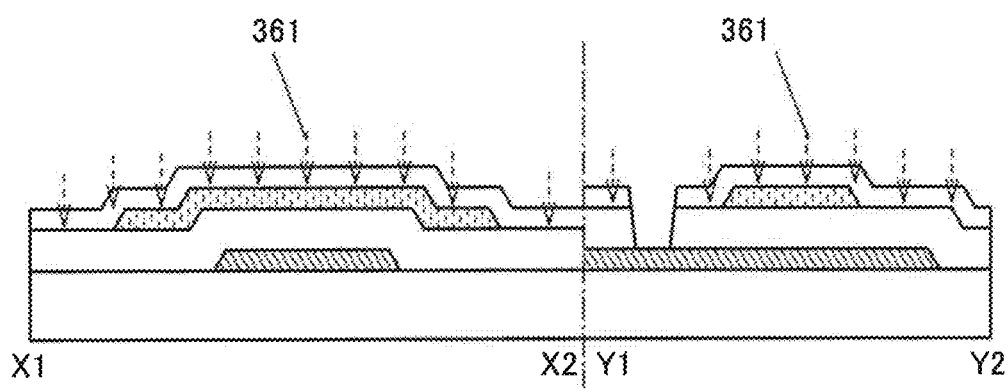
FIGS. 13A and 13B are cross-sectional views illustrating a method for manufacturing a semiconductor device.
Figure 13B:
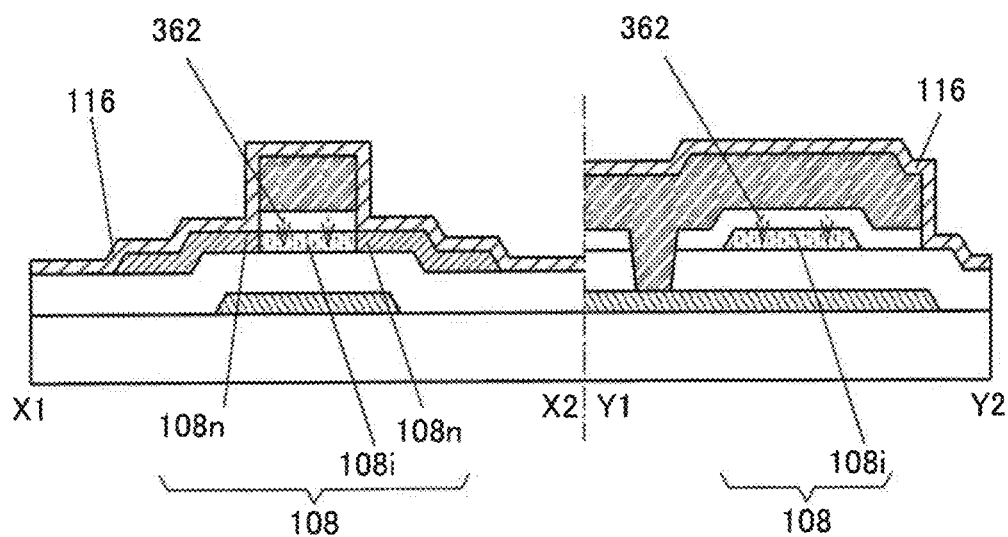

To prevent the decrease in the resistance of the oxide semiconductor film 108, the following methods can be employed. One method is oxygen plasma treatment 361 performed using a plasma CVD apparatus after the formation of the insulating film 110 (see FIG. 13A). Another method is heat treatment performed after the formation of the insulating film 116 (see FIG. 13B). The above treatments can promote the supply of excess oxygen 362 to the oxide semiconductor film 108. It is particularly preferable to use both of the treatments.

The oxygen plasma treatment 361 using a plasma CVD apparatus after the formation of the insulating film 110 can be performed by a method which will be described in Example 1, for example. The heat treatment after the formation of the insulating film 116 can be performed at 350° C. in a nitrogen atmosphere for one hour, for example.

Figure 14A:
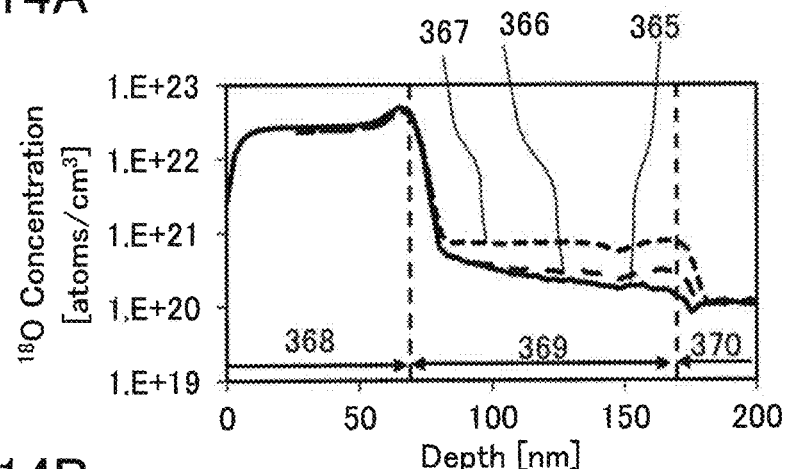
FIGS. 14A to 14C show oxygen diffusion effects of one embodiment of the present invention.
Figure 14B:
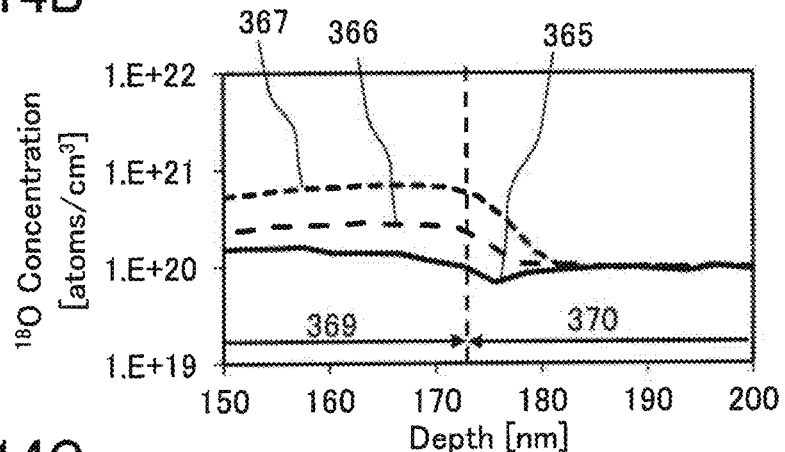

FIGS. 14A and 14B show the results of experiments performed to demonstrate that the heat treatment performed after the formation of the insulating film 116 is effective for adding oxygen to the oxide semiconductor film. In each sample used in the experiments, a 100-nm-thick oxide semiconductor film was formed over a glass substrate, a 100-nm-thick silicon oxynitride film was formed thereover, a 100-nm-thick oxide conductive film was formed thereover, and a 100-nm-thick silicon nitride film was formed thereover.

The oxide semiconductor films were each formed by a sputtering method using an In—Ga—Zn oxide target (In:Ga:Zn=4:2:4.1 [atomic ratio]) in an atmosphere containing an argon gas (90%) and an oxygen gas (10%) at a substrate temperature of 130° C.

The silicon oxynitride films were each formed to have a stacked-layer structure of two layers formed under different conditions by a plasma CVD method at a substrate temperature of 220° C. The first conditions were as follows: a gas containing $SiH_4$ at 50 sccm and $N_2O$ at 2000 sccm was used, the deposition pressure was 20 Pa, and the deposition power was 100 W. A silicon oxynitride film formed under the first conditions had a thickness of 30 nm. This film contained a small amount of $NO_x$. The second conditions were as follows: a gas containing $SiH_4$ at 160 sccm and $N_2O$ at 4000 sccm was used, the deposition pressure was 200 Pa, and the deposition power was 1500 W. A silicon oxynitride film formed under the second conditions had a thickness of 70 nm.

The oxide conductive films were each formed to have a stacked-layer structure of two layers formed under different conditions using an In—Ga—Zn oxide target (In:Ga:Zn=4: 2:4.1 [atomic ratio]). The first conditions were as follows: a sputtering method was used, an atmosphere containing an $^{18}O$ gas (100%) was used, and a substrate temperature was set at 170° C. An oxide conductive film formed under the first conditions had a thickness of 10 nm. The second conditions were as follows: a sputtering method was used, an atmosphere containing an argon gas (90%) and an $^{18}O$ gas (10%) was used, and a substrate temperature was set at 170° C. An oxide conductive film formed under the second conditions had a thickness of 90 nm.

The silicon nitride film was formed under the following conditions: the substrate temperature was set at 220° C.; a silane gas at a flow rate of 50 sccm, a nitrogen gas at a flow rate of 5000 sccm, and an ammonia gas at a flow rate of 100 sccm were introduced into a chamber; the pressure was 200 Pa; and an RF power of 1000 W was supplied between parallel-plate electrodes provided in the plasma CVD apparatus.

A sample 365 was completed without heat treatment, a sample 366 was completed by performing heat treatment at 250° C. in a nitrogen atmosphere, and a sample 367 was completed by performing heat treatment at 350° C. in a nitrogen atmosphere.

FIGS. 14A and 14B show the results of the $^{18}O$ concentration distribution in the sample 365, the sample 366, and the sample 367 analyzed by SIMS. In each of the sample 365, the sample 366, and the sample 367, $^{18}O$ was used only when the oxide conductive film was formed; thus, if the $^{18}O$ concentration is high in other films, the $^{18}O$ is probably $^{18}O$ diffused from the oxide conductive film. The SIMS analysis was conducted while digging was performed from the substrate to the film surface side to obtain profiles.

In each of FIGS. 14A and 14B, the lateral axis represents the depth from a sample surface, and the longitudinal axis represents SIMS signals obtained by detecting $^{18}O$ in an oxide conductive film 368, a silicon oxynitride film 369, and an oxide semiconductor film 370. FIG. 14A shows the quantified measurement results of the $^{18}O$ concentration in the silicon oxynitride film 369. FIG. 14B shows the quantified measurement results of the $^{18}O$ concentration in the oxide semiconductor film 370.

As apparent from the results in FIGS. 14A and 14B, when heat treatment is performed after the formation of the silicon nitride film, the amount of oxygen diffused from the silicon oxynitride film to the oxide semiconductor film can be increased.

Figure 14C:
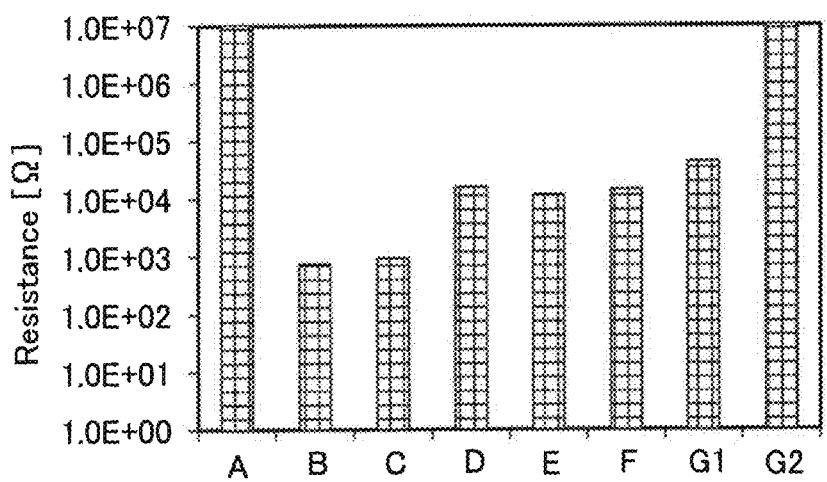

FIG. 14C shows the results of experiments performed to find out at which step the heat treatment should be performed for effective addition of oxygen to the oxide semiconductor film.

In a sample used in the experiments, a 40-nm-thick oxide semiconductor film was formed over a quartz substrate, a 150-nm-thick silicon oxynitride film was formed thereover, a 100-nm-thick oxide conductive film was formed thereover, and a 100-nm-thick silicon nitride film was formed thereover. In FIG. 14C, the lateral axis represents the formation steps, and the longitudinal axis represents the resistance of the oxide semiconductor film. The formation steps are described below.

First, the oxide semiconductor film was formed over the substrate (Step A). The formation conditions of the oxide semiconductor film were the same as the formation conditions of the oxide semiconductor films in the samples 365 to 367. The resistance of the oxide semiconductor film was measured after Step A.

Next, the silicon oxynitride film was formed over the oxide semiconductor film (Step B). The silicon oxynitride film was formed by a plasma CVD method at a substrate temperature of 350° C. using a gas containing $SiH_4$ at 20 sccm and $N_2O$ at 3000 sccm. The deposition pressure was 200 Pa and the deposition power was 100 W. The resistance of the oxide semiconductor film was measured after Step B.

Then, heat treatment was performed at 350° C. in a nitrogen atmosphere (Step C). The resistance of the oxide semiconductor film was measured after Step C.

After that, oxygen plasma treatment was performed at a substrate temperature of 350° C. (Step D). The oxygen plasma treatment was performed for 250 seconds under the following conditions: oxygen at a flow rate of 3000 sccm was introduced into a chamber, the pressure was set to 40 Pa, and an RF power of 3000 W was supplied between parallel-plate electrodes provided in a plasma CVD apparatus. The resistance of the oxide semiconductor film was measured after Step D.

Next, the oxide conductive film was formed (Step E). The formation conditions of the oxide conductive film were the same as the formation conditions of the oxide conductive films in the samples 365 to 367. The resistance of the oxide semiconductor film was measured after Step E.

Subsequently, the silicon nitride film was formed (Step F). The formation conditions of the silicon nitride film were the same as the formation conditions of the silicon nitride films in the samples 365 to 367. The resistance of the oxide semiconductor film was measured after Step F.

Then, heat treatment was performed at 250° C. in a nitrogen atmosphere (Step G1). The resistance of the oxide semiconductor film was measured after Step G1 Furthermore, heat treatment was performed on another sample at 350° C. instead of at 250° C., in a nitrogen atmosphere (Step G2). The resistance of the oxide semiconductor film was measured after Step G2.

As apparent from the resistances of the oxide semiconductor film measured after Step A to Step G1 or Step G2 shown in FIG. 14C, the resistance of the oxide semiconductor film is decreased at the step of forming the silicon oxynitride and is greatly increased when heat treatment is performed at 350° C. after the formation of the silicon nitride film. Note that the resistances of the oxide semiconductor film after Step A and Step G2 are higher than $4.0 \times 10^7 \Omega$, which is the upper measurement limit of a resistance measurement apparatus.

The results indicate that supply of excess oxygen is promoted when heat treatment is performed at 350° C. after the formation of the silicon nitride film. The $^{18}O$ concentration analyzed by SIMS, which is shown in FIGS. 14A and 14B, also indicates this promotion of supply of excess oxygen.

When oxygen plasma treatment was performed after the formation of the silicon oxynitride film and heat treatment was performed at 350° C. after the formation of the silicon nitride film, the reliability of the transistor 100 in which a silicon oxynitride film formed at 350° C. was used for the insulating film 110 was equivalent to the reliability of the transistor 100 in which a silicon oxynitride film was formed at a substrate temperature of 350° C. and then a silicon oxynitride film was formed at a substrate temperature of 220° C. to form the insulating film 110. Note that here, the reliability was measured by bias-temperature stress tests described later in Example 1.

In other words, a silicon oxynitride film formed at a substrate temperature of 350° C., which has a high density and a low defect density, can be used for the insulating film 110 as long as treatment for supplying sufficient excess oxygen to the oxide semiconductor film 108 is performed. In that case, the productivity can be improved.

The structures described in this embodiment can be combined as appropriate with any of the structures described in the other embodiments.

Embodiment 6

In this embodiment, examples of a display device that includes the transistor described in the above embodiments will be described below with reference to FIG. 15, FIG. 16, FIG. 17, FIG. 18, FIG. 19, and FIG. 20.

Figure 15:
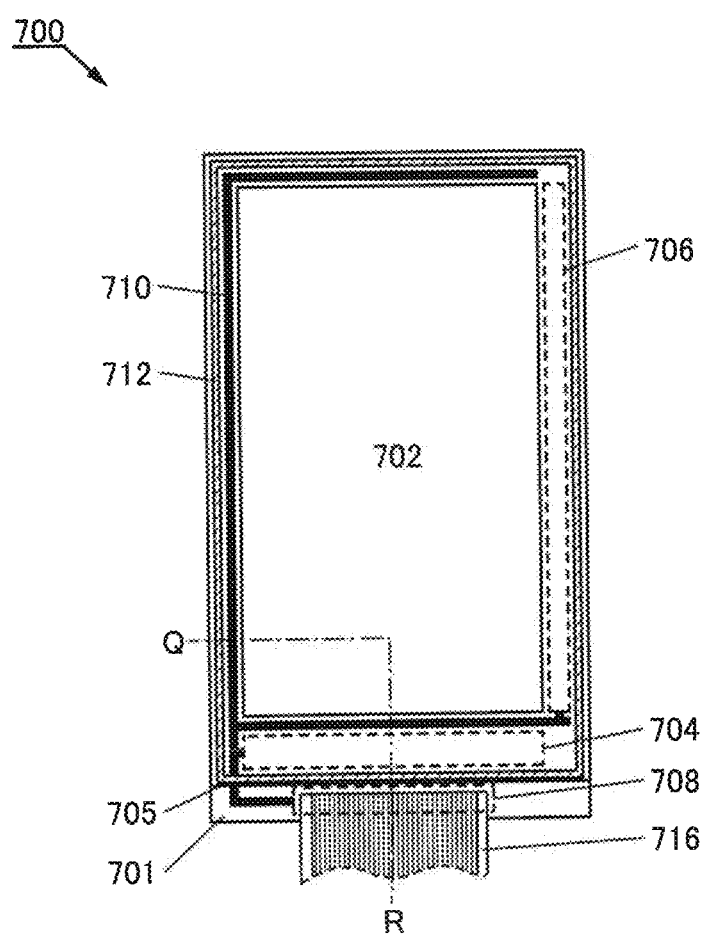
FIG. 15 is a top view illustrating one embodiment of a display device.

FIG. 15 is a top view illustrating an example of a display device. A display device 700 in FIG. 15 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 15, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

Figure 16:
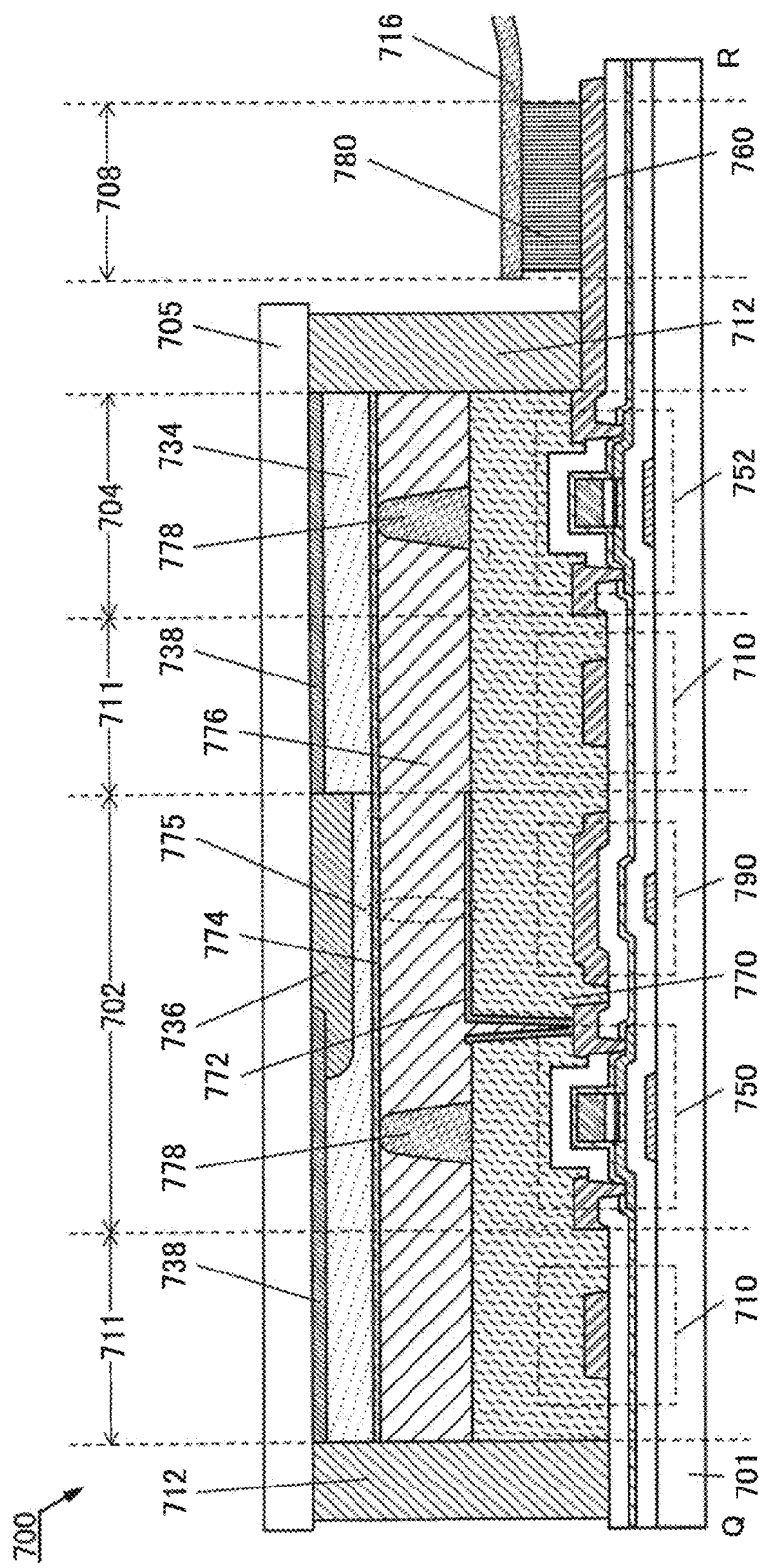
FIG. 16 is a cross-sectional view illustrating one embodiment of a display device.
Figure 17:
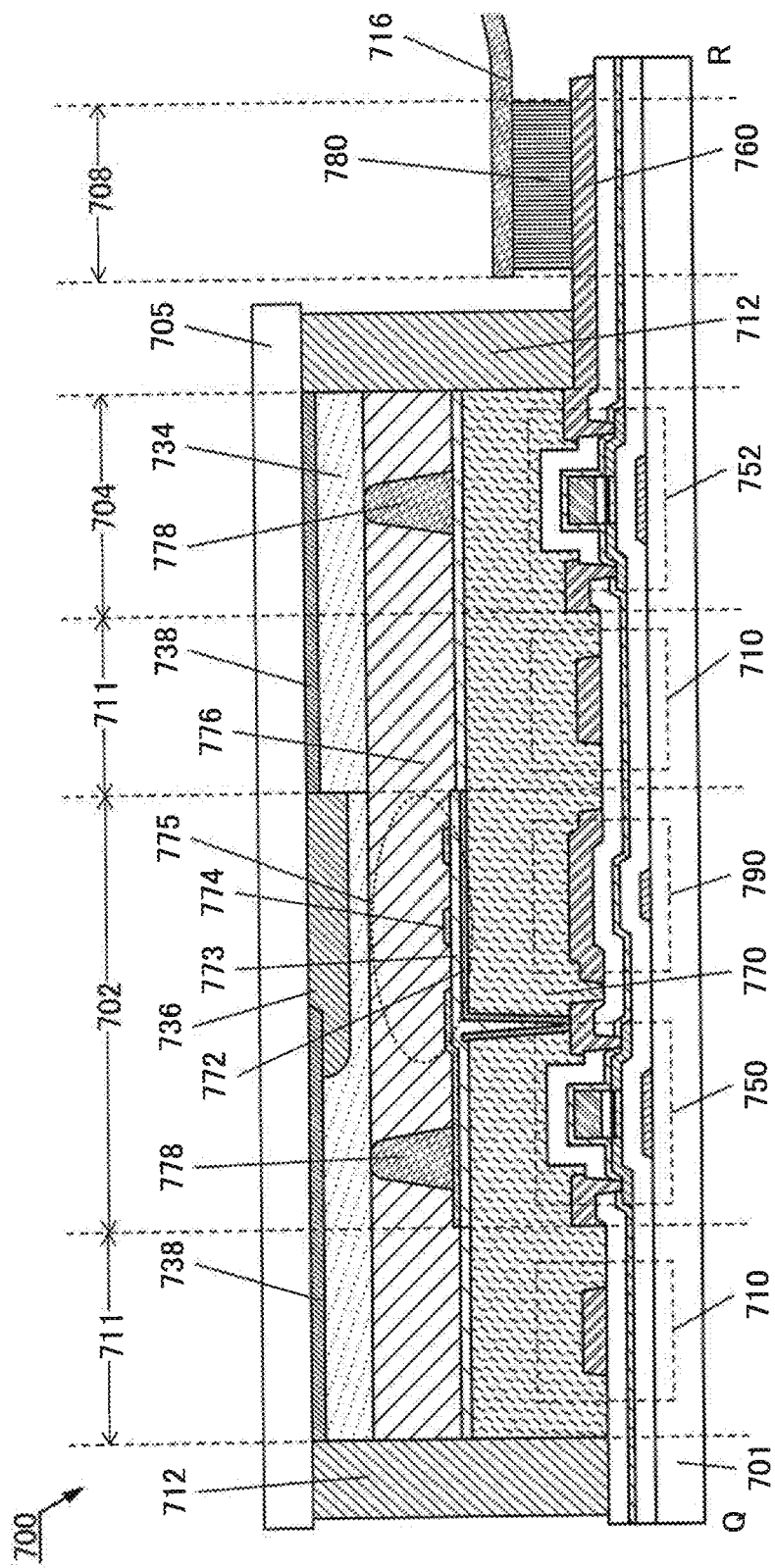
FIG. 17 is a cross-sectional view illustrating one embodiment of a display device.
Figure 18:
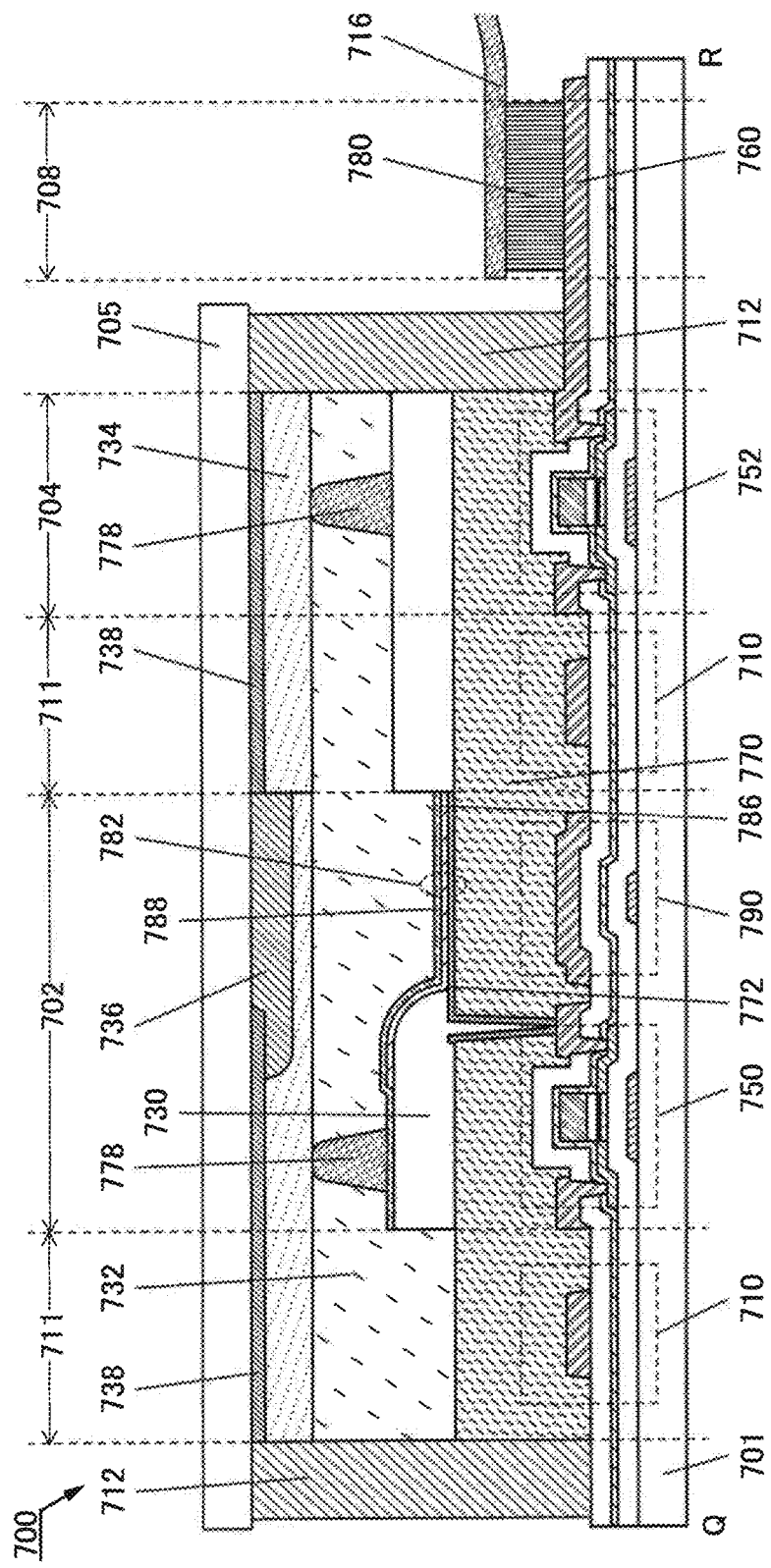
FIG. 18 is a cross-sectional view illustrating one embodiment of a display device.

In this embodiment, a structure including a liquid crystal element as a display element and a structure including an EL element as a display element are described with reference to FIG. 16, FIG. 17, and FIG. 18. FIG. 16 and FIG. 17 are each a cross-sectional view taken along a dashed-dotted line Q-R in FIG. 15 and illustrate the structure including a liquid crystal element as a display element. FIG. 18 is a cross-sectional view taken along the dashed-dotted line Q-R in FIG. 15 and illustrates the structure including an EL element as a display element.

Portions common to FIG. 16, FIG. 17, and FIG. 18 will be described first, and then, different portions will be described.

<3-1. Portions Common to Display Devices>

The display device 700 in FIG. 16, FIG. 17, and FIG. 18 includes a lead wiring portion 711, the pixel portion 702, the source driver circuit portion 704, the FPC terminal portion 708, and the sealant 712. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100B illustrated in FIGS. 3A and 3B. Note that the transistor 750 and the transistor 752 may each have the structure of any of the other transistors described in the above embodiments.

The transistor used in this embodiment includes an oxide semiconductor film that is highly purified and in which formation of oxygen vacancies are suppressed. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing a conductive film to be a conductive film functioning as a first gate electrode of the transistor 750. The upper electrode is formed through a step of processing a conductive film to be a conductive film functioning as source and drain electrodes or a second gate electrode of the transistor 750. Between the lower electrode and the upper electrode, an insulating film formed through a step of forming an insulating film to be an insulating film functioning as a first gate insulating film of the transistor 750 and insulating films formed through a step of forming insulating films to be insulating films functioning as protective insulating films over the transistor 750 are provided. That is, the capacitor 790 has a stacked-layer structure in which an insulating film functioning as a dielectric film is positioned between the pair of electrodes.

In FIG. 16, FIG. 17, and FIG. 18, a planarization insulating film 770 is provided over the transistor 750, the transistor 752, and the capacitor 790.

Although FIG. 16, FIG. 17, and FIG. 18 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a top-gate transistor is used in the pixel portion 702 and a bottom-gate transistor is used in the source driver circuit portion 704, or a structure in which a bottom-gate transistor is used in the pixel portion 702 and a top-gate transistor is used in the source driver circuit portion 704 may be employed. Note that the term "source driver circuit portion 704" can be replaced by the term "gate driver circuit portion."

The signal line 710 is formed through the same process as the conductive films functioning as source electrodes and drain electrodes of the transistors 750 and 752. In the case where the signal line 710 is formed using a material containing a copper, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<3-2. Structure Example of Display Device Including Liquid Crystal Element>

The display device 700 in FIG. 16 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 16 can display an image in such a manner that transmission or non-transmission of light is controlled by the alignment state in the liquid crystal layer 776 that is changed depending on the voltage applied between the conductive film 772 and the conductive film 774.

The conductive film 772 is electrically connected to the conductive film functioning as the source electrode or the drain electrode of the transistor 750. The conductive film 772 is formed over the planarization insulating film 770 and functions as a pixel electrode, that is, one electrode of the display element.

A conductive film that transmits visible light or a conductive film that reflects visible light can be used as the conductive film 772. For example, a material containing an element selected from indium (In), zinc (Zn), and tin (Sn) may be used for the conductive film that transmits visible light. For example, a material containing aluminum or silver may be used for the conductive film that reflects visible light.

In the case where a conductive film that reflects visible light is used as the conductive film 772, the display device 700 is a reflective liquid crystal display device. In the case where a conductive film that transmits visible light is used as the conductive film 772, the display device 700 is a transmissive liquid crystal display device.

The method for driving the liquid crystal element can be changed by changing the structure over the conductive film 772, an example of this case is illustrated in FIG. 17. The display device 700 illustrated in FIG. 17 is an example of employing a horizontal electric field mode (e.g., an FFS mode) as a driving mode of the liquid crystal element. In the structure illustrated in FIG. 17, an insulating film 773 is provided over the conductive film 772, and the conductive film 774 is provided over the insulating film 773. In such a structure, the conductive film 774 functions as a common electrode, and an electric field generated between the conductive film 772 and the conductive film 774 through the insulating film 773 can control the alignment state in the liquid crystal layer 776.

Although not illustrated in FIG. 16 and FIG. 17, the conductive film 772 and/or the conductive film 774 may be provided with an alignment film on a side in contact with the liquid crystal layer 776. Although not illustrated in FIG. 16 and FIG. 17, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

<3-3. Display Device Including Light-Emitting Element>

The display device 700 illustrated in FIG. 18 includes a light-emitting element 782. The light-emitting element 782 includes a conductive film 772, an EL layer 786, and a conductive film 788. The display device 700 illustrated in FIG. 18 can display an image by utilizing light emission from the EL layer 786 of the light-emitting element 782. Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

The above-described organic compound and the inorganic compound can be deposited by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the EL layer 786.

Here, a method for forming the EL layer 786 by a droplet discharge method is described with reference to FIGS. 21A to 21D. FIGS. 21A to 21D are cross-sectional views illustrating the method for forming the EL layer 786.

Figure 21A:
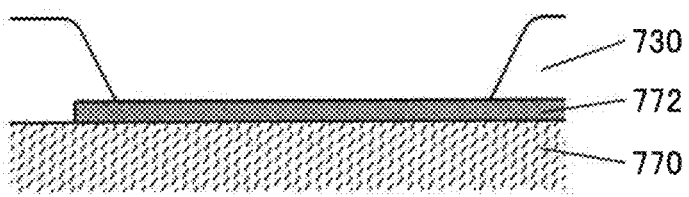
FIGS. 21A to 21D are cross-sectional views illustrating a method for forming an EL layer.
Figure 21B:
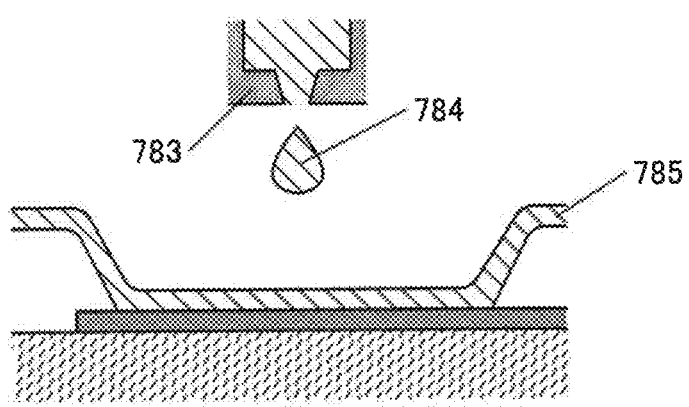

First, the conductive film 772 is formed over the planarization insulating film 770, and an insulating film 730 is formed to cover part of the conductive film 772 (see FIG. 21A).

Then, a droplet 784 is discharged to an exposed portion of the conductive film 772, which is an opening of the insulating film 730, from a droplet discharge apparatus 783, so that a layer 785 containing a composition is formed. The droplet 784 is a composition containing a solvent and is attached to the conductive film 772 (see FIG. 21B).

Note that the step of discharging the droplet 784 may be performed under reduced pressure.

Figure 21C:
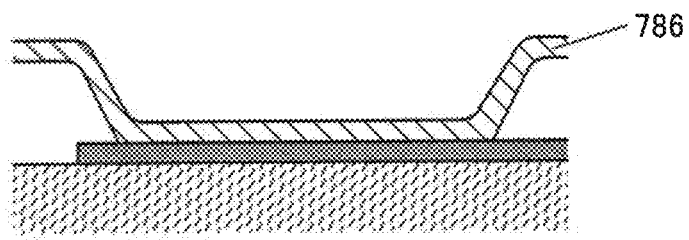

Next, the solvent is removed from the layer 785 containing the composition, and the resulting layer is solidified to form the EL layer 786 (see FIG. 21C).

The solvent may be removed by drying or heating.

Figure 21D:
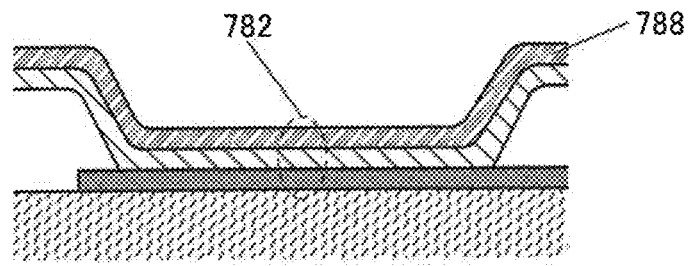

Next, the conductive film 788 is formed over the EL layer 786; thus, the light-emitting element 782 is formed (see FIG. 21D).

When the EL layer 786 is formed by a droplet discharge method as described above, the composition can be selectively discharged; accordingly, waste of material can be reduced. Furthermore, a lithography process or the like for shaping is not needed, and thus, the process can be simplified and cost reduction can be achieved.

The droplet discharge method described above is a general term for a means including a nozzle equipped with a composition discharge opening or a means to discharge droplets such as a head having one or a plurality of nozzles.

Figure 22:
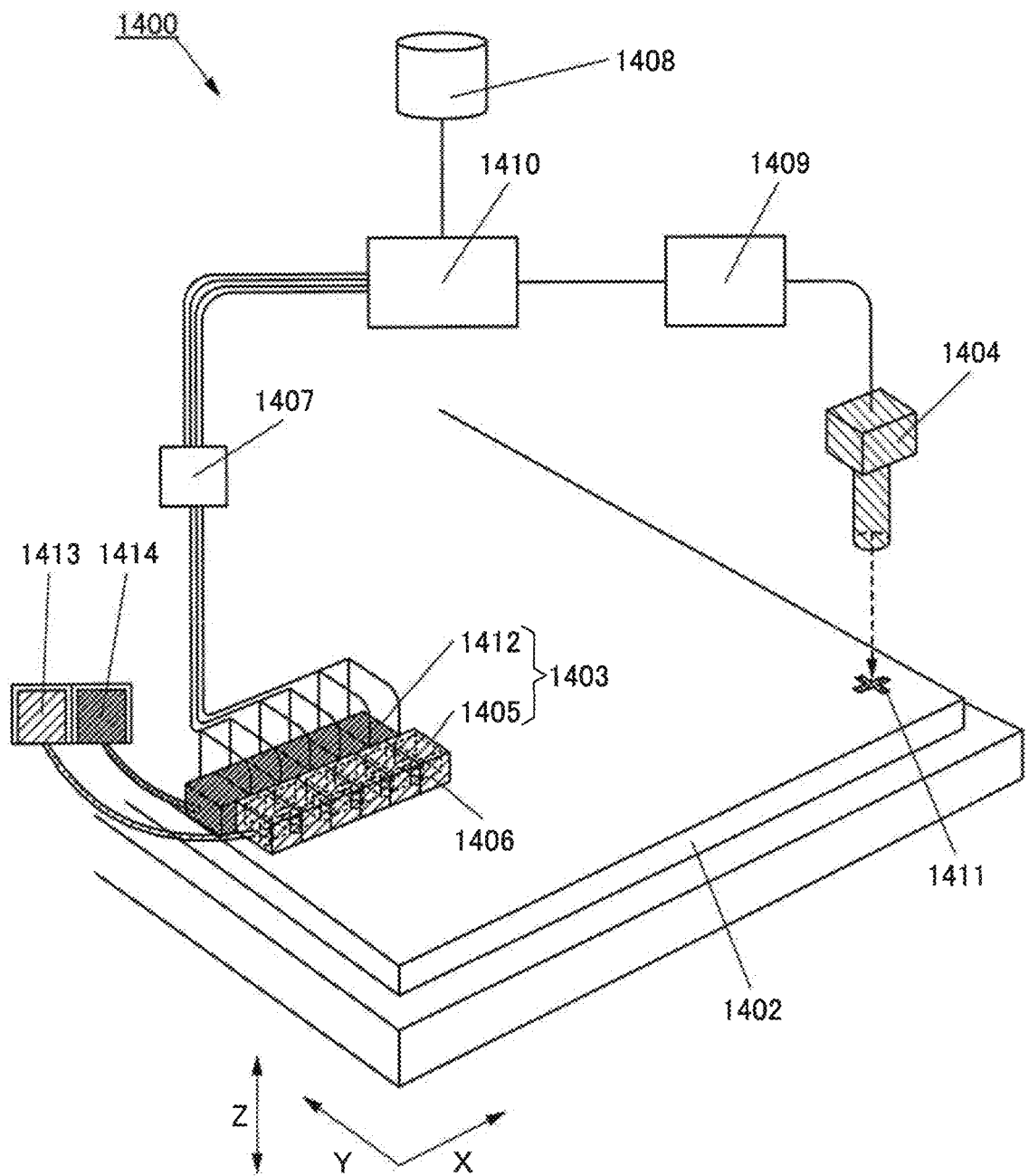
FIG. 22 is a conceptual diagram illustrating a droplet discharge apparatus.

Next, a droplet discharge apparatus used for the droplet discharge method is described with reference to FIG. 22. FIG. 22 is a conceptual diagram illustrating a droplet discharge apparatus 1400.

The droplet discharge apparatus 1400 includes a droplet discharge means 1403. In addition, the droplet discharge means 1403 is equipped with a head 1405 and a head 1412.

The heads 1405 and 1412 are connected to a control means 1407, and this control means 1407 is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. Then, the digital signal is recognized by the computer 1410, and then, a control signal is generated and transmitted to the control means 1407.

An image sensor or the like using a charge coupled device (CCD) or a complementary metal oxide semiconductor (CMOS) can be used as the imaging means 1404. Note that information about a pattern to be formed over the substrate 1402 is stored in a storage medium 1408, and a control signal is transmitted to the control means 1407 based on the information, so that each of the heads 1405 and 1412 of the droplet discharge means 1403 can be individually controlled. The heads 1405 and 1412 are supplied with a material to be discharged from material supply sources 1413 and 1414 through pipes, respectively.

Inside the head 1405, a space as indicated by a dotted line 1406 to be filled with a liquid material and a nozzle which is a discharge outlet are provided. Although it is not shown, an inside structure of the head 1412 is similar to that of the head 1405. When the nozzle sizes of the heads 1405 and 1412 are different from each other, different materials with different widths can be discharged simultaneously. Each head can discharge and draw a plurality of light emitting materials. In the case of drawing over a large area, the same material can be simultaneously discharged to be drawn from a plurality of nozzles in order to improve throughput. When a large substrate is used, the heads 1405 and 1412 can freely scan the substrate in directions indicated by arrows X, Y, and Z in FIG. 22, and a region in which a pattern is drawn can be freely set. Thus, a plurality of the same patterns can be drawn over one substrate.

Furthermore, a step of discharging the composition may be performed under reduced pressure. A substrate may be heated when the composition is discharged. After discharging the composition, either drying or baking or both of them are performed. Both the drying and baking are heat treatments but different in purpose, temperature, and time period. The steps of drying and baking are performed under normal pressure or under reduced pressure by laser irradiation, rapid thermal annealing, heating using a heating furnace, or the like. Note that there is no particular limitation on the timing of the heat treatment and the number of times of the heat treatment. The temperature for performing each of the steps of drying and baking in a favorable manner depends on the materials of the substrate and the properties of the composition.

In the above-described manner, the EL layer 786 can be formed with the droplet discharge apparatus.

Let's go back to the explanation of the display device 700 illustrated in FIG. 18.

In the display device 700 in FIG. 18, the insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 18, in which the coloring film 736 is provided. For example, a structure without the coloring film 736 may also be employed in the case where the EL layer 786 is formed by separate coloring.

<3-4. Structure Example of Display Device Provided with Input/Output Device>

An input/output device may be provided in the display device 700 illustrated in FIG. 17 and FIG. 18. As an example of the input/output device, a touch panel or the like can be given.

Figure 19:
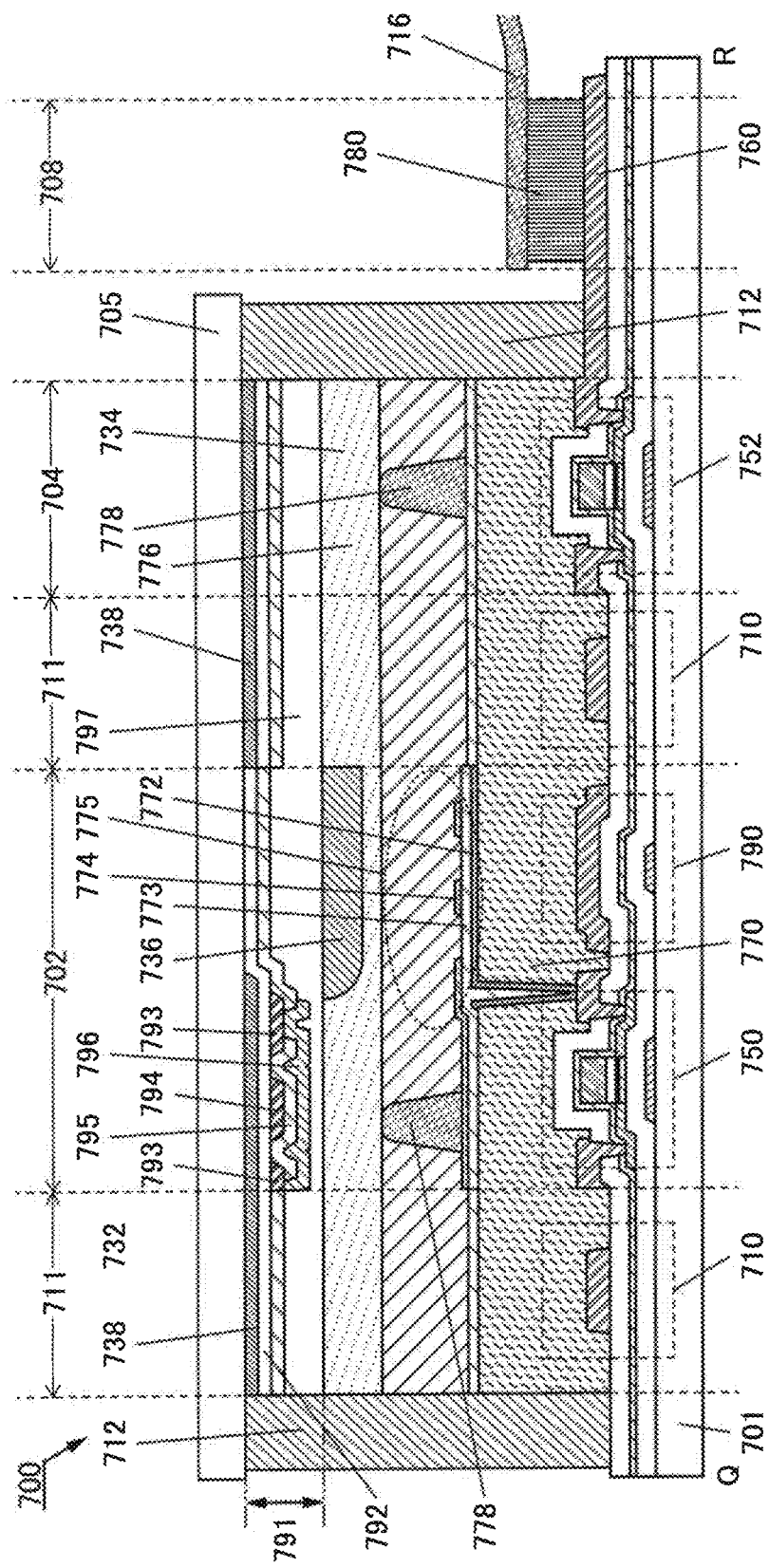
FIG. 19 is a cross-sectional view illustrating one embodiment of a display device.
Figure 20:
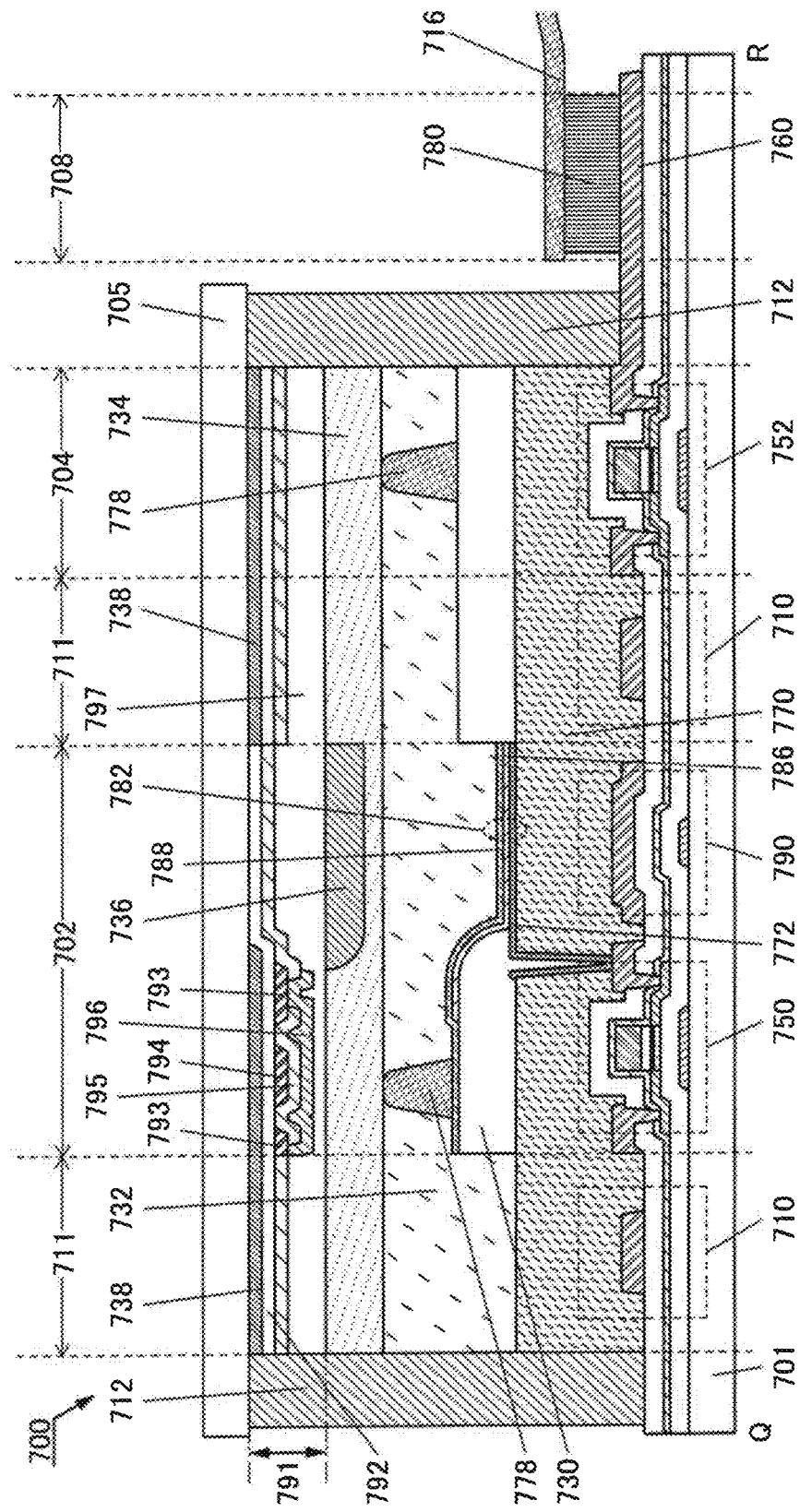
FIG. 20 is a cross-sectional view illustrating one embodiment of a display device.

FIG. 19 illustrates a structure in which the display device 700 illustrated in FIG. 17 includes a touch panel 791. FIG. 20 illustrates a structure in which the display device 700 illustrated in FIG. 18 includes the touch panel 791.

FIG. 19 is a cross-sectional view of the structure in which the touch panel 791 is provided in the display device 700 illustrated in FIG. 17, and FIG. 20 is a cross-sectional view of the structure in which the touch panel 791 is provided in the display device 700 illustrated in FIG. 18.

First, the touch panel 791 illustrated in FIG. 19 and FIG. 20 will be described below.

The touch panel 791 illustrated in FIG. 19 and FIG. 20 is what is called an in-cell touch panel provided between the substrate 705 and the coloring film 736. The touch panel 791 is formed on the substrate 705 side before the coloring film 736 is formed.

Note that the touch panel 791 includes the light-blocking film 738, an insulating film 792, an electrode 793, an electrode 794, an insulating film 795, an electrode 796, and an insulating film 797. Changes in the mutual capacitance in the electrodes 793 and 794 can be detected when an object such as a finger or a stylus approaches, for example.

A portion in which the electrode 793 intersects with the electrode 794 is illustrated in the upper portion of the transistor 750 illustrated in FIG. 19 and FIG. 20. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 19 and FIG. 20 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking film 738. As illustrated in FIG. 19, it is preferable that the electrode 793 do not overlap with the light-emitting element 775. As illustrated in FIG. 20, it is preferable that the electrode 793 do not overlap with the liquid crystal element 782. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be obtained. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance of visible light is high, resistance of the electrodes 793 and 794 can be reduced, whereby sensitivity of the sensor of the touch panel can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 793, 794, and 796, the transmittance of visible light can be greater than or equal to 89% and the sheet resistance can be greater than or equal to 40 Ω/square and less than or equal to 100 Ω/square.

Although the structure of the in-cell touch panel is illustrated in FIG. 19 and FIG. 20, one embodiment of the present invention is not limited thereto. For example, a touch panel formed over the display device 700, what is called an on-cell touch panel, or a touch panel attached to the display device 700, what is called an out-cell touch panel may be used.

In this manner, the display device of one embodiment of the present invention can be combined with various types of touch panels.

Note that the structures described in this embodiment can be combined as appropriate with any of the structures described in the other embodiments.

Embodiment 7

In this embodiment, a display device including a semiconductor device of one embodiment of the present invention will be described with reference to FIGS. 23A to 23C.

<4. Circuit Configuration of Display Device>

A display device illustrated in FIG. 23A includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 23A:
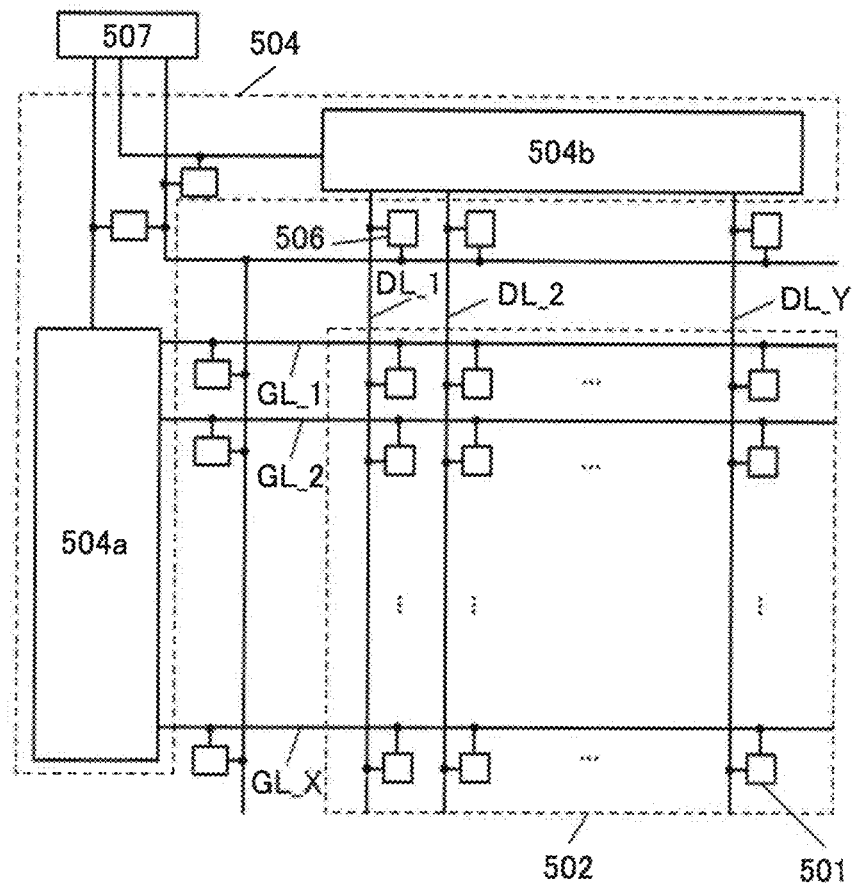
FIGS. 23A to 23C are a block diagram and circuit diagrams each illustrating a display device.

The protection circuit 506 in FIG. 23A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 23A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 23A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single-crystal semiconductor film or a polycrystalline semiconductor film) may be mounted.

Figure 23B:
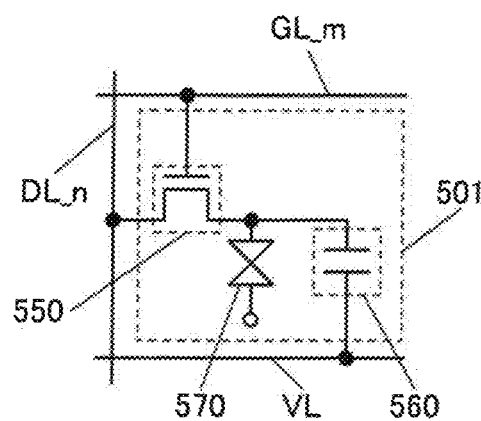

Each of the plurality of pixel circuits 501 in FIG. 23A can have the configuration illustrated in FIG. 23B, for example.

The pixel circuit 501 in FIG. 23B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 23B, the gate driver 504a in FIG. 23A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 23C:
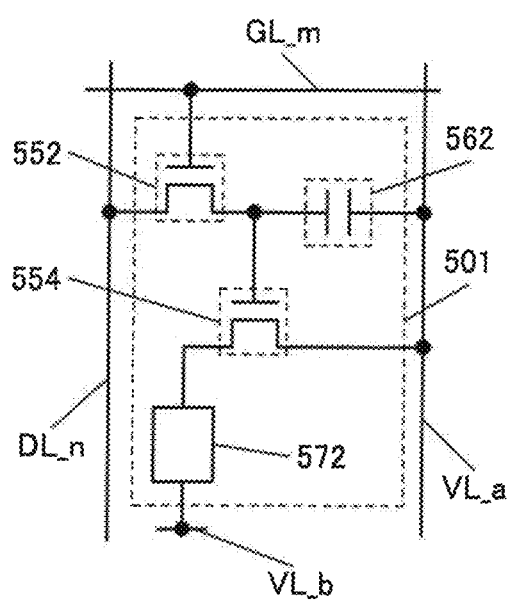

Alternatively, each of the plurality of pixel circuits 501 in FIG. 23A can have the configuration illustrated in FIG. 23C, for example.

The pixel circuit 501 in FIG. 23C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to be turned on or off to control whether a data signal is written.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 23C, the gate driver 504a in FIG. 23A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

Note that the structures described in this embodiment can be combined as appropriate with any of the structures described in the other embodiments.

Embodiment 8

In this embodiment, circuit configuration examples to which the transistors described in the above embodiments can be applied will be described with reference to FIGS. 24A to 24C, FIGS. 25A to 25C, FIGS. 26A and 26B, and FIGS. 27A and 27B.

Note that in the following description in this embodiment, the transistor including an oxide semiconductor described in the above embodiment is referred to as an OS transistor.

<5. Configuration Example of Inverter Circuit>

Figure 24A:
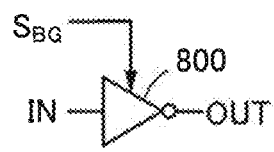
FIGS. 24A to 24C are circuit diagrams and a timing chart showing one embodiment of the present invention.

FIG. 24A is a circuit diagram of an inverter that can be used for a shift register, a buffer, or the like included in the driver circuit. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 24B:
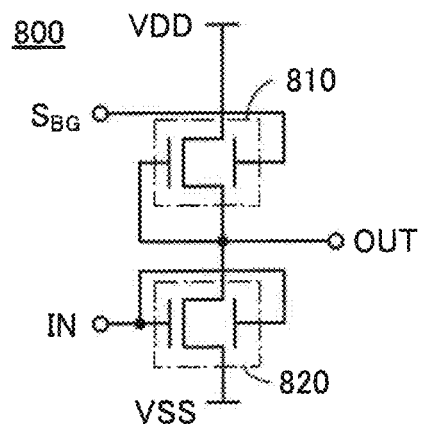

FIG. 24B illustrates an example of the inverter 800. The inverter 800 includes an OS transistor 810 and an OS transistor 820. The inverter 800 can be formed using only n-channel transistors; thus, the inverter 800 can be formed at lower cost than an inverter formed using a complementary metal oxide semiconductor (i.e., a CMOS inverter).

Note that the inverter 800 including the OS transistors can be provided over a CMOS circuit including Si transistors. Since the inverter 800 can be provided so as to overlap with the CMOS circuit, no additional area is required for the inverter 800, and thus, an increase in the circuit area can be suppressed.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to its second terminal. The second gate of the OS transistor 810 is connected to a wiring that supplies the signal $S_{BG}$. The first terminal of the OS transistor 810 is connected to a wiring that supplies a voltage $V_{DD}$. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring that supplies a voltage $V_{SS}$.

Figure 24C:
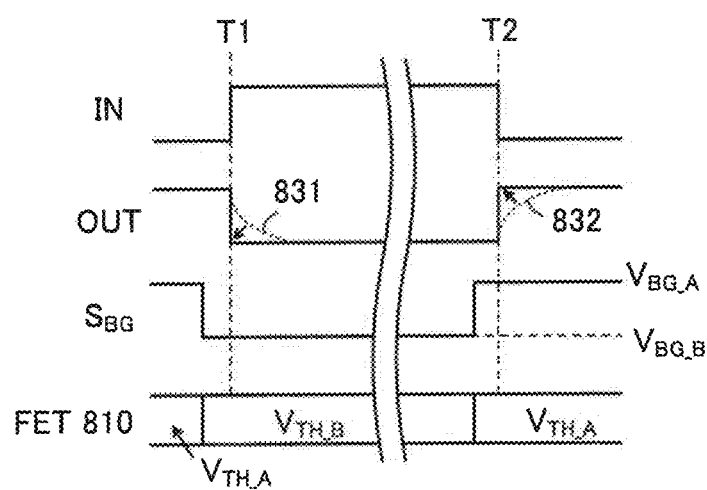

FIG. 24C is a timing chart illustrating the operation of the inverter 800. The timing chart in FIG. 24C illustrates changes of a signal waveform of the input terminal IN, a signal waveform of the output terminal OUT, a signal waveform of the signal $S_{BG}$, and the threshold voltage of the OS transistor 810.

The signal $S_{BG}$ can be supplied to the second gate of the OS transistor 810 to control the threshold voltage of the OS transistor 810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 810 can be shifted in the negative direction to be a threshold voltage $V_{TH\_A}$ when the voltage $V_{BG\_A}$ is applied to the second gate. The threshold voltage of the OS transistor 810 can be shifted in the positive direction to be a threshold voltage $V_{TH\_B}$ when the voltage $V_{BG\_B}$ is applied to the second gate.

Figure 25A:
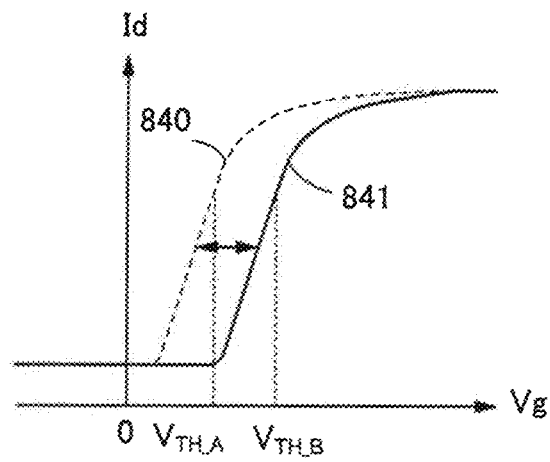
FIGS. 25A to 25C are a graph and circuit diagrams showing one embodiment of the present invention.

To visualize the above description, FIG. 25A shows an $I_d$-$V_g$ curve, which is one of the electrical characteristics of a transistor.

When a high voltage such as the voltage $V_{BG\_A}$ is applied to the second gate, the electrical characteristics of the OS transistor 810 can be shifted to match a curve shown by a dashed line 840 in FIG. 25A. When a low voltage such as the voltage $V_{BG\_B}$ is applied to the second gate, the electrical characteristics of the OS transistor 810 can be shifted to match a curve shown by a solid line 841 in FIG. 25A. As shown in FIG. 25A, switching the signal $S_{BG}$ between the voltage $V_{BG\_A}$ and the voltage $V_{BG\_B}$ enables the threshold voltage of the OS transistor 810 to be shifted in the positive direction or the negative direction.

Figure 25B:
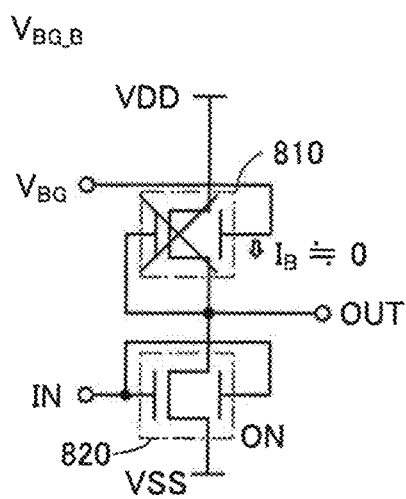

The shift of the threshold voltage in the positive direction toward the threshold voltage $V_{TH\_B}$ can make current less likely to flow in the OS transistor 810. FIG. 25B visualizes this state.

As illustrated in FIG. 25B, a current $I_B$ that flows in the OS transistor 810 can be extremely low. Thus, when a signal supplied to the input terminal IN is at a high level and the OS transistor 820 is on (ON), the voltage of the output terminal OUT can drop sharply.

Since a state in which current is less likely to flow in the OS transistor 810 as illustrated in FIG. 25B can be obtained, a signal waveform 831 of the output terminal in the timing chart in FIG. 24C can be made steep. Shoot-through current between the wiring that supplies the voltage $V_{DD}$ and the wiring that supplies the voltage $V_{SS}$ can be low, leading to low-power operation.

Figure 25C:
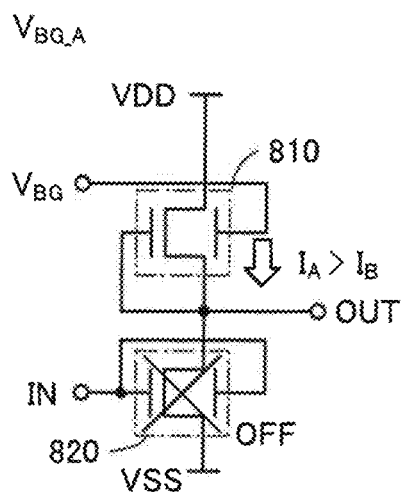

The shift of the threshold voltage in the negative direction toward the threshold voltage $V_{TH\_A}$ can make current flow easily in the OS transistor 810. FIG. 25C visualizes this state. As illustrated in FIG. 25C, a current $I_A$ flowing at this time can be higher than at least the current $I_B$. Thus, when a signal supplied to the input terminal IN is at a low level and the OS transistor 820 is off (OFF), the voltage of the output terminal OUT can be increased sharply. Since a state in which current is likely to flow in the OS transistor 810 as illustrated in FIG. 25C can be obtained, a signal waveform 832 of the output terminal in the timing chart in FIG. 24C can be made steep.

Note that the threshold voltage of the OS transistor 810 is preferably controlled by the signal $S_{BG}$ before the state of the OS transistor 820 is switched, i.e., before time T1 or time T2. For example, as in FIG. 24C, it is preferable that the threshold voltage of the OS transistor 810 be switched from the threshold voltage $V_{TH\_A}$ to the threshold voltage $V_{TH\_A}$ before time T1 at which the level of the signal supplied to the input terminal IN is switched to a high level. Moreover, as in FIG. 24C, it is preferable that the threshold voltage of the OS transistor 810 be switched from the threshold voltage $V_{TH\_B}$ to the threshold voltage $V_{TH\_A}$ before time T2 at which the level of the signal supplied to the input terminal IN is switched to a low level.

Figure 26A:
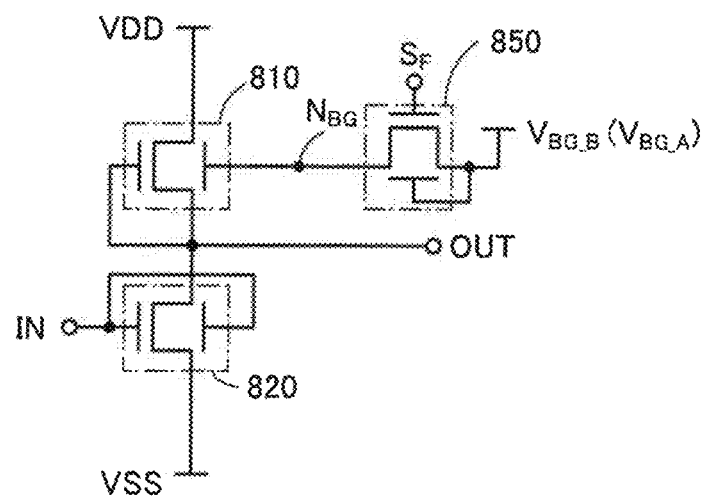
FIGS. 26A and 26B are a circuit diagram and a timing chart showing one embodiment of the present invention.

Although the timing chart in FIG. 24C illustrates the structure in which the level of the signal SBG is switched in accordance with the signal supplied to the input terminal IN, a different structure may be employed in which voltage for controlling the threshold voltage is held by the second gate of the OS transistor 810 in a floating state, for example. FIG. 26A illustrates an example of such a circuit configuration.

The circuit configuration in FIG. 26A is the same as that in FIG. 24B, except that an OS transistor 850 is added. A first terminal of the OS transistor 850 is connected to the second gate of the OS transistor 810. A second terminal of the OS transistor 850 is connected to a wiring that supplies the voltage $V_{BG\_B}$ (or the voltage $V_{BG\_A}$). A first gate of the OS transistor 850 is connected to a wiring that supplies a signal $S_F$. A second gate of the OS transistor 850 is connected to the wiring that supplies the voltage $V_{BG\_B}$ (or the voltage $V_{BG\_A}$).

Figure 26B:
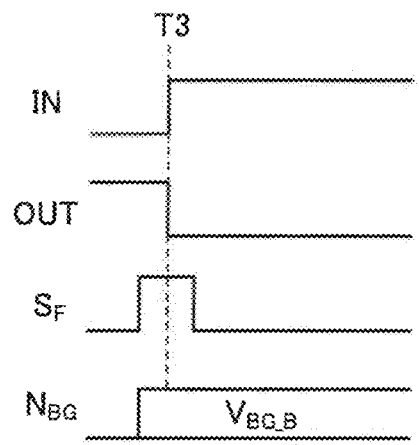

The operation with the circuit configuration in FIG. 26A will be described with reference to a timing chart in FIG. 26B.

The voltage for controlling the threshold voltage of the OS transistor 810 is supplied to the second gate of the OS transistor 810 before time T3 at which the level of the signal supplied to the input terminal IN is switched to a high level. The signal SF is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. Since the off-state current of the OS transistor 850 is extremely low, the voltage $V_{BG\_B}$ held by the node $N_{BG}$ can be retained while the OS transistor 850 remains off. Thus, the number of times the voltage $V_{BG\_B}$ is supplied to the second gate of the OS transistor 850 can be reduced and accordingly, the power consumption for rewriting the voltage $V_{BG\_B}$ can be reduced.

Figure 27A:
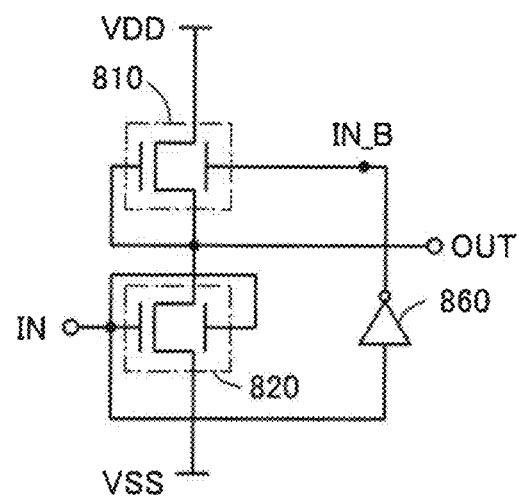
FIGS. 27A and 27B are a circuit diagram and a timing chart showing one embodiment of the present invention.

Although FIG. 24B and FIG. 26A each illustrate the case where the voltage is supplied to the second gate of the OS transistor 810 by control from the outside, a different structure may be employed in which voltage for controlling the threshold voltage is generated on the basis of the signal supplied to the input terminal IN and supplied to the second gate of the OS transistor 810, for example. FIG. 27A illustrates an example of such a circuit configuration.

The circuit configuration in FIG. 27A is the same as that in FIG. 24B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 27A is described with reference to a timing chart in FIG. 27B. The timing chart in FIG. 27B illustrates changes of a signal waveform of the input terminal IN, a signal waveform of the output terminal OUT, an output waveform IN_B of the CMOS inverter 860, and a threshold voltage of the OS transistor 810.

The output waveform IN_B that corresponds to a signal whose logic is inverted from the logic of the signal supplied to the input terminal IN can be used as a signal that controls the threshold voltage of the OS transistor 810. Thus, the threshold voltage of the OS transistor 810 can be controlled as described with reference to FIGS. 25A to 25C. For example, the signal supplied to the input terminal IN is at a high level and the OS transistor 820 is turned on at time T4 in FIG. 27B. At this time, the output waveform IN_B is at a low level. Accordingly, current can be made less likely to flow in the OS transistor 810; thus, the voltage of the output terminal OUT can be sharply decreased.

Figure 27B:
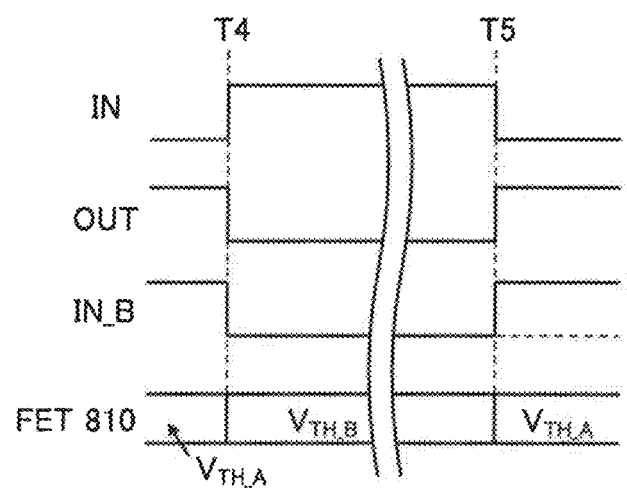

Moreover, the signal supplied to the input terminal IN is at a low level and the OS transistor 820 is turned off at time T5 in FIG. 27B. At this time, the output waveform IN_B is at a high level. Accordingly, current can easily flow in the OS transistor 810; thus, a rise in the voltage of the output terminal OUT can be made steep.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

Note that the structures described in this embodiment can be combined as appropriate with any of the structures described in the other embodiments.

Embodiment 9

In this embodiment, examples of a semiconductor device in which transistors including an oxide semiconductor (OS transistors) described in the above embodiment are used in a plurality of circuits will be described with reference to FIGS. 28A to 28E, FIGS. 29A and 29B, FIGS. 30A and 30B, and FIGS. 31A to 31C.

<6. Circuit Configuration Example of Semiconductor Device>

Figure 28A:
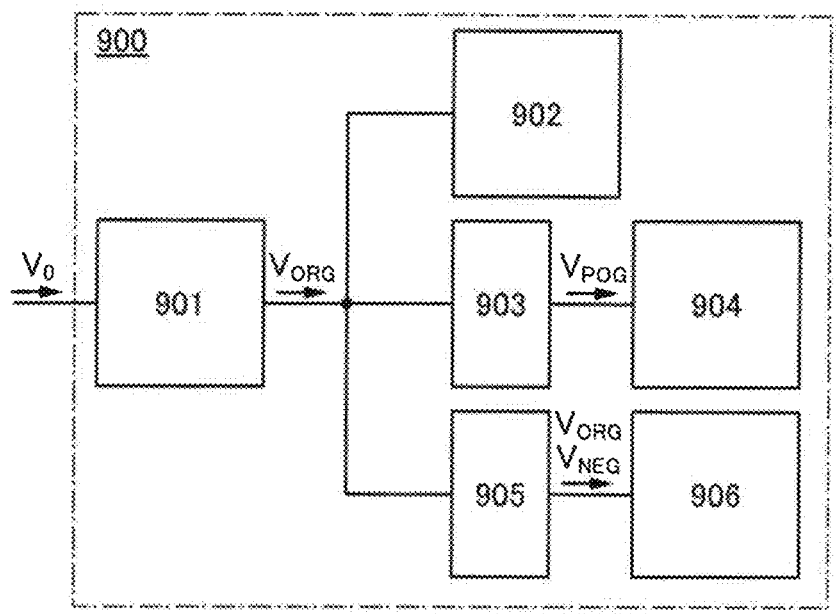
FIGS. 28A to 28E are a block diagram, circuit diagrams, and waveform diagrams illustrating one embodiment of the present invention.

FIG. 28A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without the supply of a plurality of power supply voltages from the outside.

The circuits 902, 904, and 906 operate with different power supply voltages. For example, the power supply voltage of the circuit 902 is a voltage applied on the basis of the voltage $V_{ORG}$ and the voltage $V_{SS}$ ($V_{ORG}>V_{SS}$). For example, the power supply voltage of the circuit 904 is a voltage applied on the basis of a voltage $V_{POG}$ and the voltage $V_{SS}$ ($V_{POG}>V_{ORG}$). For example, the power supply voltages of the circuit 906 are voltages applied on the basis of the voltage $V_{ORG}$, the voltage $V_{SS}$, and a voltage $V_{NEG}$ ($V_{ORG}>V_{SS}>V_{NEG}$). When the voltage $V_{SS}$ is equal to a ground potential (GND), the kinds of voltages generated in the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 28B:
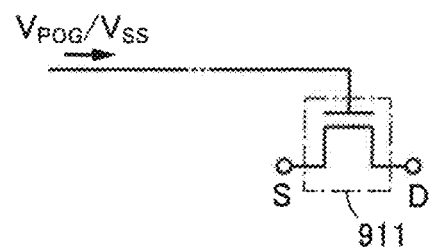
Figure 28D:
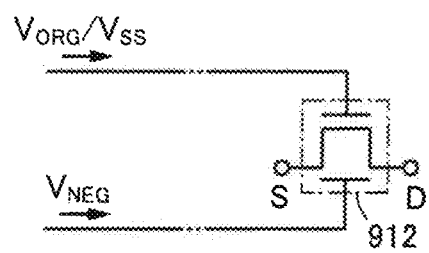
Figure 28C:
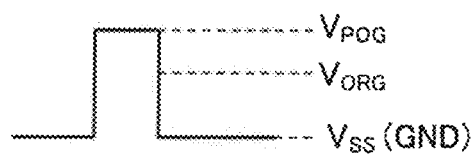

FIG. 28B illustrates an example of the circuit 904 that operates with the voltage $V_{POG}$ and FIG. 28C illustrates an example of a waveform of a signal for operating the circuit 904.

FIG. 28B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ at the time when the transistor 911 is turned on and on the basis of the voltage $V_{SS}$ at the time when the transistor 911 is turned off. As shown in FIG. 28C, the voltage $V_{POG}$ is higher than the voltage $V_{ORG}$. Therefore, a conducting state between a source (S) and a drain (D) of the transistor 911 can be obtained more surely. As a result, the frequency of malfunction of the circuit 904 can be reduced.

Figure 28E:

FIG. 28D illustrates an example of the circuit 906 that operates with the voltage $V_{NEG}$ and FIG. 28E illustrates an example of a waveform of a signal for operating the circuit 906.

FIG. 28D illustrates a transistor 912 having a back gate. A signal supplied to a gate of the transistor 912 is generated on the basis of, for example, the voltage $V_{ORG}$ and the voltage $V_{SS}$. The signal is generated on the basis of the voltage $V_{ORG}$ at the time when the transistor 912 is turned on and on the basis of the voltage $V_{SS}$ at the time when the transistor 912 is turned off. A signal supplied to the back gate of the transistor 912 is generated on the basis of the voltage $V_{NEG}$. As shown in FIG. 28E, the voltage $V_{NEG}$ is lower than the voltage $V_{SS}$ (GND). Therefore, the threshold voltage of the transistor 912 can be controlled so as to be shifted in the positive direction. Thus, the transistor 912 can be surely turned off and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may be supplied to the back gate of the transistor 912.

Figure 29A:
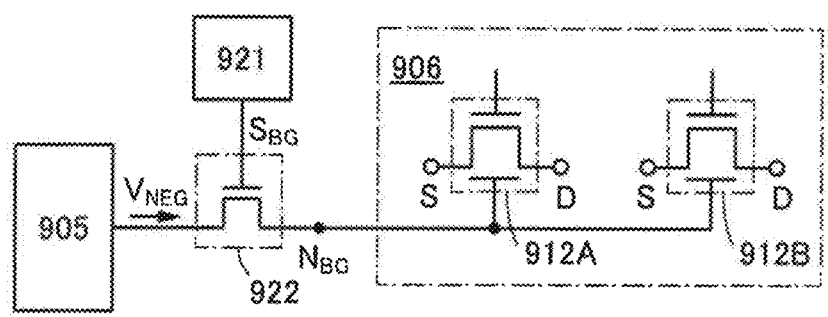
FIGS. 29A and 29B are a circuit diagram and a timing chart showing one embodiment of the present invention.
Figure 29B:
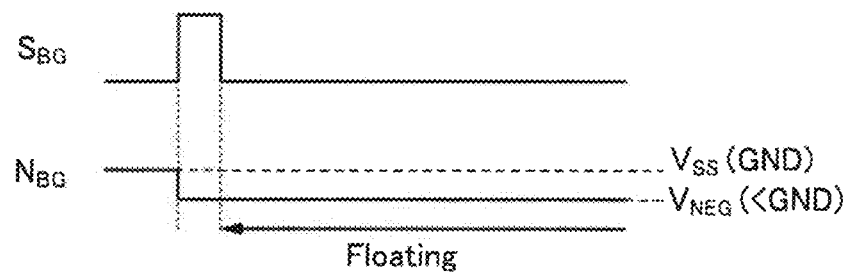

FIGS. 29A and 29B illustrate a modification example of FIGS. 28D and 28E.

In a circuit diagram illustrated in FIG. 29A, a transistor 922 whose conduction state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the conduction state of the transistor 922. Transistors 912A and 912B included in the circuit 906 are the same OS transistors as the transistor 922.

A timing chart in FIG. 29B shows changes in the potential of the control signal $S_{BG}$ and the potential of a node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 30A:
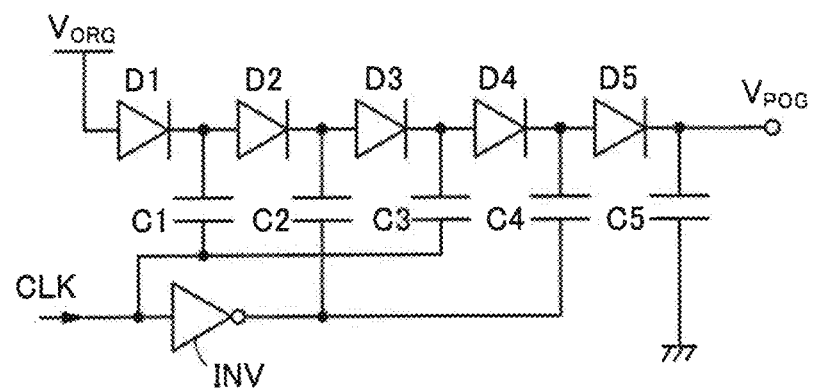
FIGS. 30A and 30B are circuit diagrams illustrating one embodiment of the present invention.

FIG. 30A illustrates an example of a circuit configuration applicable to the above-described voltage generation circuit 903. The voltage generation circuit 903 illustrated in FIG. 30A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, in response to the application of the clock signal CLK, the voltage $V_{POG}$ can be obtained by increasing the voltage $V_{ORG}$ by a voltage five times a potential difference between the voltage $V_{ORG}$ and the voltage $V_{SS}$. Note that a forward voltage of the diodes D1 to D5 is 0 V. A desired voltage $V_{POG}$ can be obtained when the number of stages of the charge pump is changed.

Figure 30B:
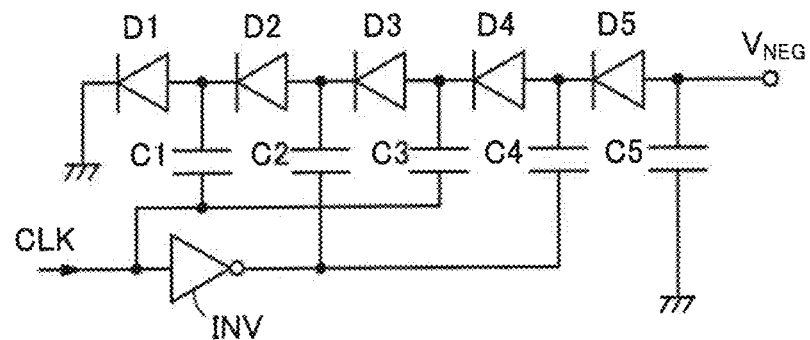

FIG. 30B illustrates an example of a circuit configuration applicable to the above-described voltage generation circuit 905. The voltage generation circuit 905 illustrated in FIG. 30B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, in response to the application of the clock signal CLK, the voltage $V_{NEG}$ can be obtained by decreasing the ground voltage, i.e., the voltage $V_{SS}$ by a voltage four times the potential difference between the voltage $V_{ORG}$ and the voltage $V_{SS}$. Note that a forward voltage of the diodes D1 to D5 is 0 V. A desired voltage $V_{NEG}$ can be obtained when the number of stages of the charge pump is changed.

Figure 31A:
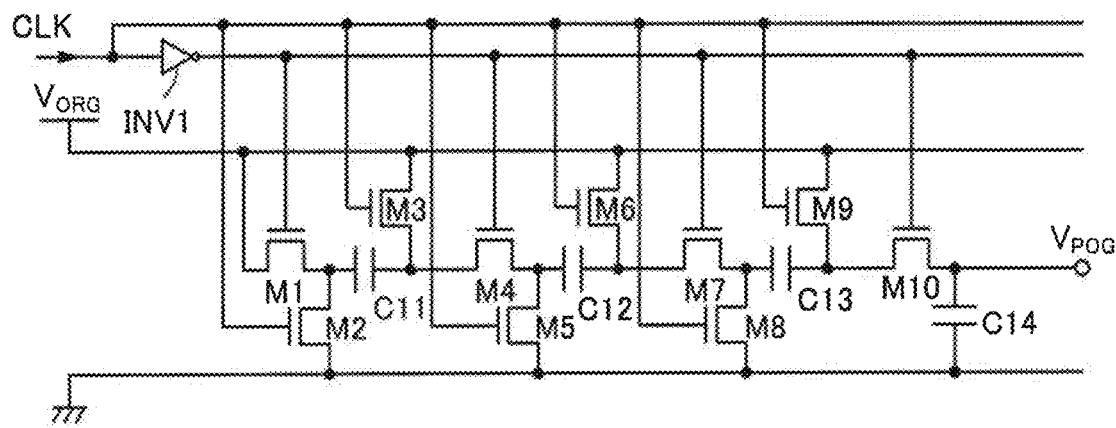
FIGS. 31A to 31C are circuit diagrams each illustrating one embodiment of the present invention.
Figure 31B:
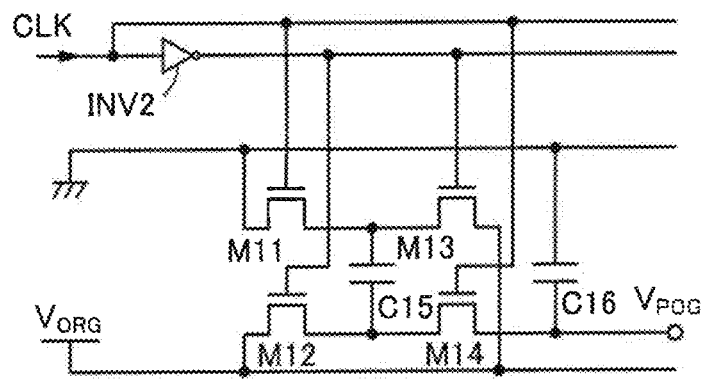
Figure 31C:
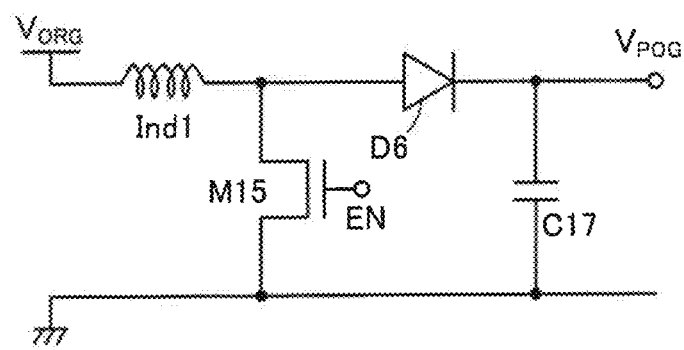

The circuit configuration of the voltage generation circuit 903 is not limited to the configuration of the circuit diagram illustrated in FIG. 30A. Modification examples of the voltage generation circuit 903 are shown in FIGS. 31A to 31C. Note that further modification examples of the voltage generation circuit 903 can be realized by changing voltages supplied to wirings or arrangement of elements in voltage generation circuits 903A to 903C illustrated in FIGS. 31A to 31C.

The voltage generation circuit 903A illustrated in FIG. 31A includes transistors M1 to M10, capacitors C11 to C14, and an inverter INV1. The clock signal CLK is supplied to gates of the transistors M1 to M10 directly or through the inverter INV1. In response to the application of the clock signal CLK, the voltage $V_{POG}$ can be obtained by increasing the voltage $V_{ORG}$ by a voltage four times the potential difference between the voltage $V_{ORG}$ and the voltage $V_{SS}$. A desired voltage $V_{POG}$ can be obtained when the number of stages is changed. In the voltage generation circuit 903A in FIG. 31A, off-state current of each of the transistors M1 to M10 can be low when the transistors M1 to M10 are OS transistors, and leakage of charge held in the capacitors C11 to C14 can be suppressed. Accordingly, raising from the voltage $V_{ORG}$ to the voltage $V_{POG}$ can be efficiently performed.

The voltage generation circuit 903B illustrated in FIG. 31B includes transistors M11 to M14, capacitors C15 and C16, and an inverter INV2. The clock signal CLK is supplied to gates of the transistors M11 to M14 directly or through the inverter INV2. In response to the application of the clock signal CLK, the voltage $V_{POG}$ can be obtained by increasing the voltage $V_{ORG}$ by a voltage twice the potential difference between the voltage $V_{ORG}$ and the voltage $V_{SS}$. In the voltage generation circuit 903B in FIG. 31B, off-state current of each of the transistors M11 to M14 can be low when the transistors M11 to M14 are OS transistors, and leakage of charge held in the capacitors C15 and C16 can be suppressed. Accordingly, raising from the voltage $V_{ORG}$ to the voltage $V_{POG}$ can be efficiently performed.

The voltage generation circuit 903C in FIG. 31C includes an inductor Ind1, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 903C in FIG. 31C increases the voltage using the inductor Ind1, the voltage can be increased efficiently.

As described above, in any of the structures of this embodiment, a voltage required for circuits included in a semiconductor device can be internally generated. Thus, in the semiconductor device, the kinds of power supply voltages supplied from the outside can be reduced.

Note that the structures and the like described in this embodiment can be combined as appropriate with any of the structures described in the other embodiments.

Embodiment 10

In this embodiment, a display module and electronic devices, each of which includes a semiconductor device of one embodiment of the present invention, will be described with reference to FIG. 32, FIGS. 33A to 33E, FIGS. 34A to 34G, and FIGS. 35A and 35B.

<7-1. Display Module>

Figure 32:
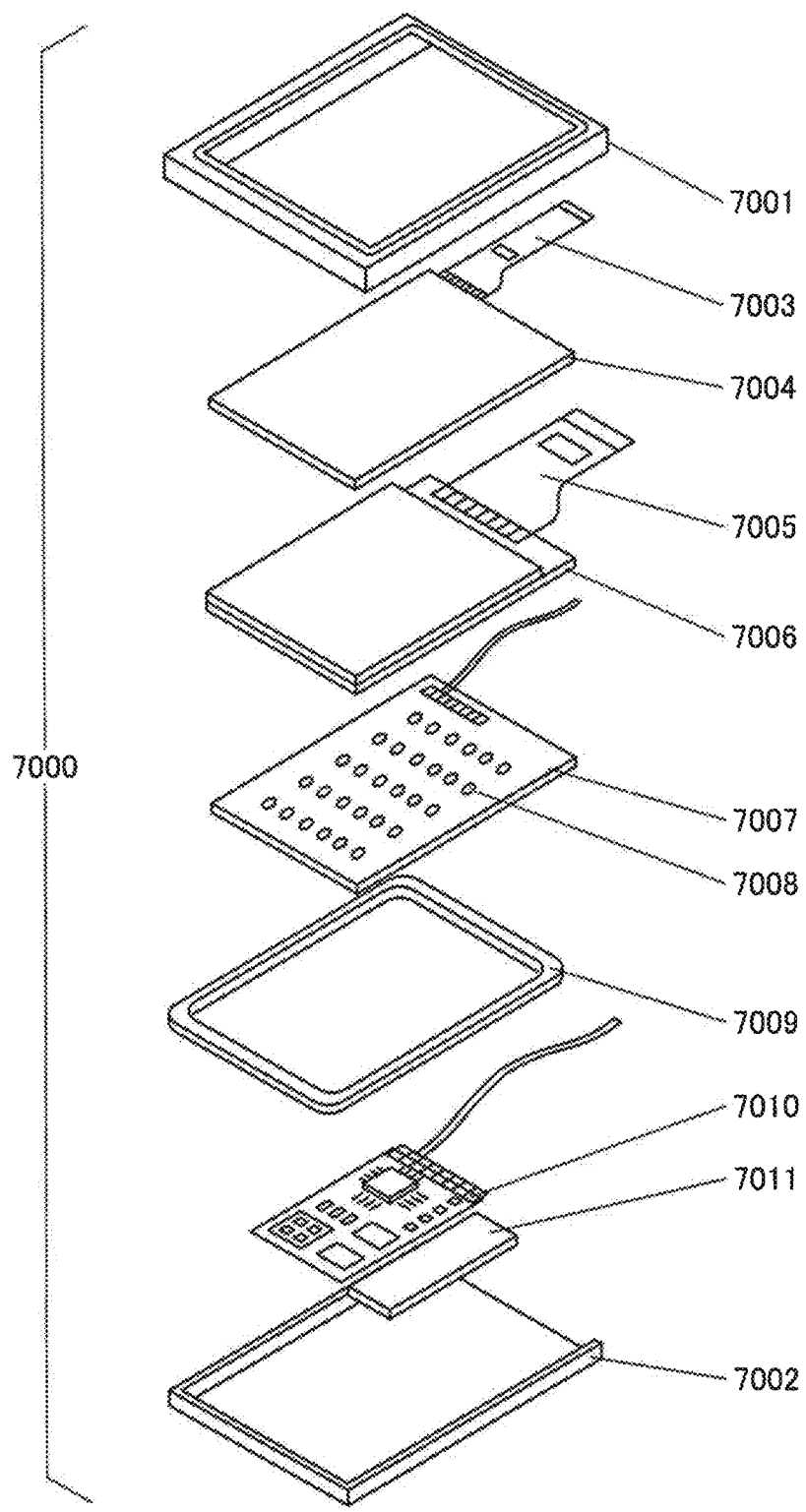
FIG. 32 illustrates a display module.

In a display module 7000 illustrated in FIG. 32, a touch panel 7004 connected to an FPC 7003, a display panel 7006 connected to an FPC 7005, a backlight 7007, a frame 7009, a printed board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 32, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed board 7010. The frame 7009 may also function as a radiator plate.

The printed board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<7-2. Electronic Device 1>

Next, FIGS. 33A to 33E illustrate examples of electronic devices.

Figure 33A:
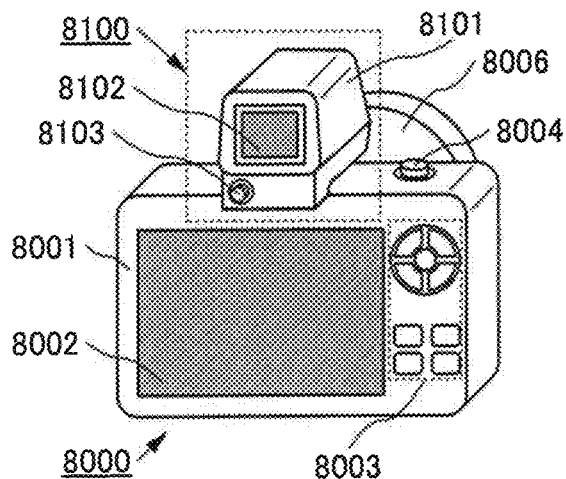
FIGS. 33A to 33E illustrate electronic devices.

FIG. 33A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the lens 8006 of the camera 8000 here is detachable from the housing 8001 for replacement, the lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The on/off state of the display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 33A, the housing 8001 of the camera 8000 may include a finder having a display device.

Figure 33B:
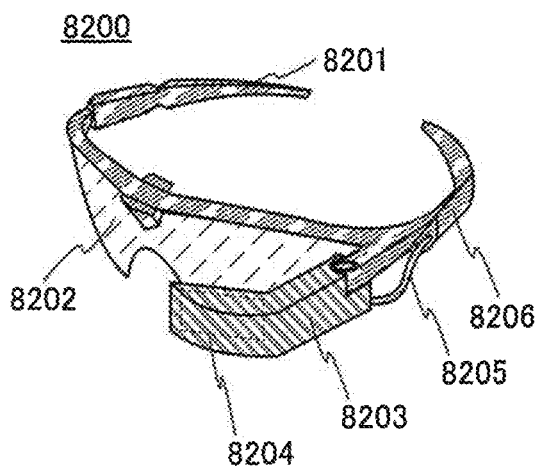

FIG. 33B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 33C:
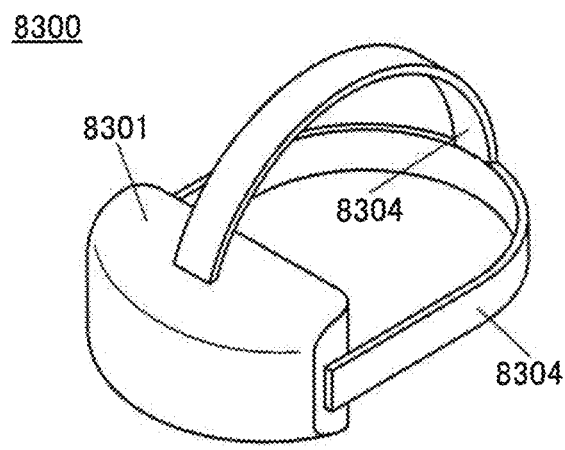
Figure 33D:
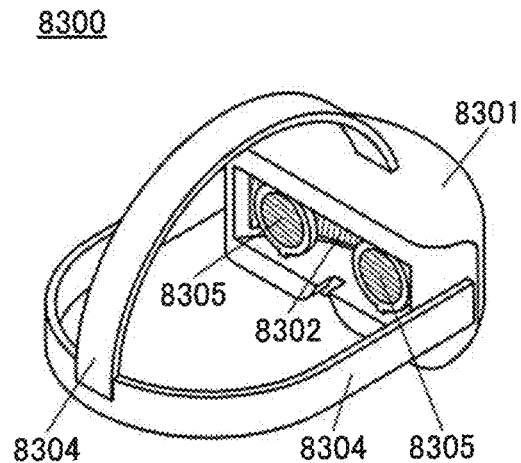
Figure 33E:
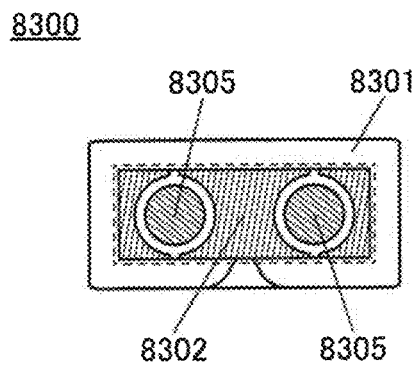

FIGS. 33C to 33E are external views of a head-mounted display 8300. The head-mounted display 8300 includes a housing 8301, a display portion 8302, a fixing band 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 33E, the user does not perceive pixels, and thus a more realistic image can be displayed.

<7-3. Electronic Device 2>

Next, FIGS. 34A to 34G illustrate examples of electronic devices that are different from those illustrated in FIGS. 33A to 33E.

Electronic devices illustrated in FIGS. 34A to 34G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 34A to 34G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 34A to 34G are not limited thereto, and the electronic devices can have a variety of functions. Although not illustrated in FIGS. 34A to 34G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 34A to 34G will be described in detail below.

Figure 34A:
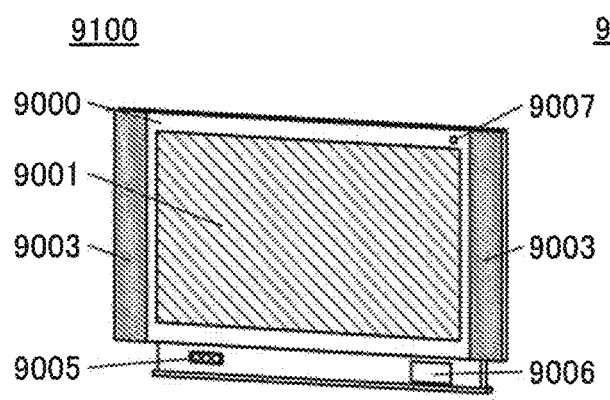
FIGS. 34A to 34G illustrate electronic devices.

FIG. 34A is a perspective view illustrating a television device 9100. The television device 9100 can include the display portion 9001 having a large screen size of, for example, 50 inches or more, or 100 inches or more.

Figure 34B:
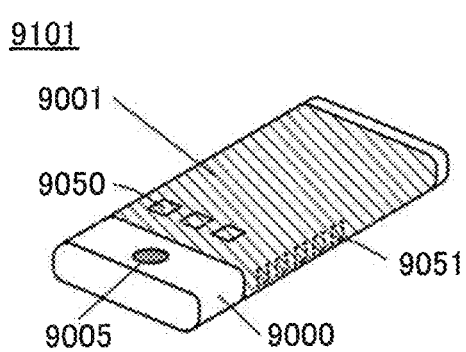

FIG. 34B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include the speaker 9003, the connection terminal 9006, the sensor 9007, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 34C:
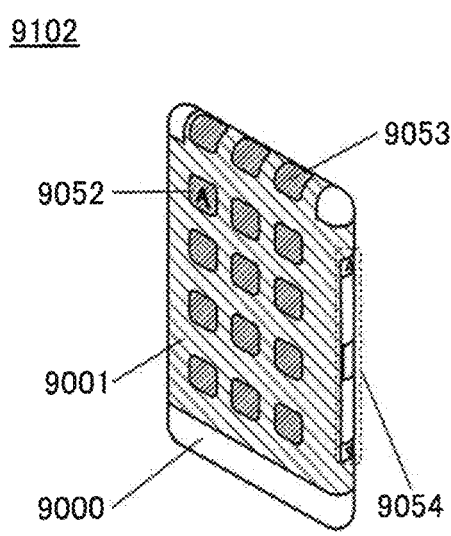

FIG. 34C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

Figure 34D:
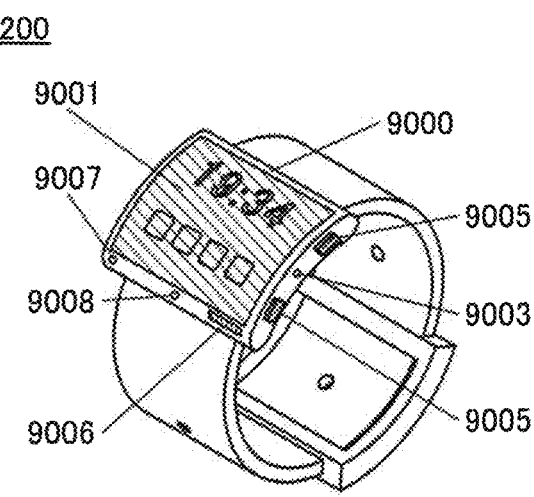

FIG. 34D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 34E:
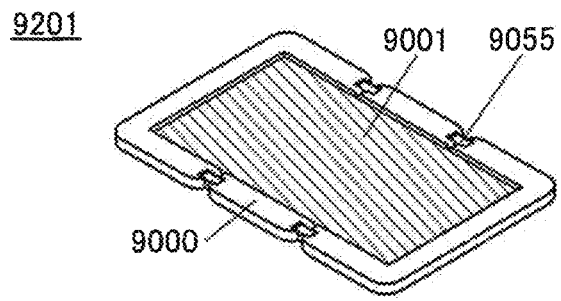
Figure 34F:
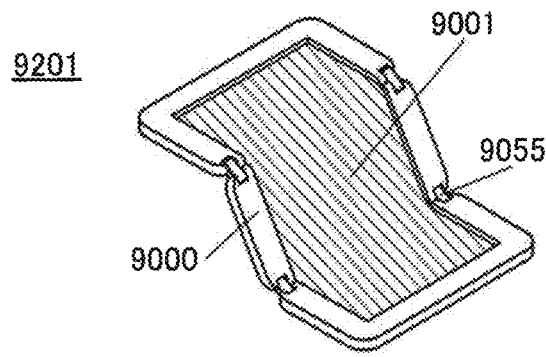
Figure 34G:
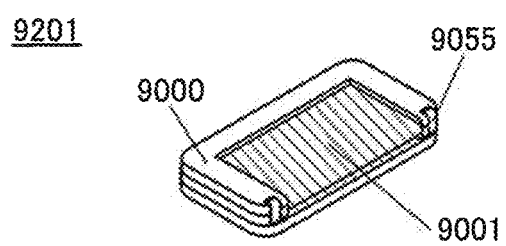

FIGS. 34E, 34F, and 34G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Figure 35A:
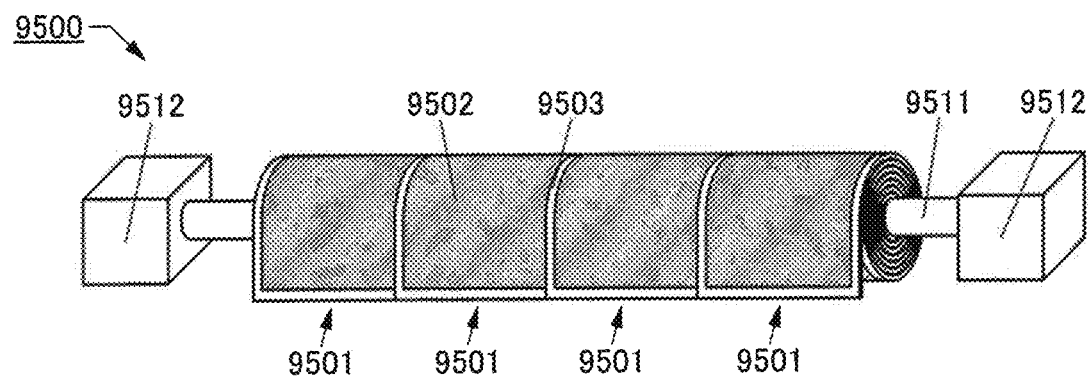
FIGS. 35A and 35B are perspective views illustrating a display device.
Figure 35B:
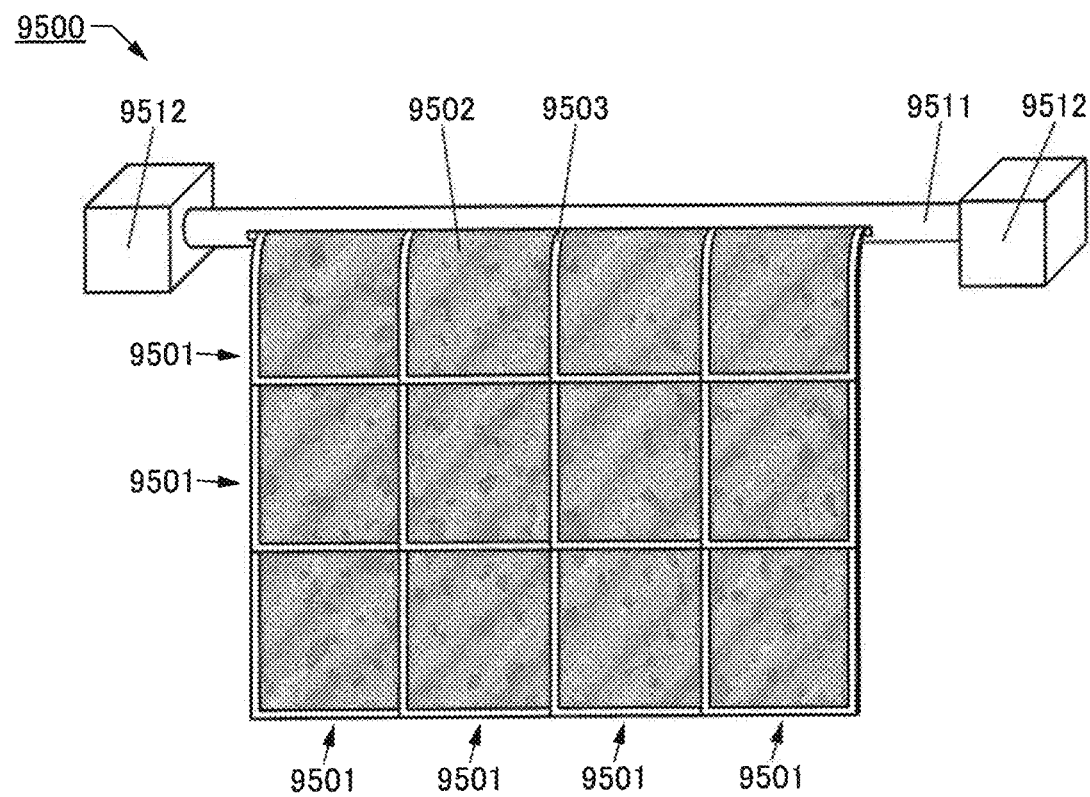

Next, an example of an electronic device that is different from the electronic devices illustrated in FIGS. 33A to 33E and FIGS. 34A to 34G is illustrated in FIGS. 35A and 35B. FIGS. 35A and 35B are perspective views of a display device including a plurality of display panels. The plurality of display panels are wound in the perspective view in FIG. 35A and are unwound in the perspective view in FIG. 35B.

A display device 9500 illustrated in FIGS. 35A and 35B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can overlap with each other. A display device having a large screen can be obtained with the plurality of display panels 9501. The display device is highly versatile because the display panels 9501 can be wound depending on its use.

Although the display regions 9502 of the adjacent display panels 9501 are separated from each other in FIGS. 35A and 35B, without limitation to this structure, the display regions 9502 of the adjacent display panels 9501 may overlap with each other without any space so that a continuous display region 9502 is obtained, for example.

Electronic devices described in this embodiment are characterized by having a display portion for displaying some sort of information. Note that the semiconductor device of one embodiment of the present invention can also be used for an electronic device that does not have a display portion.

Note that the structures described in this embodiment can be combined as appropriate with any of the structures described in the other embodiments.

Embodiment 11

<Semiconductor Circuit>

The transistors disclosed in this specification and the like can be used in a variety of semiconductor circuits, e.g., logic circuits such as an OR circuit, an AND circuit, a NAND circuit, and a NOR circuit, an inverter circuit, a buffer circuit, a shift register circuit, a flip-flop circuit, an encoder circuit, a decoder circuit, an amplifier circuit, an analog switch circuit, an integrator circuit, a differentiation circuit, a memory element, and the like.

Figure 46A:
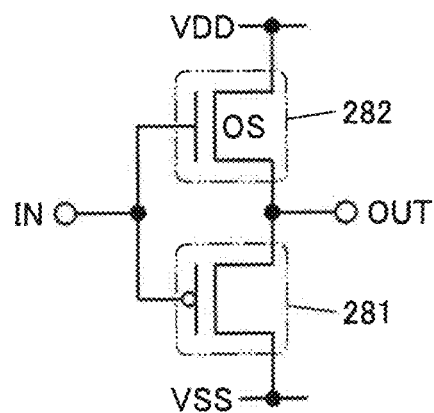
FIGS. 46A to 46C are each a circuit diagram of a semiconductor device of one embodiment of the present invention.
Figure 46B:
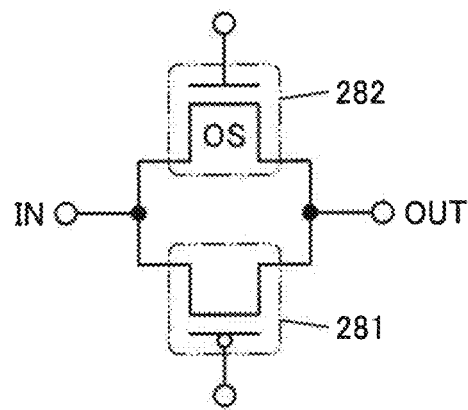
Figure 46C:
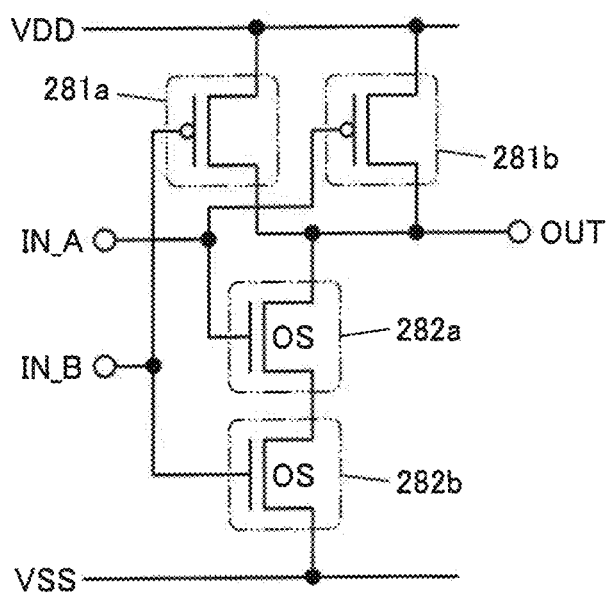

Examples of a semiconductor circuit including the transistor disclosed in this specification and the like are illustrated in circuit diagrams in FIGS. 46A to 46C. In the circuit diagrams, "OS" is given beside the circuit symbol of a transistor including an oxide semiconductor, in order to clearly demonstrate that the transistor includes an oxide semiconductor.

The semiconductor circuit illustrated in FIG. 46A has a configuration of an inverter circuit in which the p-channel transistor 281 and the n-channel transistor 282 are connected to each other in series and in which gates of the transistors are connected to each other.

The semiconductor circuit illustrated in FIG. 46B has a configuration of an analog switch circuit in which the p-channel transistor 281 and the n-channel transistor 282 are connected to each other in parallel.

The semiconductor circuit illustrated in FIG. 46C has a configuration of a NAND circuit including a transistor 281*a*, a transistor 281*b*, a transistor 282*a*, and a transistor 282*b*. A potential output from the NAND circuit changes depending on the combination of potentials input to an input terminal IN_A and an input terminal IN_B.

<Memory Device>

Figure 47A:
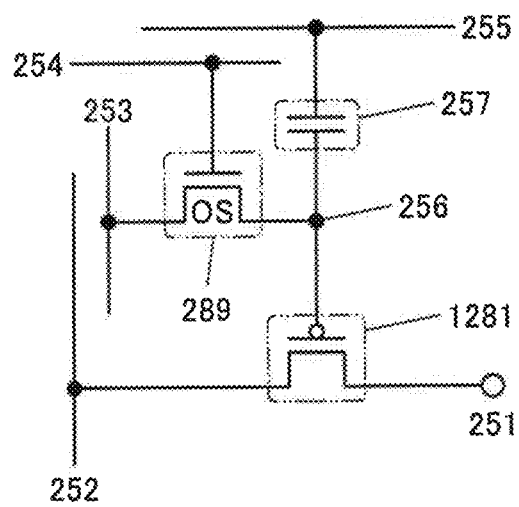
FIGS. 47A and 47B are each a circuit diagram of a semiconductor device of one embodiment of the present invention.

The semiconductor circuit illustrated in FIG. 47A has a configuration of a memory device in which one of a source and a drain of a transistor 289 is connected to a gate of a transistor 1281 and one electrode of a capacitor 257. The circuit illustrated in FIG. 47B has a configuration of a memory device in which one of the source and the drain of the transistor 289 is connected to one electrode of the capacitor 257.

Figure 47B:
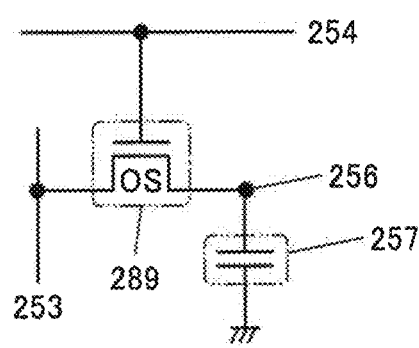

In each of the semiconductor circuits illustrated in FIGS. 47A and 47B, charges injected from the other of the source and the drain of the transistor 289 can be stored at a node 256. The transistor 289 is a transistor including an oxide semiconductor, which enables charges to be stored at the node 256 for a long period.

Although the transistor 1281 is a p-channel transistor in FIG. 47A, the transistor 1281 may be an n-channel transistor. For example, the transistor 281 or the transistor 282 may be used as the transistor 1281. An OS transistor may also be used as the transistor 1281.

The semiconductor devices (memory devices) illustrated in FIGS. 47A and 47B are described in detail here.

The semiconductor device illustrated in FIG. 47A includes the transistor 1281 using a first semiconductor, the transistor 289 using a second semiconductor, and the capacitor 257.

The transistor 289 is one of the OS transistors which are disclosed in the above embodiment. Since the off-state current of the transistor 289 is low, stored data can be retained for a long period at a predetermined node of the semiconductor device. In other words, power consumption of the memory device can be reduced because refresh operation becomes unnecessary or the frequency of refresh operation can be extremely low.

In FIG. 47A, a wiring 251 is electrically connected to one of a source and a drain of the transistor 1281, and a wiring 252 is electrically connected to the other of the source and the drain of the transistor 1281. A wiring 253 is electrically connected to one of the source and the drain of the transistor 289. A wiring 254 is electrically connected to a gate of the transistor 289. The gate of the transistor 1281, the other of the source and the drain of the transistor 289, and the one electrode of the capacitor 257 are electrically connected to the node 256. A wiring 255 is electrically connected to the other electrode of the capacitor 257.

The memory device in FIG. 47A has a feature that the charges supplied to the node 256 can be retained, and thus enables writing, retaining, and reading of data as follows.

[Writing and Retaining Operations]

Writing and retaining of data are described. First, the potential of the wiring 254 is set to a potential at which the transistor 289 is on. Accordingly, the potential of the wiring 253 is supplied to the node 256. That is, a predetermined charge is supplied to the node 256 (writing). Here, one of two kinds of charges providing different potential levels (hereinafter referred to as a "low-level charge" and a "high-level charge") is supplied. After that, the potential of the wiring 254 is set to a potential at which the transistor 289 is off. Thus, the charge is retained at the node 256.

Note that the high-level charge is a charge for supplying a higher potential to the node 256 than the low-level charge. In the case where the transistor 1281 is a p-channel transistor, each of the high-level and low-level charges is a charge for supplying a potential higher than the threshold voltage of the transistor 1281. In the case where the transistor 1281 is an n-channel transistor, each of the high-level and low-level charges is a charge for supplying a potential lower than the threshold voltage of the transistor 1281. In other words, each of the high-level and low-level charges is a charge for supplying a potential at which the transistor 1281 is off.

Since the off-state current of the transistor 289 is extremely low, the charge of the node 256 is retained for a long time.

[Reading Operation]

Next, reading of data is described. A reading potential $V_R$ is supplied to the wiring 255 while a predetermined potential (a constant potential) different from the potential of the wiring 252 is supplied to the wiring 251, whereby data retained at the node 256 can be read.

The reading potential $V_R$ is set to $\{(V_{th}-V_H)+(V_{th}+V_L)\}/2$, where $V_H$ is the potential supplied in the case of the high-level charge and $V_L$ is the potential supplied in the case of the low-level charge. Note that the potential of the wiring 255 in a period during which data is not read is set to a potential higher than $V_H$ in the case where the transistor 1281 is a p-channel transistor, and is set to a potential lower than $V_L$ in the case where the transistor 1281 is an re-channel transistor.

For example, in the case where the transistor 1281 is a p-channel transistor, $V_R$ is −2 V when $V_{th}$ of the transistor 1281 is −2 V, $V_H$ is 1 V, and $V_L$ is −1 V. When the potential written to the node 256 is $V_H$ and $V_R$ is applied to the wiring 255, $V_R+V_H$, i.e., −1 V, is applied to the gate of the transistor 1281. Since −1 V is higher than $V_{th}$, the transistor 1281 is not turned on. Thus, the potential of the wiring 252 is not changed. When the potential written to the node 256 is $V_L$ and $V_R$ is applied to the wiring 255, $V_R+V_L$, i.e., −3 V, is applied to the gate of the transistor 1281. Since −3 V is lower than $V_{th}$, the transistor 1281 is turned on. Thus, the potential of the wiring 252 is changed.

In the case where the transistor 1281 is an n-channel transistor, $V_R$ is 2 V when $V_{th}$ of the transistor 1281 is 2 V, $V_H$ is 1 V, and $V_L$ is −1 V. When the potential written to the node 256 is $V_H$ and $V_R$ is applied to the wiring 255, $V_R+V_H$, i.e., 3 V, is applied to the gate of the transistor 1281. Since 3 V is higher than $V_{th}$, the transistor 1281 is turned on. Thus, the potential of the wiring 252 is changed. When the potential written to the node 256 is $V_L$ and $V_R$ is applied to the wiring 255, $V_R+V_L$, i.e., 1 V, is applied to the gate of the transistor 1281. Since 1 V is lower than $V_{th}$, the transistor 1281 is not turned on. Thus, the potential of the wiring 252 is not changed.

By determining the potential of the wiring 252, data retained at the node 256 can be read.

The semiconductor device in FIG. 47B is different from the semiconductor device in FIG. 47A in that the transistor 1281 is not provided. Also in this case, data can be written and retained in a manner similar to that of the semiconductor device in FIG. 47A.

Reading of data in the semiconductor device in FIG. 47B is described. When a potential at which the transistor 289 is turned on is supplied to the wiring 254, the wiring 253 which is in a floating state and the capacitor 257 are brought into conduction, and the charge is redistributed between the wiring 253 and the capacitor 257. As a result, the potential of the wiring 253 is changed. The amount of change in the potential of the wiring 253 varies depending on the potential of the node 256 (or the charge accumulated in the node 256).

For example, the potential of the wiring 253 after the charge redistribution is $(C_B \times V_{B0}+C \times V)/(C_B+C)$, where V is the potential of the node 256, C is the capacitance of the capacitor 257, $C_B$ is the capacitance component of the wiring 253, and $V_{B0}$ is the potential of the wiring 253 before the charge redistribution. Thus, it can be found that, assuming that the memory cell is in either of two states in which the potential of the node 256 is $V_1$ and $V_0$ ($V_1 > V_0$), the potential of the wiring 253 in the case of retaining the potential $V_1$ ($=(C_B \times V_{B0}+C \times V_1)/(C_B+C)$) is higher than the potential of the wiring 253 in the case of retaining the potential $V_0$ ($=(C_B \times V_{B0}+C \times V_0)/(C_B+C)$).

Then, by comparing the potential of the wiring 253 with a predetermined potential, data can be read.

When including a transistor using an oxide semiconductor and having an extremely low off-state current, the memory device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the memory device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the memory device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<CPU>

Figure 48:
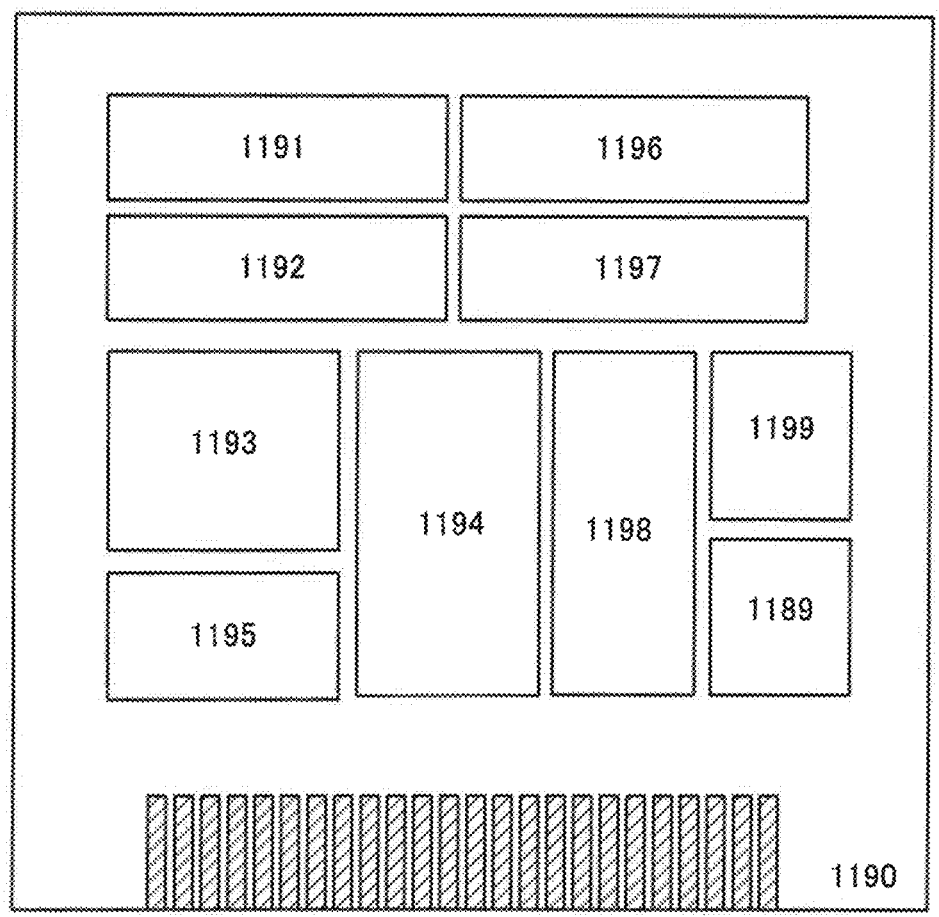
FIG. 48 is a block diagram illustrating a structure example of a CPU.

Next, an example of a CPU including any of the above-described transistors will be described. FIG. 48 is a block diagram illustrating a structure example of a CPU including any of the above-described transistors as a component.

The CPU illustrated in FIG. 48 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 48 is only an example in which the structure is simplified, and an actual CPU may have a variety of configurations depending on the application. For example, the CPU may have the following configuration: a structure including the CPU illustrated in FIG. 48 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 48, a memory cell is provided in the register 1196. For the memory cell of the register 1196, any of the above-described transistors, the above-described memory device, or the like can be used.

In the CPU illustrated in FIG. 48, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to a memory element in the register 1196. When data retaining by the capacitor is selected, the data is rewritten in the capacitor, and supply of power supply voltage to the memory cell in the register 1196 can be stopped.

Figure 49:
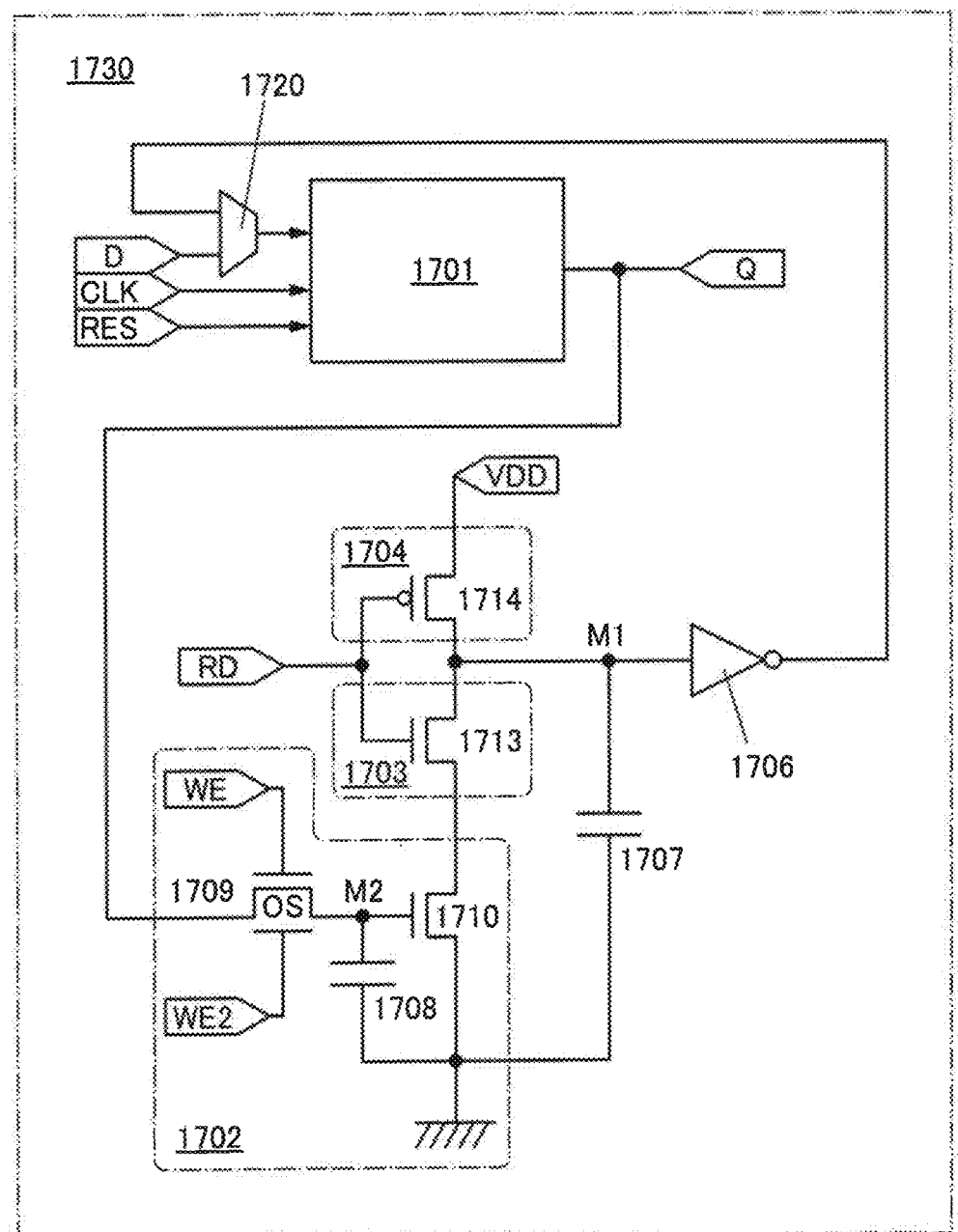
FIG. 49 is a circuit diagram illustrating an example of a memory element.

FIG. 49 is an example of a circuit diagram of a memory element that can be used as the register 1196. A memory element 1730 includes a circuit 1701 in which stored data is volatile when power supply is stopped, a circuit 1702 in which stored data is nonvolatile even when power supply is stopped, a switch 1703, a switch 1704, a logic element 1706, a capacitor 1707, and a circuit 1720 having a selecting function. The circuit 1702 includes a capacitor 1708, a transistor 1709, and a transistor 1710. Note that the memory element 1730 may further include another element such as a diode, a resistor, or an inductor, as needed.

Here, the above-described memory device can be used as the circuit 1702. When supply of a power supply voltage to the memory element 1730 is stopped, a ground potential (0 V) or a potential at which the transistor 1709 in the circuit 1702 is turned off continues to be input to a gate of the transistor 1709. For example, the gate of the transistor 1709 is grounded through a load such as a resistor.

Described here is an example in which the switch 1703 is a transistor 1713 having one conductivity type (e.g., an n-channel transistor) and the switch 1704 is a transistor 1714 having a conductivity type opposite to the one conductivity type (e.g., a p-channel transistor). A first terminal of the switch 1703 corresponds to one of a source and a drain of the transistor 1713, a second terminal of the switch 1703 corresponds to the other of the source and the drain of the transistor 1713, and conduction or non-conduction between the first terminal and the second terminal of the switch 1703 (i.e., the on/off state of the transistor 1713) is selected by a control signal RD input to a gate of the transistor 1713. A first terminal of the switch 1704 corresponds to one of a source and a drain of the transistor 1714, a second terminal of the switch 1704 corresponds to the other of the source and the drain of the transistor 1714, and conduction or non-conduction between the first terminal and the second terminal of the switch 1704 (i.e., the on/off state of the transistor 1714) is selected by the control signal RD input to a gate of the transistor 1714.

One of a source and a drain of the transistor 1709 is electrically connected to one of a pair of electrodes of the capacitor 1708 and a gate of the transistor 1710. Here, the connection portion is referred to as a node M2. One of a source and a drain of the transistor 1710 is electrically connected to a wiring which can supply a low power supply potential (e.g., a GND line), and the other thereof is electrically connected to the first terminal of the switch 1703 (the one of the source and the drain of the transistor 1713). The second terminal of the switch 1703 (the other of the source and the drain of the transistor 1713) is electrically connected to the first terminal of the switch 1704 (the one of the source and the drain of the transistor 1714). The second terminal of the switch 1704 (the other of the source and the drain of the transistor 1714) is electrically connected to a wiring which can supply a power supply potential VDD. The second terminal of the switch 1703 (the other of the source and the drain of the transistor 1713), the first terminal of the switch

1704 (the one of the source and the drain of the transistor 1714), an input terminal of the logic element 1706, and one of a pair of electrodes of the capacitor 1707 are electrically connected to each other. Here, the connection portion is referred to as a node M1. The other of the pair of electrodes of the capacitor 1707 can be supplied with a constant potential. For example, the other of the pair of electrodes of the capacitor 1707 can be supplied with a low power supply potential (e.g., GND) or a high power supply potential (e.g., VDD). The other of the pair of electrodes of the capacitor 1707 is electrically connected to the wiring which can supply a low power supply potential (e.g., a GND line). The other of the pair of electrodes of the capacitor 1708 can be supplied with a constant potential. For example, the other of the pair of electrodes of the capacitor 1708 can be supplied with a low power supply potential (e.g., GND) or a high power supply potential (e.g., VDD). The other of the pair of electrodes of the capacitor 1708 is electrically connected to the wiring which can supply a low power supply potential (e.g., a GND line).

The capacitor 1707 and the capacitor 1708 are not necessarily provided as long as the parasitic capacitance of the transistor, the wiring, or the like is actively utilized.

A control signal WE is input to the gate electrode of the transistor 1709. As for each of the switch 1703 and the switch 1704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1701 is input to the other of the source and the drain of the transistor 1709. FIG. 49 illustrates an example in which a signal output from the circuit 1701 is input to the other of the source and the drain of the transistor 1709. The logic value of a signal output from the second terminal of the switch 1703 (the other of the source and the drain of the transistor 1713) is inverted by the logic element 1706, and the inverted signal is input to the circuit 1701 through the circuit 1720.

In the example of FIG. 49, a signal output from the second terminal of the switch 1703 (the other of the source and the drain of the transistor 1713) is input to the circuit 1701 through the logic element 1706 and the circuit 1720; however, one embodiment of the present invention is not limited thereto. The signal output from the second terminal of the switch 1703 (the other of the source and the drain of the transistor 1713) may be input to the circuit 1701 without its logic value being inverted. For example, in the case where the circuit 1701 includes a node in which a signal obtained by inversion of the logic value of a signal input from the input terminal is retained, the signal output from the second terminal of the switch 1703 (the other of the source and the drain of the transistor 1713) can be input to the node.

As the transistor 1709 in FIG. 49, the transistor 100 described in the above embodiment can be used. The control signal WE can be input to the gate electrode and a control signal WE2 can be input to the back gate electrode. The control signal WE2 is a signal having a constant potential. As the constant potential, for example, a ground potential or a potential lower than a source potential of the transistor 1709 is selected. The control signal WE2 is a potential signal for controlling the threshold voltage of the transistor 1709, and a drain current of the transistor 1709 at a gate voltage of 0 V can be further reduced. Note that as the transistor 1709, a transistor without a second gate may be used.

In FIG. 49, the transistors included in the memory element 1730 except for the transistor 1709 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1730 may be transistors in which a channel is formed in an oxide semiconductor layer. Further alternatively, in the memory element 1730, a transistor in which a channel is formed in an oxide semiconductor layer and a transistor in which a channel is formed in a layer formed using a semiconductor other than an oxide semiconductor or in the substrate 1190 can be used in combination as the transistors other than the transistor 1709.

As the circuit 1701 in FIG. 49, for example, a flip-flop circuit can be used. As the logic element 1706, for example, an inverter or a clocked inverter can be used.

In a period during which the memory element 1730 is not supplied with the power supply voltage, the semiconductor device of one embodiment of the present invention can retain data stored in the circuit 1701 at the node M2 by the capacitor 1708 which is provided in the circuit 1702.

As described above, the off-state current of an OS transistor is extremely low. For example, the off-state current of an OS transistor is significantly lower than that of a transistor in which a channel is formed in silicon having crystallinity. Thus, when the transistor is used as the transistor 1709, a signal retained by the capacitor 1708 is retained for a long time also in a period during which the power supply voltage is not supplied to the memory element 1730. The memory element 1730 can accordingly retain the stored content (data) also in a period during which the supply of the power supply voltage is stopped.

Since the switch 1703 and the switch 1704 are provided, the time required for the circuit 1701 to retain original data again after the supply of the power supply voltage is restarted can be shortened.

In the circuit 1702, a signal retained at the node M2 is input to the gate of the transistor 1710. Therefore, after supply of the power supply voltage to the memory element 1730 is restarted, the state (the on state or the off state) of the transistor 1710 is determined in accordance with the signal retained at the node M2 and can be read from the circuit 1702. Consequently, an original signal can be accurately read even when a potential corresponding to the signal retained at the node M2 varies to some degree.

By applying the above-described memory element 1730 to a memory device such as a register or a cache memory included in the CPU, data in the memory device can be prevented from being lost owing to the stop of the supply of the power supply voltage. Furthermore, shortly after the supply of the power supply voltage is restarted, the memory device can be restored to the same state as that before the power supply is stopped. Therefore, the power supply can be stopped even for a short time at an increased frequency in the CPU or one or a plurality of logic circuits included in the CPU, resulting in lower power consumption.

Although the memory element 1730 is used in a CPU in this embodiment, the memory element 1730 can also be used in an LSI such as a digital signal processor (DSP), a custom LSI, or a programmable logic device (PLD), and a radio frequency identification (RF-ID).

The structures described in this embodiment can be combined as appropriate with any of the structures described in the other embodiments.

Example 1

In this example, a transistor corresponding to the transistor 100A illustrated in FIGS. 2A to 2C was fabricated, and reliability tests were conducted on the transistor. In this example, a sample 381 and a sample 382 described below were fabricated and evaluated. Note that the sample 381 and the sample 382 included the transistor of one embodiment of the present invention. The transistors included in the sample 381 and the sample 382 each had a channel length L of 3 µm and a channel width W of 50 µm. The sample 381 and the sample 382 were different from each other in a formation method of the insulating film 110.

The sample 381 and the sample 382 fabricated in this example will be described below. Note that the reference numerals used for the transistor 100A in FIGS. 2A to 2C are used in the following description.

First, the conductive film 106 was formed over the substrate 102. A glass substrate was used as the substrate 102. For the conductive film 106, a 10-nm-thick titanium film and a 100-nm-thick copper film were formed with a sputtering apparatus.

Next, the insulating film 104 was formed over the substrate 102 and the conductive film 106. For the insulating film 104, a 400-nm-thick silicon nitride film and a 50-nm-thick silicon oxynitride film were formed with a plasma CVD apparatus.

The insulating film 104 was formed as follows. First, a 50-nm-thick silicon nitride film was formed under the following conditions: the substrate temperature was set at 350° C.; a silane gas at a flow rate of 200 sccm, a nitrogen gas at a flow rate of 2000 sccm, and an ammonia gas at a flow rate of 100 sccm were introduced into a chamber; the pressure was set to 100 Pa; and an RF power of 2000 W was supplied between parallel-plate electrodes provided in the plasma CVD apparatus. Next, the flow rate of the ammonia gas was changed to 2000 sccm to form a 300-nm-thick silicon nitride film. Then, the flow rate of the ammonia gas was changed to 100 sccm to form a 50-nm-thick silicon nitride film. After that, a 50-nm-thick silicon oxynitride film was formed under the following conditions: the substrate temperature was set at 350° C., a silane gas at a flow rate of 20 sccm and a dinitrogen monoxide gas at a flow rate of 3000 sccm were introduced into the chamber, the pressure was set to 40 Pa, and an RF power of 100 W was supplied between the parallel-plate electrodes provided in the plasma CVD apparatus.

Then, the oxide semiconductor film 108 was formed over the insulating film 104. The oxide semiconductor film 108 was formed with a sputtering apparatus.

As the oxide semiconductor film 108, a 40-nm-thick IGZO film was formed under the following conditions: the substrate temperature was set at 130° C., an argon gas and an oxygen gas at a flow rate ratio of 9:1 were introduced into a chamber, the pressure was set to 0.6 Pa, and an AC power of 2500 W was applied to an oxide semiconductor target (In:Ga:Zn=4:2:4.1 [atomic ratio]) placed in the sputtering apparatus.

After that, the insulating film 110 was formed over the insulating film 104 and the oxide semiconductor film 108.

For the insulating film 110 in the sample 381, a 30-nm-thick first silicon oxynitride film, a 100-nm-thick second silicon oxynitride film, and a 20-nm-thick third silicon oxynitride film were formed with a plasma CVD apparatus. The first silicon oxynitride film was formed under the following conditions: the substrate temperature was set at 350° C., a silane gas at a flow rate of 20 sccm and a dinitrogen monoxide gas at a flow rate of 3000 sccm were introduced into a chamber, the pressure was set to 200 Pa, and an RF power of 100 W was supplied between parallel-plate electrodes provided in the plasma CVD apparatus. The second silicon oxynitride film was formed under the following conditions: the substrate temperature was set at 220° C., a silane gas at a flow rate of 160 sccm and a dinitrogen monoxide gas at a flow rate of 4000 sccm were introduced into the chamber, the pressure was set to 200 Pa, and an RF power of 1500 W was supplied between the parallel-plate electrodes provided in the plasma CVD apparatus. The third silicon oxynitride film was formed under the same conditions as the first silicon oxynitride film.

For the insulating film 110 in the sample 382, a 150-nm-thick single-layer silicon oxynitride film was formed using a plasma CVD apparatus. The silicon oxynitride film was formed under the following conditions: the substrate temperature was set at 350° C., a silane gas at a flow rate of 20 sccm and a dinitrogen monoxide gas at a flow rate of 18000 sccm were introduced into a chamber, the pressure was set to 200 Pa, and an RF power of 100 W was supplied between parallel-plate electrodes provided in the plasma CVD apparatus.

As described above, the sample 381 and the sample 382 were fabricated through the same process except for the formation method of the insulating film 110.

Next, heat treatment was performed on the sample 381 and the sample 382 at a substrate temperature of 350° C. in a nitrogen atmosphere for one hour.

Then, oxygen plasma treatment was performed on the sample 381 and the sample 382 at a substrate temperature of 350° C. The oxygen plasma treatment was performed for 250 seconds under the following conditions: oxygen at a flow rate of 3000 sccm was introduced into a chamber, the pressure was set to 40 Pa, and an RF power of 3000 W was supplied between parallel-plate electrodes provided in a plasma CVD apparatus.

Next, the insulating films 110 and 104 in a desired region were removed to form the opening 143 reaching the conductive film 106.

Subsequently, the conductive film 112 was formed over the insulating film 110 so as to cover the opening 143. For the conductive film 112, a 10-nm-thick first In—Ga—Zn oxide and a 90-nm-thick second In—Ga—Zn oxide were formed with a sputtering apparatus. The first In—Ga—Zn oxide was formed under the following conditions: the substrate temperature was set at 170° C., an oxygen gas at a flow rate of 200 sccm was introduced into a chamber, the pressure was set to 0.6 Pa, and an AC power of 2500 W was supplied to an oxide semiconductor target (In:Ga:Zn=4:2:4.1 [atomic ratio]) placed in the sputtering apparatus. The second In—Ga—Zn oxide was formed under the following conditions: the substrate temperature was set at 170° C., an argon gas at a flow rate of 180 sccm and an oxygen gas at a flow rate of 20 sccm were introduced into the chamber, the pressure was set to 0.6 Pa, and an AC power of 2500 W was supplied to the oxide semiconductor target (In:Ga:Zn=4:2:4.1 [atomic ratio]) placed in the sputtering apparatus.

After that, the insulating film 110 and the conductive film 112 were processed into island shapes with a dry etching apparatus and a surface of the oxide semiconductor film 108 was partly exposed.

Then, the insulating film 116 was formed over the insulating film 104, the oxide semiconductor film 108, and the conductive film 112.

The insulating film 116 was formed through two steps: plasma treatment and deposition treatment. The plasma treatment was performed under the following conditions: the substrate temperature was set at 220° C., an argon gas at a flow rate of 100 sccm was introduced into a chamber, the pressure was set to 40 Pa, and an RF power of 1000 W was supplied between parallel-plate electrodes provided in a plasma CVD apparatus. Subsequently, a 100-nm-thick silicon nitride film was formed under the following conditions: the substrate temperature was set at 220° C.; a silane gas at a flow rate of 50 sccm, a nitrogen gas at a flow rate of 5000 sccm, and an ammonia gas at a flow rate of 100 sccm were introduced into the chamber; the pressure was set to 100 Pa; and an RF power of 1000 W was supplied between the parallel-plate electrodes provided in the plasma CVD apparatus.

Next, the insulating film 118 was formed over the insulating film 116.

For the insulating film 118, a 300-nm-thick silicon oxynitride film was formed under the following conditions: the substrate temperature was set at 220° C., a silane gas at a flow rate of 160 sccm and a dinitrogen monoxide gas at a flow rate of 4000 sccm were introduced into the chamber, the pressure was set to 200 Pa, and an RF power of 1500 W was supplied between the parallel-plate electrodes provided in the plasma CVD apparatus.

Next, the insulating films 116 and 118 in desired regions were removed to form the openings 141a and 141b reaching the oxide semiconductor film 108.

The openings 141a and 141b were formed by a dry etching method.

Then, a conductive film was formed over the insulating film 118 so as to cover the openings 141a and 141b and the conductive film was processed into an island shape, whereby the conductive films 120a and 120b functioning as source and drain electrodes were formed.

For the conductive films 120a and 120b, a 50-nm-thick Ti film, a 400-nm-thick Al film, and a 100-nm-thick Ti film were formed with a sputtering apparatus.

Subsequently, 1.5-μm-thick acrylic was formed as a planarization film.

Next, heat treatment was performed at a substrate temperature of 250° C. in a nitrogen atmosphere for one hour.

Through the above steps, the samples 381 and 382 of this example were fabricated. Note that the highest temperature in the fabrication processes of the samples 381 and 382 was 350° C.

Figure 50A:
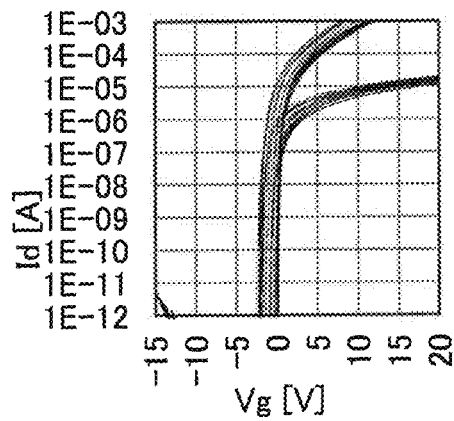
FIGS. 50A to 50F show drain current-gate voltage characteristics of transistors of one embodiment of the present invention.
Figure 50D:
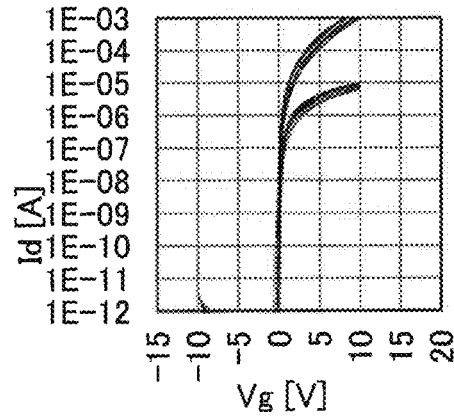
Figure 50B:
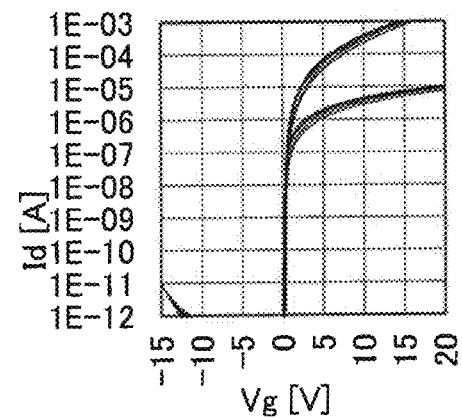
Figure 50E:
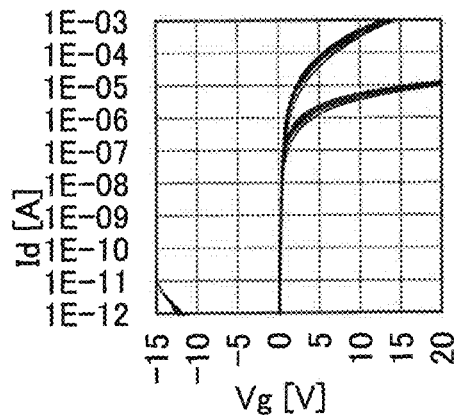
Figure 50C:
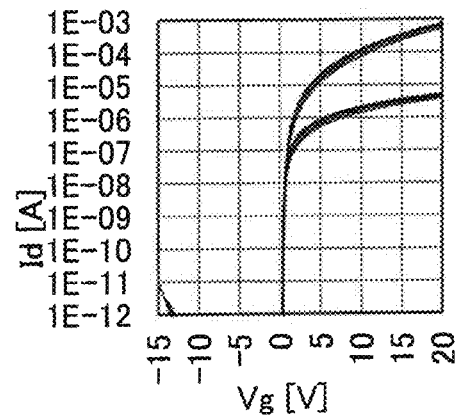
Figure 50F:
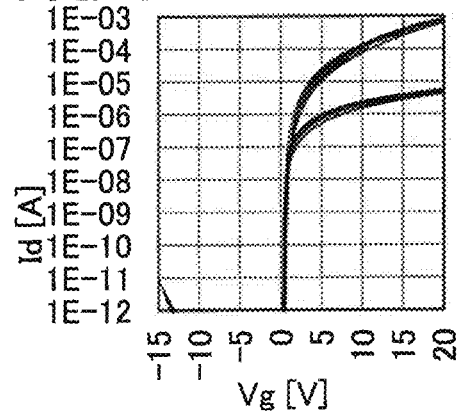

FIG. 50A shows the drain current-gate voltage characteristics of the transistor with a channel length of 2 μm, FIG. 50B shows those of the transistor with a channel length of 3 μm, and FIG. 50C shows those of the transistor with a channel length of 6 μm, in the sample 381. FIG. 50D shows the drain current-gate voltage characteristics of the transistor with a channel length of 2 μm, FIG. 50E shows those of the transistor with a channel length of 3 μm, and FIG. 50F shows those of the transistor with a channel length of 6 μm, in the sample 382. Each of the transistors had a channel width of 50 μm. The measurement was performed at voltages between the source electrode and the drain electrode (drain voltage) of 0.1 V and 10 V. In each graph, the characteristics of 20 transistors over the same substrate are overwritten.

As shown in FIGS. 50A to 50F, all of the fabricated the samples 381 and 382 have normal drain current-gate voltage characteristics ($I_d$-$V_g$ characteristics).

The reliability of the transistors was evaluated. The reliability evaluation tests in this example were performed under the conditions where the gate voltage ($V_g$) was ±30 V; the drain voltage ($V_d$) and the source voltage ($V_s$) were 0 V (comm); the stress temperature was 60° C.; the time for stress application was one hour; and two kinds of measurement environments, a dark environment and a photo environment (irradiation with light at approximately 10000 lx with a white LED), were employed. In other words, the source electrode and the drain electrode of the transistor were set at the same potential, and a potential different from that of the source and drain electrodes was applied to the gate electrode for a certain time (here, one hour). The above tests are also referred to as gate bias-temperature-stress (GBT) tests.

A case where a potential applied to the gate electrode is higher than a potential applied to the source and drain electrodes is called positive stress, and a case where the potential applied to the gate electrode is lower than the potential applied to the source and drain electrodes is called negative stress. Thus, the reliability evaluation was performed under four conditions in total, i.e., positive GBT (dark) 376, negative GBT (dark) 377, positive GBT (illuminated) 378, and negative GBT (illuminated) 379.

Note that the positive GBT (dark) can be referred to as positive bias temperature stress (PBTS), the negative GBT (dark) as negative bias temperature stress (NBTS), the positive GBT (illuminated) as positive bias illumination temperature stress (PBITS), and the negative GBT (illuminated) as negative bias illumination temperature stress (NBITS).

Figure 51:
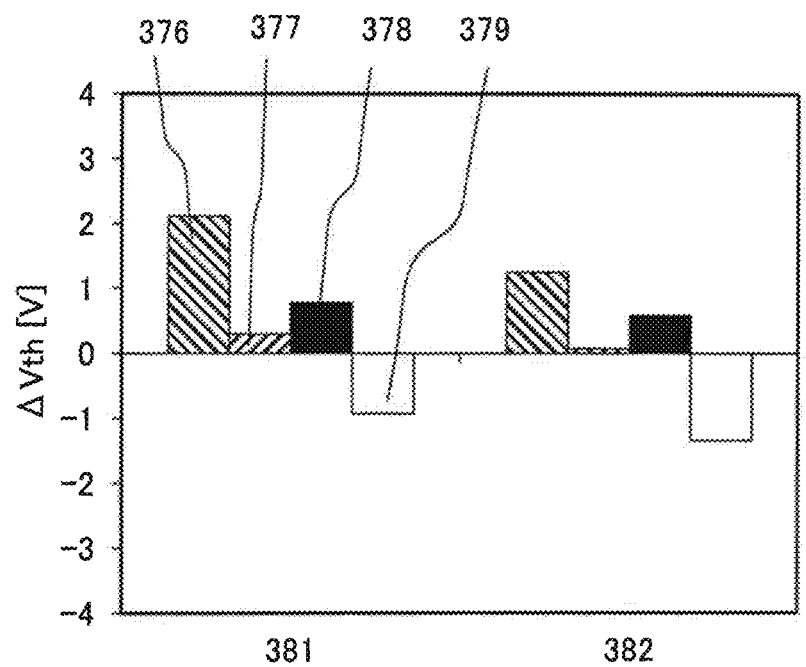
FIG. 51 shows GBT test results of transistors of one embodiment of the present invention.

FIG. 51 shows the GBT test results of the samples 381 and 382. In FIG. 51, the longitudinal axis represents the amount of change in the threshold voltage ($\Delta V_{th}$) of the transistors.

The results in FIG. 51 indicate that the amount of change in the threshold voltage ($\Delta V_{th}$) of each of the transistors included in the samples 381 and 382 fabricated in this example was within the specifications for driving a display device, in the GBT tests. Thus, it is confirmed that the transistors included in the samples 381 and 382 each have high reliability.

Note that the amount of change in the threshold voltage of the sample 382 in PBTS is smaller than that of the sample 381. This is probably because the silicon oxynitride film formed at 350° C. contains a small amount of nitrogen oxide ($NO_x$).

Figure 52A:
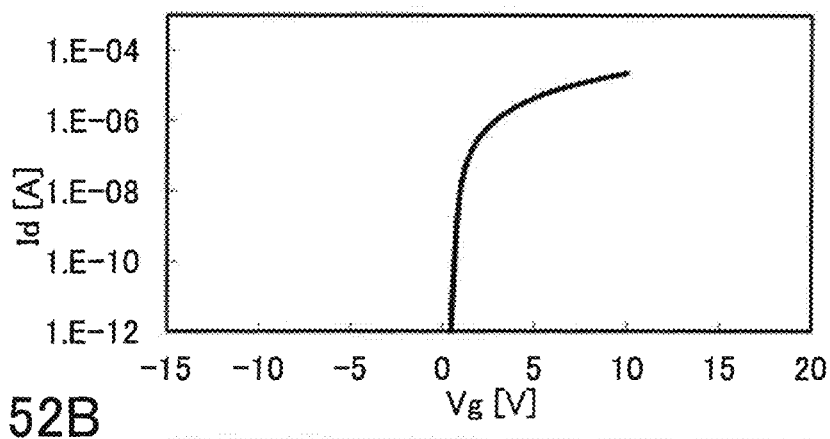
FIGS. 52A to 52D show current stress characteristics of transistors of one embodiment of the present invention.

FIG. 52A shows the overwritten $I_d$-$V_g$ curves of the transistor in the sample 381 before and after a current stress test. The current stress test was conducted for 3600 seconds under the following conditions: the sample temperature was 60° C., the drain voltage was 10 V, the current between the source electrode and the drain electrode (drain current) was 100 nA, and the sample was placed in a dark environment. The current stress test was conducted on the transistor with a channel length of 3 μm and a channel width of 3 μm. In this case, the change in the threshold voltage $V_{th}$ of the transistor was 0.08 V and the change in the field-effect mobility was −1.45%.

Figure 52B:
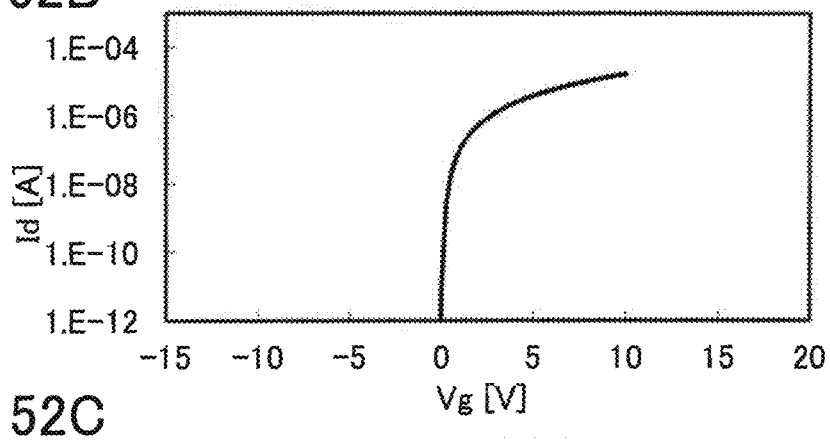

FIG. 52B shows the results of the transistor in the sample 382 obtained in a similar manner. The change in the threshold voltage $V_{th}$ of the transistor was 0.014 V and the change in the field-effect mobility was −0.02%.

Figure 52C:
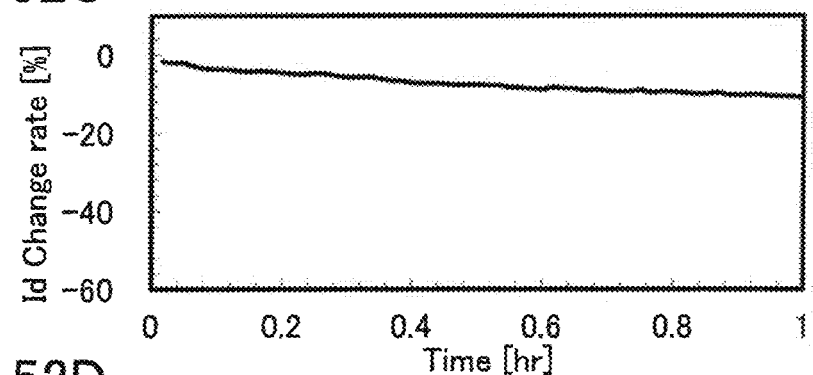
Figure 52D:
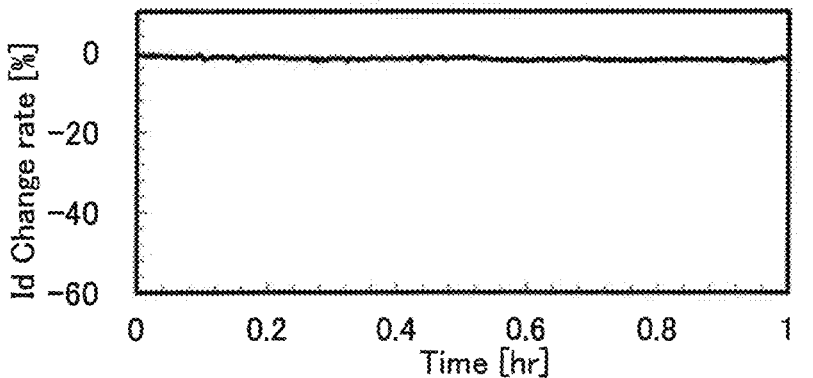

FIG. 52C shows the rate of a change in the drain current of the transistor in the sample 381 during the current stress test. Similarly, FIG. 52D shows the rate of a change in the drain current of the transistor in the sample 382. As shown in FIGS. 52C and 52D, a change in the drain current due to the current stress is smaller in the transistor in the sample 382 than in the transistor in the sample 381. This indicates that the use of a single-layer silicon oxynitride film formed at a substrate temperature of 350° C. for the insulating film 110 can prevent the deterioration due to the current stress test.

The structure described in this example can be combined as appropriate with any of the structures described in the above embodiments.

EXPLANATION OF REFERENCE

100: transistor, 100A: transistor, 100B: transistor, 100C: transistor, 102: substrate, 104: insulating film, 106: conductive film, 108: oxide semiconductor film, 108$i$: region, 108$i$_0: oxide semiconductor film, 108$n$: region, 108$n$_2: region, 110: insulating film, 110_0: insulating film, 112: conductive film, 112_0: conductive film, 112_1: conductive film, 112_2: conductive film, 116: insulating film, 118: insulating film, 120$a$: conductive film, 120$b$: conductive film, 122: insulating film, 140: mask, 141$a$: opening, 141$b$: opening, 143: opening, 201: transistor, 202: transistor, 203: transistor, 216: profile, 217: profile, 218: profile, 220: arrow, 221: sample, 222: sample, 223: sample, 225: region, 226: sample, 227: sample, 228: sample, 231: dashed line, 232: solid line, 235: dashed line, 241: sample, 242: sample, 243: sample, 244: sample, 251: wiring, 252: wiring, 253: wiring, 254: wiring, 255: wiring, 256: node, 257: capacitor, 281: transistor, 282: transistor, 289: transistor, 310: region, 311: region, 312: region, 317: sample, 318: sample, 319: silicon, 321: region, 325: metal film, 329: centroid position, 351: sample, 352: sample, 353: sample, 354: sample, 355: sample, 356: sample, 357: dotted line, 365: sample, 366: sample, 367: sample, 368: conductive film, 370: oxide semiconductor film, 376: positive GBT (dark), 377: negative GBT (dark), 378: positive GBT (illuminated), 379: negative GBT (illuminated), 381: sample, 382: sample, 501: pixel circuit, 502: pixel portion, 504: driver circuit portion, 504$a$: gate driver, 504$b$: source driver, 506: protection circuit, 507: terminal portion, 550: transistor, 552: transistor, 554: transistor, 560: capacitor, 562: capacitor, 570: liquid crystal element, 572: light-emitting element, 700: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive film, 773: insulating film, 774: conductive film, 775: liquid crystal element, 776: liquid crystal layer, 778: structure, 780: anisotropic conductive film, 782: light-emitting element, 783: droplet discharge apparatus, 784: droplet, 785: layer, 786: EL layer, 788: conductive film, 790: capacitor, 791: touch panel, 792: insulating film, 793: electrode, 794: electrode, 795: insulating film, 796: electrode, 797: insulating film, 800: inverter, 810: OS transistor, 820: OS transistor, 831: signal waveform, 832: signal waveform, 840: dashed line, 841: solid line, 850: OS transistor, 860: CMOS inverter, 900: semiconductor device, 901: power supply circuit, 902: circuit, 903: voltage generation circuit, 903A: voltage generation circuit, 903B: voltage generation circuit, 903C: voltage generation circuit, 904: circuit, 905: voltage generation circuit, 906: circuit, 911: transistor, 912: transistor, 912A: transistor, 912B: transistor, 921: control circuit, 922: transistor, 1189: interface, 1190: substrate, 1191: ALU, 1192: controller, 1193: decoder, 1194: controller, 1195: controller, 1196: register, 1197: controller, 1198: interface, 1199: ROM, 1281: transistor, 1400: droplet discharge apparatus, 1402: substrate, 1403: droplet discharge means, 1404: imaging means, 1405: head, 1406: dotted line, 1407: control means, 1408: storage medium, 1409: image processing means, 1410: computer, 1411: marker, 1412: head, 1413: material supply source, 1414: material supply source, 1701: circuit, 1707: capacitor, 1708: capacitor, 1709: transistor, 1710: transistor, 1713: transistor, 1714: transistor, 1720: circuit, 7000: display module, 7001: upper cover, 7002: lower cover, 7003: FPC, 7004: touch panel, 7005: FPC, 7006: display panel, 7007: backlight, 7008: light source, 7009: frame, 7010: printed board, 7011: battery, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing band, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal, 9500: display device, 9501: display panel, 9502: display region, 9503: region, 9511: hinge, and 9512: bearing.

This application is based on Japanese Patent Application serial no. 2016-028586 filed with Japan Patent Office on Feb. 18, 2016 and Japanese Patent Application serial no. 2016-193217 filed with Japan Patent Office on Sep. 30, 2016, the entire contents of which are hereby incorporated by reference.

The invention claimed is:

1. A manufacturing method of a semiconductor device comprising the steps of:
   forming a first oxide semiconductor film over a substrate;
   forming a gate insulating layer comprising at least silicon oxynitride over the first oxide semiconductor film using a plasma CVD apparatus;
   performing oxygen plasma treatment after forming the gate insulating layer using the plasma CVD apparatus; and
   forming a gate electrode on the gate insulating layer after preforming the oxygen plasma treatment.

2. The manufacturing method of a semiconductor device according to claim 1, further comprising the step of performing heat treatment at a temperature higher than or equal to 150° C. and lower than or equal to 450° C. after forming the gate electrode.

3. The manufacturing method of a semiconductor device according to claim 1, wherein the first oxide semiconductor film comprises indium, gallium, and zinc.

4. The manufacturing method of a semiconductor device according to claim 1, wherein the gate insulating layer is formed at a substrate temperature lower than or equal to 350° C.

5. The manufacturing method of a semiconductor device according to claim 1, wherein the oxygen plasma treatment is performed at a substrate temperature lower than or equal to 350° C.

6. The manufacturing method of a semiconductor device according to claim 1, wherein the gate electrode is formed using a sputtering apparatus.

7. The manufacturing method of a semiconductor device according to claim 1, wherein the gate electrode comprises a second oxide semiconductor film.

8. The manufacturing method of a semiconductor device according to claim 7, wherein the second oxide semiconductor film comprises indium, gallium, and zinc.

9. A manufacturing method of a semiconductor device comprising the steps of:
   forming a first oxide semiconductor film over a substrate;
   forming a gate insulating layer comprising at least silicon oxynitride over the first oxide semiconductor film using a plasma CVD apparatus;
   performing oxygen plasma treatment after forming the gate insulating layer using the plasma CVD apparatus;
   forming a second oxide semiconductor film on the gate insulating layer in an atmosphere comprising oxygen by sputtering after performing the oxygen plasma treatment; and
   forming a gate electrode by etching the second oxide semiconductor film.

10. The manufacturing method of a semiconductor device according to claim 9, further comprising the step of performing heat treatment at a temperature higher than or equal to 150° C. and lower than or equal to 450° C.

11. The manufacturing method of a semiconductor device according to claim 9, wherein the first oxide semiconductor film comprises indium, gallium, and zinc.

12. The manufacturing method of a semiconductor device according to claim 9, wherein the gate insulating layer is formed at a substrate temperature lower than or equal to 350° C.

13. The manufacturing method of a semiconductor device according to claim 9, wherein the oxygen plasma treatment is performed at a substrate temperature lower than or equal to 350° C.

14. The manufacturing method of a semiconductor device according to claim 9, wherein the second oxide semiconductor film comprises indium, gallium, and zinc.

15. A manufacturing method of a semiconductor device comprising the steps of:
   forming a first oxide semiconductor film over a substrate;
   forming a gate insulating layer comprising silicon, oxygen, and nitrogen over the first oxide semiconductor film using a plasma CVD apparatus;
   performing oxygen plasma treatment after forming the gate insulating layer using the plasma CVD apparatus; and
   forming a gate electrode on the gate insulating layer after performing the oxygen plasma treatment.

16. The manufacturing method of a semiconductor device according to claim 15, further comprising the step of performing heat treatment at a temperature higher than or equal to 150° C. and lower than or equal to 450° C. after forming the gate electrode.

17. The manufacturing method of a semiconductor device according to claim 15, wherein the first oxide semiconductor film comprises indium, gallium, and zinc.

18. The manufacturing method of a semiconductor device according to claim 15, wherein the gate insulating layer is formed at a substrate temperature lower than or equal to 350° C.

19. The manufacturing method of a semiconductor device according to claim 15, wherein the oxygen plasma treatment is performed at a substrate temperature lower than or equal to 350° C.

20. The manufacturing method of a semiconductor device according to claim 15, wherein the gate electrode is formed using a sputtering apparatus.

21. The manufacturing method of a semiconductor device according to claim 15, wherein the gate electrode comprises a second oxide semiconductor film.

22. The manufacturing method of a semiconductor device according to claim 21, wherein the second oxide semiconductor film comprises indium, gallium, and zinc.

* * * * *